(12) United States Patent
Chamberland et al.

(10) Patent No.: US 10,972,133 B2
(45) Date of Patent: Apr. 6, 2021

(54) FLAG FAULT-TOLERANT ERROR CORRECTION WITH ARBITRARY DISTANCE CODES

(71) Applicant: Microsoft Technology Licensing, LLC, Redmond, WA (US)

(72) Inventors: Christopher Chamberland, Issaquah, WA (US); Michael E. Beverland, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 37 days.

(21) Appl. No.: 15/986,658

(22) Filed: May 22, 2018

(65) Prior Publication Data

US 2019/0044543 A1    Feb. 7, 2019

Related U.S. Application Data

(60) Provisional application No. 62/541,902, filed on Aug. 7, 2017.

(51) Int. Cl.
*H03M 13/00* (2006.01)
*H03M 13/25* (2006.01)
(Continued)

(52) U.S. Cl.
CPC .......... *H03M 13/255* (2013.01); *G06N 10/00* (2019.01); *H03M 13/13* (2013.01)

(58) Field of Classification Search
None
See application file for complete search history.

(56) References Cited

U.S. PATENT DOCUMENTS 5,768,297 A * 6/1998 Shor ...................... B82Y 10/00
                                                    714/763
7,113,967 B2 * 9/2006 Cleve ...................... G06N 10/00
                                                    708/403

(Continued)

OTHER PUBLICATIONS

Córcoles A. D., Magesan E., Srinivasan S. J., Cross A. W., Steffen M., Gambetta J. M., Chow J. M., Demonstration of a quantum error detection code using a square lattice of four superconducting qubits. Nat. Commun. 6, 6979 (2015) (Year: 2015).*

(Continued)

*Primary Examiner* — Daniel F. McMahon
(74) *Attorney, Agent, or Firm* — Klarquist Sparkman, LLP

(57) ABSTRACT

Fault-tolerant error correction (EC) is desirable for performing large quantum computations. In this disclosure, example fault-tolerant EC protocols are disclosed that use flag circuits, which signal when errors resulting from υ faults have weight greater than υ. Also disclosed are general constructions for these circuits (also referred to as flag qubits) for measuring arbitrary weight stabilizers. The example flag EC protocol is applicable to stabilizer codes of arbitrary distance that satisfy a set of conditions and uses fewer qubits than other schemes, such as Shor, Steane and Knill error correction. Also disclosed are examples of infinite code families that satisfy these conditions and analyze the behaviour of distance-three and -five examples numerically. Using fewer resources than Shor EC, the example flag EC protocols can be used in low-overhead fault-tolerant EC protocols using large low density parity check quantum codes.

17 Claims, 30 Drawing Sheets
(13 of 30 Drawing Sheet(s) Filed in Color)

(51) Int. Cl.
G06N 10/00 (2019.01)
H03M 13/13 (2006.01)

(56) References Cited

U.S. PATENT DOCUMENTS

| | | | | |
|---|---|---|---|---|
| 9,779,359 B2* | 10/2017 | Svore | ...................... | G06N 10/00 |
| 9,858,531 B1* | 1/2018 | Monroe | .................. | G06F 15/76 |
| 10,404,287 B2* | 9/2019 | Haah | ....................... | G06N 10/00 |
| 2003/0052317 A1* | 3/2003 | Ohshima | ................ | B82Y 10/00 257/14 |
| 2004/0109631 A1* | 6/2004 | Franson | .................. | G06N 10/00 385/15 |
| 2014/0264283 A1* | 9/2014 | Gambetta | ............... | G06N 10/00 257/31 |
| 2016/0125311 A1* | 5/2016 | Fuechsle | .................. | H01L 39/02 257/31 |
| 2018/0144262 A1* | 5/2018 | Roetteler | ................ | G06F 17/10 |

OTHER PUBLICATIONS

Chao et al., "Quantum error correction with only two extra qubits," *Journal of Quantum Physics*, pp. 1-9 (May 2017).
Yoder et al., "The surface code with a twist," *Journal of Quantum Physics*, pp. 1-19 (Apr. 2017).
Aharonov et al., "Fault-Tolerant Quantum Computation with Constant Error", *Proc. ACM Symp. on Theory of Computing*, pp. 1-63 (May 1997).
Aliferis et al., "Quantum Accuracy Threshold for Concatenated Distance-3 Codes", Retrieved From: https://arxiv.org/abs/quant-ph/0504218, pp. 1-58 (Apr. 2005).
Aliferis et al., "Subsystem fault tolerance with the Bacon-Shor code", *Journal of Physical Review Letters*, vol. 98, pp. 1-4 (May 2007).
Anderson et al., "Fault-tolerant conversion between the Steane and Reed-Muller quantum codes", *Journal of Physical Review Letters*, vol. 113, pp. 1-6 (Aug. 2014).
Bombin, "Gauge Color Codes: Optimal Transversal Gates and Gauge Fixing in Topological Stabilizer Codes," *New Journal of Physics*, vol. 17, No. 8, pp. 1-10 (Aug. 2015).
Bombin et al., "Topological Quantum Distillation," *Journal of Physical Review Letters*, vol. 97, Issue 18, pp. 1-4 (Oct. 2006).
Bravyi et al., "Quantum codes on a lattice with boundary," Retrieved From: https://arxiv.org/pdf/quant-ph/9811052.pdf, pp. 1-6 (Nov. 1998).
Brown et al., "Quantum Memories at Finite Temperature," *Journal of Reviews of Modern Physics*, vol. 88, Issue 4, pp. 1-55 (Nov. 2016).
Calderbank et al., "Good quantum error-correcting codes exist," *Journal of Physical Review A*, vol. 54, No. 2, pp. 1-24 (Sep. 1995).
Chamberland et al., "Error suppression via complementary gauge choices in Reed-Muller codes," *Journal of Quantum Science and Technology*, vol. 2, No. 3, pp. 1-15 (Aug. 2017).
Chamberland et al., "Fault-tolerant quantum computing in the Pauli or clifford frame with slow error diagnostics," Retrieved From: https://arxiv.org/abs/1704.06662, pp. 1-11 (Dec. 2017).
Chamberland et al., "Overhead analysis of universal concatenated quantum codes," *Journal of Physical Review A*, vol. 95, pp. 1-25 (Feb. 2017).
Chao et al., "Fault-tolerant quantum computation with few qubits," Retrieved from: https://arxiv.org/abs/1705.05365, pp. 1-10 (May 2017).
Dennis et al., "Topological quantum memory," *Journal of Mathematical Physics*, vol. 43, pp. 1-39 (Sep. 2002).
DiVincenzo et al., "Effective fault-tolerant quantum computation with slow measurements," *Journal of Physical Review Letters*, vol. 98, pp. 1-10 (Jan. 2007).

Edmonds,"Paths, Trees, and Flowers," *Canadian Journal of Mathematics*, vol. 17, Issue 3, pp. 140-144 (Feb. 1965).
Fern, "An upper bound on quantum fault tolerant thresholds," Retrieved From: https://arxiv.org/abs/0801.2608, pp. 1-16 (May 2008).
Fowler et al., "Surface codes: Towards practical large-scale quantum computation," *Journal of Physical Review A*, vol. 86, pp. 1-54 (Sep. 2012).
Gallager, "Low Density Parity Check Codes," *Proc. IRE Trans. on Information Theory* 8.1, pp. 21-28 (Jan. 1962).
Gottesman, "An Introduction to Quantum Error Correction and Fault-Tolerant Quantum Computation", *Proc. of the Symposia in Applied Mathematics*, vol. 68, pp. 1-46 (Apr. 2010).
Gottesman, "Fault-Tolerant Quantum Computation with Constant Overhead," Retrieved From: https://arxiv.org/abs/1310.2984, pp. 1-33 (Oct. 2013).
Karzig et al., "Scalable designs for quasiparticle-poisoning-protected topological quantum computation with Majorana zero modes," *Journal of Physical Review B*, vol. 95, Issue 23, pp. 1-32 (Jun. 2017).
Kitaev, "Unpaired Majorana fermions in quantum wires," *Journal of Physics-Uspekhi*, vol. 44, Issue 10S, pp. 1-16 (Oct. 2000).
Knill, "Quantum Computing with Realistically Noisy Devices", *Journal of Nature*, vol. 434, No. 7029, pp. 39-44 (Mar. 2005).
Knill, "Scalable Quantum Computing in the Presence of Large Detected-Error Rates," *Journal of Physical Review A*, vol. 71, Issue 4, pp. 1-16 (Apr. 2005).
Knill et al., "Resilient Quantum Computation", *Science*, vol. 279, pp. 342-345 (Jan. 1998).
Kolmogorov, "Blossom V: a new implementation of a minimum cost perfect matching algorithm," *Journal of Mathematical Programming Computation*, vol. 1, Issue 1, pp. 1-25 (Jul. 2009).
Kovalev et al., "Fault tolerance of quantum low-density parity check codes with sublinear distance scaling," *Journal of Physical Review A*, vol. 87, Issue 2, pp. 1-5 (Feb. 2013).
Kubica et al., "Universal transversal gates with color codes—a simplified approach," *Journal of Physical Review A*, vol. 91, pp. 1-13 (Mar. 2015).
Laflamme et al., "Perfect quantum error correcting code," *Journal of Physical Review Letters*, vol. 77, Issue 198, pp. 1-5 (Jul. 1996).
Paetznick et al., "Fault-tolerant ancilla preparation and noise threshold lower bounds for the 23-qubit Golay code," Retrieved From: https://archive.org/details/arxiv-1106.2190, pp. 1-43 (Jun. 2011).
Poulin, "Optimal and efficient decoding of concatenated quantum block codes," *Journal of Physical Review A*, vol. 74, Issue 5, pp. 1-6 (Nov. 2006).
Preskill, "Reliable quantum computers," *Proc. of the Royal Society of London. Series A: Mathematical, Physical and Engineering Sciences*, vol. 454, No. 1969, pp. 385-410 (Jan. 1998).
Shor, "Fault-tolerant quantum computation," *Proc. of the 37th Annual Symp. on Foundations of Computer Science*, pp. 1-11 (Oct. 1996).
Steane, "Active stabilization, quantum computation, and quantum state synthesis," *Journal of Physical Review Letters*, vol. 78, No. 11, pp. 1-12 (Nov. 1996).
Steane, "Multiple-Particle Interference and Quantum Error Correction," *Journal of Proc. R. Soc. Lond. A*, vol. 452, pp. 1-45 (Nov. 1996).
Tomita et al., "Low-distance surface codes under Realistic Quantum Noise," *Journal of Physical Review A*, vol. 90, pp. 1-15 (Dec. 2014).
Wang et al., "Surface code quantum computing with error rates over 1%", *Journal of Physical Review A*, vol. 83, Issue 2, pp. 1-4 (Feb. 2011).
Wen, "Quantum orders in an exact soluble model," *Journal of Physical review letters*, vol. 90, pp. 1-4 (Jan. 2003).

* cited by examiner

600 →

602 →

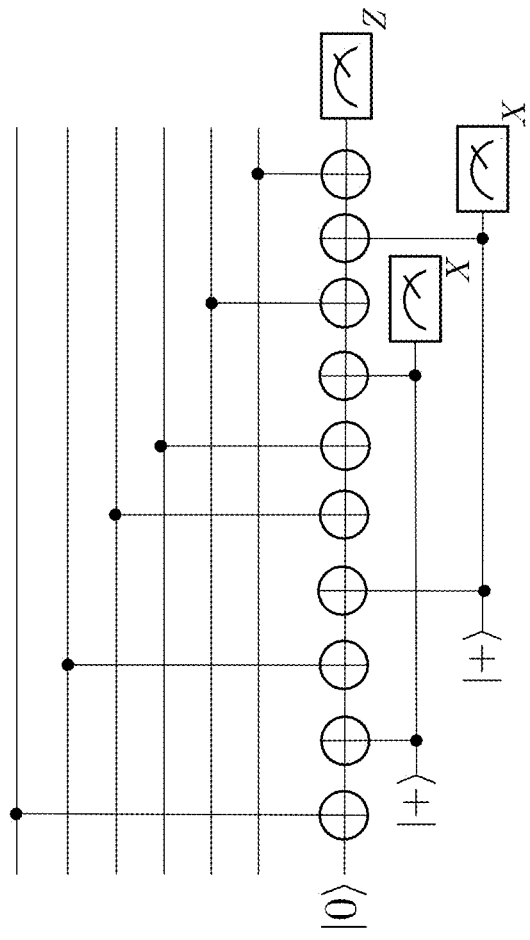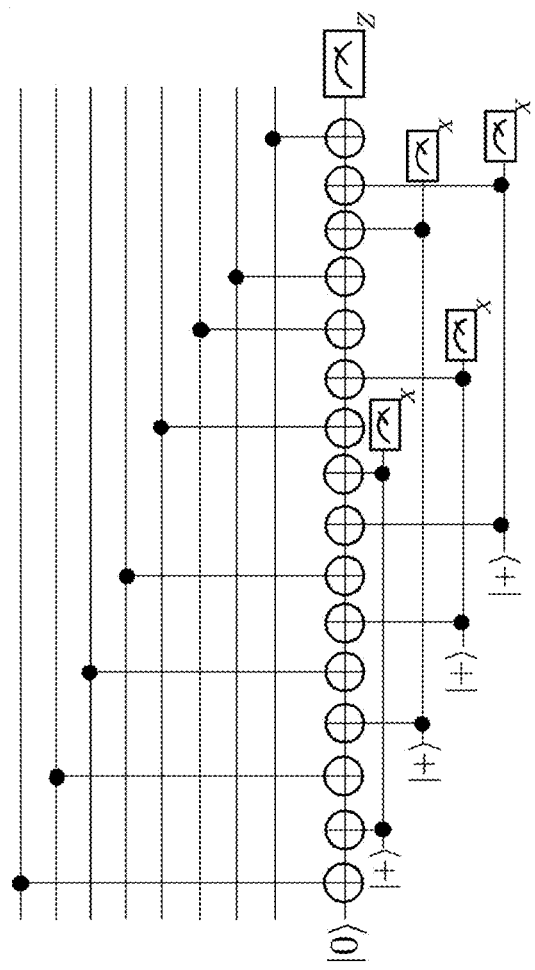
Figure 7(a)
Figure 7(b)

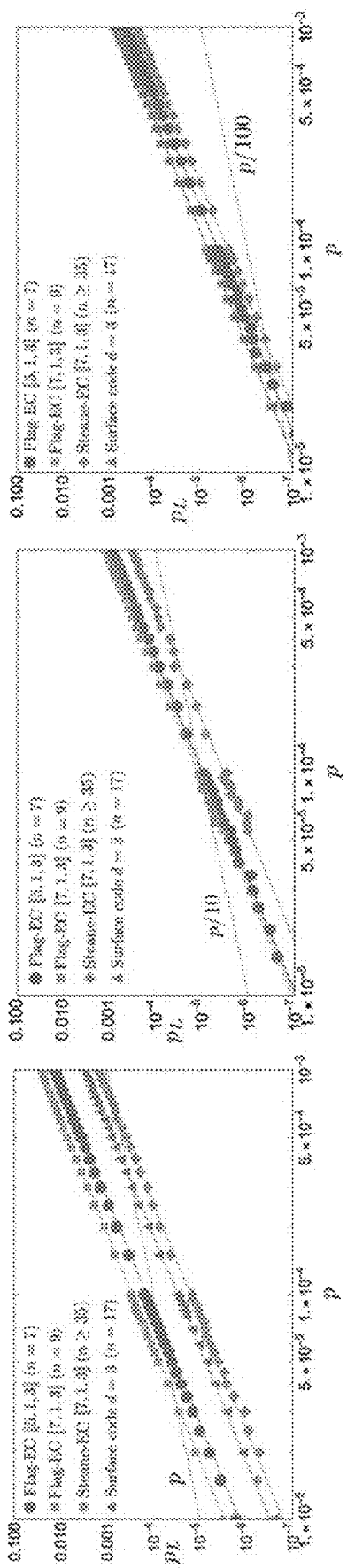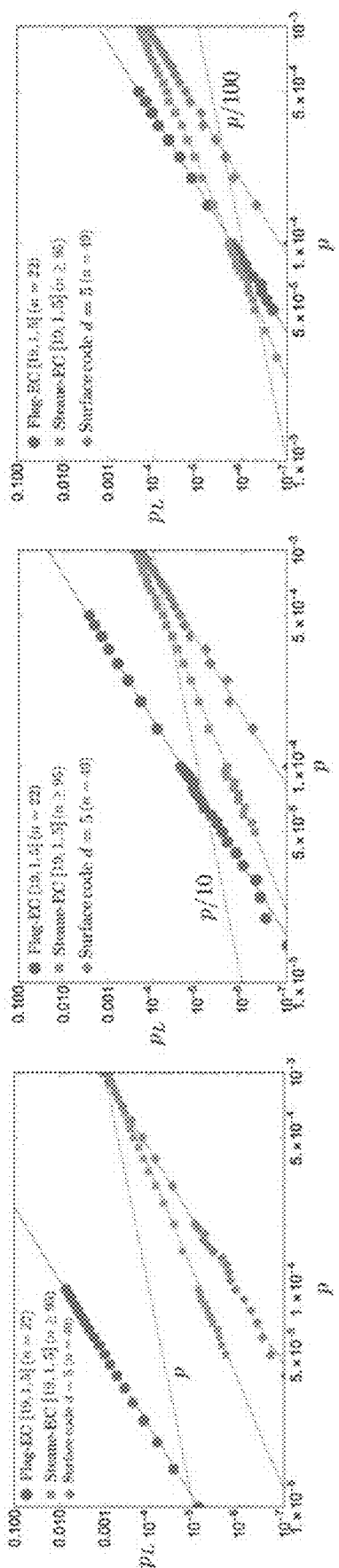

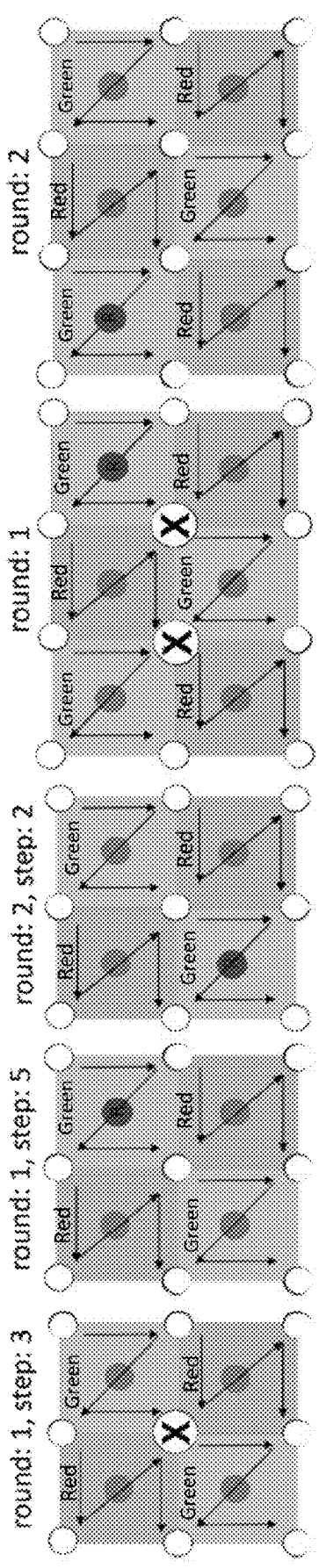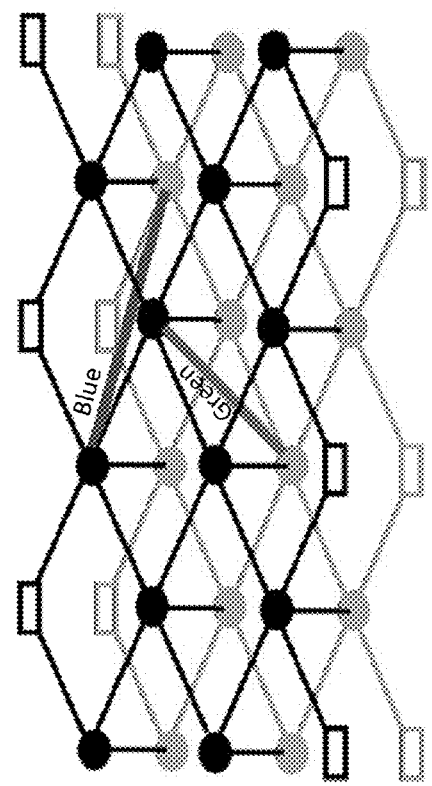
Figure 17(a) Figure 17(b) Figure 17(c) Figure 17(d) Figure 17(e) Figure 17(f)

FLAG FAULT-TOLERANT ERROR CORRECTION WITH ARBITRARY DISTANCE CODES

CROSS-REFERENCE TO RELATED APPLICATIONS

This application claims the benefit of U.S. Provisional Application No. 62/541,902, filed on Aug. 7, 2017, and entitled "FLAG FAULT-TOLERANT ERROR CORRECTION WITH ARBITRARY DISTANCE CODES," which is hereby incorporated herein by reference in its entirety.

SUMMARY

Fault-tolerant error correction (EC) is desirable for performing large quantum computations. In this disclosure, example fault-tolerant EC protocols are disclosed that use flag circuits, which signal when errors resulting from $\upsilon$ faults have weight greater than $\upsilon$. Also disclosed are general constructions for these circuits (also referred to as flag qubits) for measuring arbitrary weight stabilizers. The example flag EC protocol is applicable to stabilizer codes of arbitrary distance that satisfy a set of conditions and uses fewer qubits than other schemes, such as Shor, Steane and Knill error correction. Also disclosed are examples of infinite code families that satisfy these conditions and analyze the behaviour of distance-three and -five examples numerically. Using fewer resources than Shor EC, the example flag EC protocols can be used in low-overhead fault-tolerant EC protocols using large low density parity check quantum codes.

In some embodiments, a quantum operation is performed in a quantum circuit implemented in the quantum computing device, and a fault-tolerant error correction protocol is performed using only a single ancilla qubit and an error-code distance of 3. In particular implementations, the fault-tolerant error correction protocol performs syndrome measurements at most three times. In some implementations, the performing the fault-tolerant error correction protocol comprises repeating an error syndrome measurement of the ancilla qubit until one of multiple criteria is satisfied.

In further embodiments, a quantum operation is performed in a quantum circuit implemented in the quantum computing device; and a fault-tolerant error correction protocol is performed using only two ancilla qubits and an error-code distance of 5. In particular implementations, the fault-tolerant error correction protocol performs syndrome measurements at most seven times. In certain implementations, the performing the fault-tolerant error correction protocol comprises repeating error syndrome measurements of the two ancilla qubits until one of multiple criteria is satisfied. In some implementations, the performing the fault-tolerant error correction protocol further comprises tracking a number of times consecutive measurements are different and a number of times consecutive measurements are equal.

In some embodiments, a quantum operation is performed in a quantum circuit implemented in the quantum computing device; and a fault-tolerant error correction protocol is performed using one or more qubits and stabilizer codes of an arbitrary distance. In some implementations, the performing the fault-tolerant error correction protocol further comprises tracking a number of times consecutive measurements of the one or more qubits are different and a number of times consecutive measurements of the one or more qubits are equal.

The disclosed methods can be implemented, at least in part, as computer-executable instructions (software) stored on one or more computer-readable media (storage devices or memory devices) and executable by one or more processors. The processors can be classical computer processors that are used as part of the system that controls, monitors, and/or reads out results from a quantum device (e.g., a quantum computer).

The foregoing and other objects, features, and advantages of the invention will become more apparent from the following detailed description, which proceeds with reference to the accompanying figures.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 7 illustrates 2-flag circuits with minimal number of flag qubits and CNOT's. In particular, FIG. 7(a) is a schematic block diagram showing a circuit for measuring the Pauli $Z^{\otimes 6}$ using 2 flag qubits, and FIG. 7(b) is a schematic block diagram of a circuit for measuring the the Pauli $Z^{\otimes 8}$.

FIG. 12 is a diagram showing graphs 12(a)-(f) for the logical failure rates for various error correction methods, including various fault-tolerant error correction methods applied to the [5, 1, 3] code, [7, 1, 3] Steane code and the [19, 1, 5] color code.

FIG. 17(a) illustrates a situation where an X error occurs during the third time step in the CNOT gate acting on the central data qubit. FIG. 17(b) illustrates that during the fifth time step of this round, the X error is detected by the Z type measurement qubit to the top right. FIG. 17(c) illustrates that the X error is not detected by the bottom left Z type stabilizer until the following round. FIG. 17(d) illustrates that an XX error occurs on the third CNOT of an X measurement circuit, which is detected by the Z measurement to the right. FIG. 17(e) illustrates that detection by the left Z stabilizer does not occur until the next round. FIG. 17(f) illustrates that the corresponding edges in $G_{3D}$, green for (a-c), and blue for (d-e). Here, it is shown that two rounds of the graph ignoring boundary edges.

DETAILED DESCRIPTION

I. General Considerations

Figure 1:
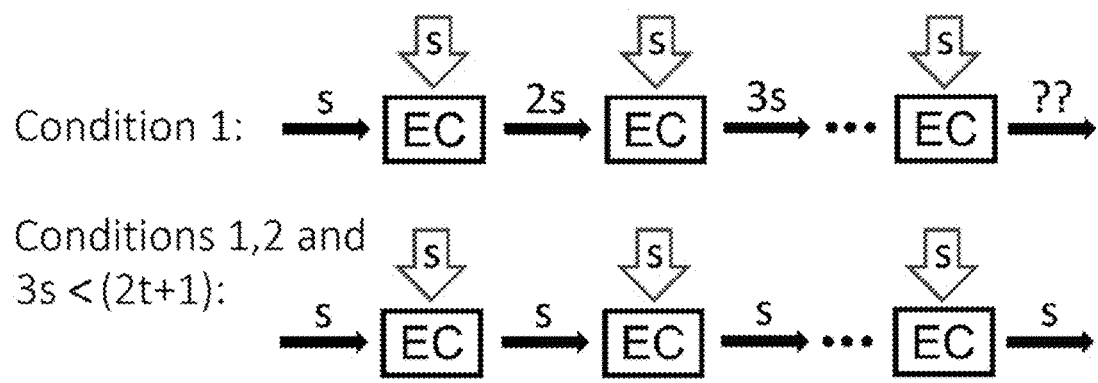
FIG. 1 is a schematic block diagram illustrating s faults as occurring during a round of error correction by a vertical arrow, and an incoming state a distance r from the desired codeword by a horizontal arrow with r above.

As used in this application, the singular forms "a," "an," and "the" include the plural forms unless the context clearly dictates otherwise. Additionally, the term "includes" means "comprises." Further, as used herein, the term "and/or" means any one item or combination of any items in the phrase.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

II. Introduction and Formalism

The field of quantum computing has made significant recent progress. However, no practical model for a self-correcting quantum memory has been disclosed to date, despite considerable effort. See, e.g., B. J. Brown et al., "Quantum memories at finite temperature," Rev. Mod. Phys., vol. 88, p. 045005, November 2016. The models that come closest to this goal involve topological protection in the presence of physically imposed symmetries, but even these are not expected to reduce error rates sufficiently for large computations. See, e.g., A. Y. Kitaev, "Unpaired majorana fermions in quantum wires," Physics-Uspekhi, vol. 44, no. 10S, p. 131, 2001; T. Karzig et al., "Scalable designs for quasiparticle-poisoning-protected topological quantum computation with majorana zero modes," Phys. Rev. B, vol. 95, p. 235305, June 2017. Therefore active protocols that measure the check operators of an error correcting code are desirable to realize scalable quantum computing.

Fortunately, there are three general approaches of fault-tolerant error correction (EC) applicable to a wide range of stabilizer codes due to Shor, Steane, and Knill. See P. W. Shor, "Fault-tolerant quantum computation," Proceedings, 37th Annual Symposium on Foundations of Computer Science, pp. 56-65 (1996); A. W. Steane, "Active stabilization, quantum computation, and quantum state synthesis," Phys. Rev. Lett., vol. 78, no. 11, p. 2252, 1997; and E. Knill, "Scalable quantum computing in the presence of large detected-error rates," Phys. Rev. A, vol. 71, p. 042322 (2005). Along with the ability to prepare, measure and perform gates on states fault-tolerantly, fault-tolerant EC (FTEC) gives rise to the threshold theorem. The threshold theorem guarantees that arbitrarily long quantum computations can be performed with arbitrarily small failure probability with poly-logarithmic overhead provided the noise is below some threshold. See, e.g., P. W. Shor, "Fault-tolerant quantum computation," Proceedings, 37th Annual Symposium on Foundations of Computer Science, pp. 56-65 (1996); D. Aharonov and M. Ben-Or, "Fault-tolerant quantum computation with constant error," in Proceedings of the twenty-ninth annual ACM symposium on Theory of computing, pp. 176-188, ACM (1997); J. Preskill, "Reliable quantum computers," Proceedings of the Royal Society of London. Series A: Mathematical, Physical and Engineering Sciences, vol. 454, no. 1969, pp. 385-410 (1998); E. Knill et al., "States, effect, and operations," Science, vol. 279, pp. 342-345 (1998).

Shor EC can be applied to any stabilizer code, but typically requires more syndrome measurement repetitions than Steane and Knill EC. Weight-w stabilizer generators are measured sequentially using w-qubit verified cat states. On the other hand, Steane EC has higher thresholds than Shor EC and has the advantage that all Clifford gates are applied transversally during the protocol. However, Steane EC is only applicable to CSS codes and uses a verified logical $|+\rangle$ state encoded in the same code to simultaneously obtain all X-type syndromes, using transverse measurement (similarly for Z). See A. R. Calderbank and P. W. Shor, "Good quantum error-correcting codes exist," Phys. Rev. A, vol. 54, pp. 1098-1105 (1996). Knill EC can also be applied to any stabilizer code but requires the preparation of a logical Bell state using the same code used to protect the data. The Bell state is used to teleport the encoded information to a code block and the extra information from the transversal Bell measurement gives the error syndrome. Knill EC typically achieves higher thresholds than Shor and Steane EC but often uses more qubits. See E. Knill, "Quantum computing with realistically noisy devices," Nature, vol. 434, no. 7029, pp. 39-44 (2005); J. Fern, "An upper bound on quantum fault tolerant thresholds," arXiv:quant-ph/0801.2608 (2008).

A promising FTEC approach which does not fit into the above schemes is to use the surface code with a minimum weight matching error correction scheme. This approach gives the best fault-tolerant thresholds to date using only geometrically local measurements.

However there are reasons to believe that there could be better approaches than the surface code. For example, dramatically improved thresholds could be possible using Steane or Knill EC with concatenated codes if they enjoyed the same level of optimization as the surface code has in recent years. See D. Poulin, "Optimal and efficient decoding of concatenated quantum block codes," Phys. Rev. A., vol. 74, p. 052333 (2006). Another enticing alternative is to use large, high-rate, efficiently decodable low density parity check (LDPC) codes in a low-overhead FTEC protocol. See R. G. Gallager, "Low density parity check codes," PhD thesis, MIT (1960); A. A. Kovalev et al., "Fault tolerance of quantum low-density parity check codes with sublinear distance scaling," Phys. Rev. A, vol. 87, p. 020304 (February 2013); and D. Gottesman, "Fault-tolerant quantum computation with constant overhead," arXiv:quant-ph/1310.2984 (2013). It is noteworthy that for large LDPC codes, in which low weight generators should be fault-tolerantly measured, Shor EC is much more favorable than Steane or Knill EC.

In this disclosure, embodiments are presented that significantly build on some recent work that demonstrate flag error correction for particular distance three codes. See, e.g., R. Chao and B. W. Reichardt, "Quantum error correction with only two extra qubits," arXiv:quant-ph/1705.02329 (2017); R. Chao and B. W. Reichardt, "Fault-tolerant quantum computation with few qubits," arXiv:quant-ph/1705.05365 (2017); and T. J. Yoder and I. H. Kim, "The surface code with a twist," Quantum, vol. 1, p. 2 (April 2017). Further, the disclosed technology includes a general protocol for arbitrary distance codes. Among the issues discussed herein is the extension of the lifetime of encoded information using fault-tolerant error correction. Also disclosed herein is a set of example requirements for a stabilizer code (along with the circuits used to measure the stabilizers) which, if satisfied, can be used for flag error correction. Embodiments of the disclosed approach can be applied to a broad class of codes (including but not limited to surface codes, color codes, and quantum Reed-Muller codes).

There are a number of potential applications of these results. Firstly, it is advantageous to have new EC schemes with different properties that can be used in various settings. Secondly, flag EC involves very small qubit overhead, hence the schemes presented here will find applications in early qubit-limited experiments. Thirdly, the flag error correction protocol presented here is useful for LDPC codes as described in D. Gottesman, "Fault-tolerant quantum computation with constant overhead," arXiv:quant-ph/1310.2984 (2013). This is because flag error correction requires fewer resources than Shor EC (it uses fewer qubits, fewer rounds, and does not require verified state preparation).

In Sections III A and III B, definitions are provided flag FTEC is introduced for distance-three and -five codes. In Section III C, an example of the protocol is applied to two examples: the $[\![19,1,5]\!]$ and $[\![17,1,5]\!]$ color codes, which importantly have a variety of different weight stabilizers. The general flag FTEC protocol for arbitrary distance codes is given in Section IV A followed by flag circuit constructions for measuring arbitrary weight stabilizers in Section IV B. In Section IV C, examples are provided of codes that satisfy the conditions that are used for flag FTEC. In Section V, a numerical analysis is provided for a number of flag EC schemes and compared with other FTEC schemes under various types of circuit level noise. As discussed herein, it has been found that flag EC schemes, which have large numbers of idle qubit locations, behave best in error models in which idle qubit errors occur with a lower probability than CNOT errors. The remainder of this section is devoted to FTEC and noise model/simulation methods.

A. Fault-Tolerant Error Correction

Throughout this disclosure, a simple depolarizing noise model is assumed in which idle qubits fail with probability $\tilde{p}$ and all other circuit operations (gates, preparations and measurements) fail with probability p, which recovers standard circuit noise when $\tilde{p}=p$. A detailed description is given in Section II B.

The weight of a Pauli operator is the number of qubits on which it has non-trivial support. The following set is first defined:

Definition 1. Weight-t Pauli Operators $$E_t = \{E \in \mathcal{P}_n | \mathrm{wt}(E) \le t\}, \quad (1)$$

where $\mathcal{P}_n$ is the n-qubit Pauli group.

An error correction protocol typically comprises a sequence of basic operations to infer syndrome measurements of a stabilizer code C, followed by the application of a Pauli operator (either directly or through Pauli frame tracking intended to correct errors in the system). See D. P. DiVincenzo and P. Aliferis, "Effective fault-tolerant quantum computation with slow measurements," Phys. Rev.

Lett., vol. 98, p. 020501 (2007); C. Chamberland et al., "Fault-tolerant quantum computing in the pauli or clifford frame with slow error diagnostics," arXiv:quant-ph/1704.06662 (2017). A given protocol is fault-tolerant if for sufficiently weak noise, the effective noise on the logical qubits is even weaker. More precisely, one can say that an error correction protocol is a t-FTEC if the following is satisfied:

Definition 2. Fault-Tolerant Error Correction

For $t=\lfloor(d-1)/2\rfloor$, an error correction protocol using a distance-d stabilizer code C is t-fault-tolerant if the following two conditions are satisfied:
 1. For an input codeword with error of weight $s_1$, if $s_2$ faults occur during the protocol with $s_1+s_2 \le t$, ideally decoding the output state gives the same codeword as ideally decoding the input state.
 2. For s faults during the protocol with $s \le t$, then no matter how many errors are present in the input state, the output state differs from a valid codeword by an error of at most weight s.

Here ideally decoding is equivalent to performing fault-free error correction. By valid codeword, any state $|\bar{\psi}\rangle \in C$ such that $g|\bar{\psi}\rangle = |\bar{\psi}\rangle$ $\forall g \in S$ where S is the stabilizer group for the code C is meant. Note that for the second criteria in Definition 2, the output and input codeword can differ by a logical operator.

The first criteria in Definition 2 ensures that correctable errors do not spread to uncorrectable errors during the error correction protocol (the output state can differ from the input codeword by an error of weight at most $s_1+s_2$). Further, if $s_2=0$ then all errors present in the input state will be removed.

The second condition is not always checked for protocols in the literature, but it is believed it is important as it ensures that errors do not accumulate uncontrollably in consecutive rounds of error correction (see schematic block diagram 100 of FIG. 1). To see why this is, consider a scenario with s faults introduced during each round of error correction, and assume that $t/n < s < (2t+1)/3$ for some integer n. The first condition alone implies that an input state $E_1|\bar{\psi}\rangle$ with $wt(E_1) \le s$ is taken to $E_2|\bar{\psi}\rangle$, with $wt(E_2) \le 2s$ by one error correction round with s faults. After the jth round, the state will be $E_j|\bar{\psi}\rangle$ with the first condition implying $wt(E_j) \le j \cdot s$ provided that $j \le n$. However, when $j > n$, the requirement of the first condition is no longer satisfied so one cannot use it to upper bound $wt(E_j)$. Now consider the same scenario but assuming both conditions hold. The second condition implies that after the first round, the input state $E_1|\bar{\psi}\rangle$ becomes $E'_2|\bar{\phi}\rangle = E_2|\bar{\psi}\rangle$, with $wt(E'_2) \le s$, and where $|\bar{\phi}\rangle$ is a codeword. Therefore the codewords are related by: $|\bar{\phi}\rangle = (E'^\dagger_2 E_2)|\bar{\psi}\rangle$, with logical operator $(E'^\dagger_2 E_2)$ having weight at most 3s, since $wt(E_2)+wt(E'_2) \le 3s$. However, the minimum non-trivial logical operator of the code has weight $(2t+1) > 3s$, implying that $|\bar{\psi}\rangle = |\bar{\phi}\rangle$, and therefore that $wt(E_2) = wt(E'_2) \le s$. Hence, for the jth round, $wt(E_j) \le s$ for all j, e.g. the distance from the codeword is not increased by consecutive error correction rounds with s faults, provided $s < (2t+1)/3$.

In schematic block diagram 100 of FIG. 1, s faults are represented as occurring during a round of error correction by a vertical arrow, and an incoming state a distance r from the desired codeword by a horizontal arrow with r above. Both fault tolerance conditions in Definition 2 are used together to imply a long lifetime of encoded information. The first condition alone allows errors to build up over time as in the top portion of FIG. 1, which would quickly lead to a failure. However provided $s < (2t+1)/3$, both conditions together ensure that errors in consecutive error correction rounds do not build up, provided each error correction round introduces no more than s faults, which could remain true for a long time.

B. Noise Model and Pseudo-Threshold Calculations

In Section V, a full circuit level noise analysis is performed of various error correction protocols. Unless otherwise stated, the following depolarizing noise model is used:
 1. With probability p, each two-qubit gate is followed by a two-qubit Pauli error drawn uniformly and independently from $\{I, X, Y, Z\}^{\otimes 2} \setminus \{I \otimes I\}$.
 2. With probability $$\frac{2p}{3},$$

the preparation of the $|0\rangle$ state is replaced by $|1\rangle = X|0\rangle$. Similarly, with probability $$\frac{2p}{3},$$

the preparation of the $|+\rangle$ state is replaced by $|-\rangle = Z|+\rangle$.
 3. With probability $$\frac{2p}{3},$$

any single qubit measurement has its outcome flipped.
 4. Lastly, with probability $\tilde{p}$, each resting qubit location is followed by a Pauli error drawn uniformly and independently from $\{X, Y, Z\}$.

Some error correction schemes that are analyzed contain a significant number of idle qubit locations. Consequently, most schemes will be analyzed using three ratios ($\tilde{p}=p$, $\tilde{p}=p/10$ and $\tilde{p}=p/100$) to highlight the impact of idle qubit locations on the logical failure rate.

The two-qubit gates considered are: CNOT, XNOT=$H_1$(CNOT)$H_1$, and CZ=$H_2$(CNOT)$H_2$.

Logical failure rates are estimated using an N-run Monte Carlo simulation. During a particular run, errors are added at each location following the noise model described above. Once the error locations are fixed, the errors are propagated through a fault-tolerant error correction circuit and a recovery operation is applied. After performing a correction, the output is ideally decoded to verify if a logical fault occurred. For an error correction protocol implemented using a stabilizer code C and a fixed value of p, one can define the logical failure rate $$p_L^{(C)}(p) = \lim_{N \to \infty} \frac{N_{fail}^{(C)}(p)}{N}, \qquad (2)$$

where $N^{(C)}_{fail}(p)$ is the number of times a logical X or logical Z error occurred during the N rounds. In practice, one takes N sufficiently large to estimate $p^{(C)}_L(p)$, and provide error bars. See P. Aliferis and A. Cross, "Subsystem fault tolerance with the bacon-shor code," Phys. Rev. Lett., vol. 98, p. 220502 (2007); C. Chamberland et al., "Overhead analysis of universal concatenated quantum codes," Phys. Rev. A, vol. 95, p. 022313 (2017).

In this disclosure, one of the focuses is evaluating the performance of FTEC protocols (e.g., performing logical gates fault-tolerantly is not considered). The pseudo-threshold of an error correction protocol can be defined to be the value of p such that $$\tilde{p}(p) = p^{(C)}{}_L(p). \tag{3}$$

Note that it is desirable to have $\tilde{p}$ on the left of Eq. (3) instead of p since one wants an encoded qubit to have a lower logical failure rate than an unencoded idle qubit. From the above noise model, a resting qubit will fail with probability $\tilde{p}$.

III. Flag Error Correction for Small Distance Codes

In this and the next section, a t-fault-tolerant flag error correction protocol is presented with distance-(2t+1) codes satisfying a certain condition. This example approach extends to that introduced by Chao and Reichardt (See R. Chao and B. W. Reichardt, "Quantum error correction with only two extra qubits," arXiv:quant-ph/1705.02329 (2017)) for distance three codes, which is first reviewed using the terminology in Section III A. In Section III B, the protocol for distance five CSS codes is presented, which is believed to be a useful and practical case, and which contains most of the main ideas of the general case (which is provided in Section IV). In Section IV C some general remarks are provided and in Section III C examples of how the protocol is applied to the [19, 1, 5] color code are provided. Also shown is how the protocol can be applied to the [17, 1, 5] color code. Further, comments are provided on the circuit requirements for measuring stabilizer generators of weight greater than six for distance-5 codes.

A. Definitions and Flag 1-FTEC with Distance-3 Codes

Figures 2A, 2B, 2C:
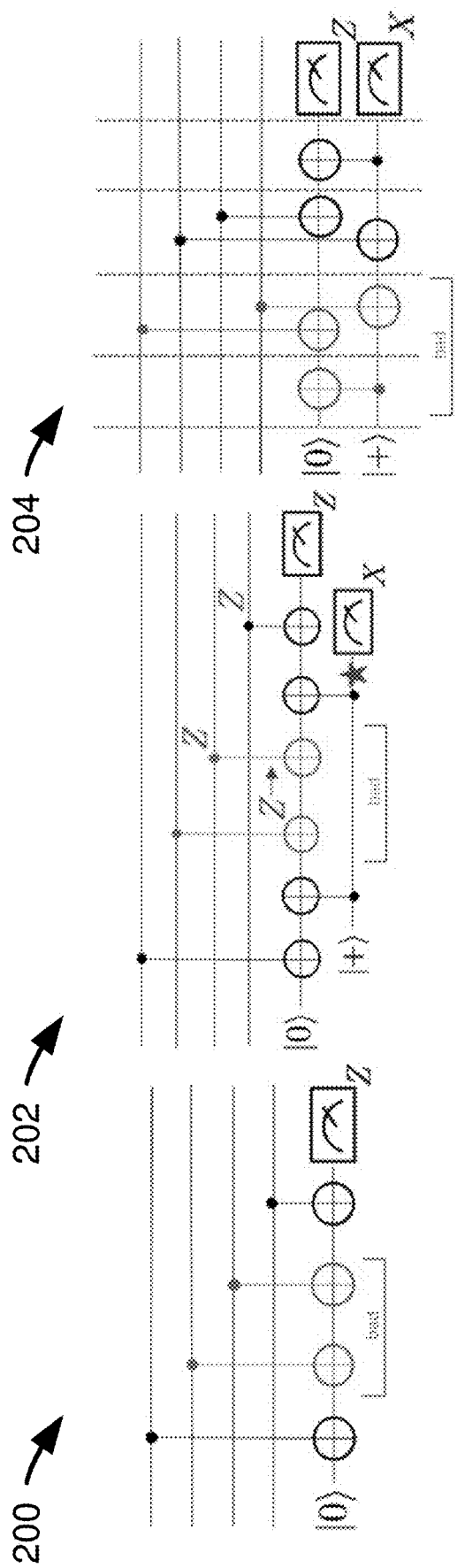
FIG. 2(a) is a schematic block diagram showing a non-fault-tolerant circuit. A single fault IZ occurring on the third CNOT (from the left) results in the bad error IIZZ on the data block.
FIG. 2(b) is a schematic block diagram showing a flag version of FIG. 2(a).
FIG. 2(c) is a schematic block diagram showing an alternative flag circuit with a different set of bad errors and lower depth than FIG. 2(b).

FIG. 2 shows circuits for measuring the operator ZZZZ (can be converted to any Pauli by single qubit Clifford's). Schematic block diagram 200 (FIG. 2(a)) shows a non-fault-tolerant circuit. A single fault IZ occurring on the third CNOT (from the left) results in the bad error IIZZ on the data block. Schematic block diagram 202 (FIG. 2(b)) shows a flag version of FIG. 2(a). An ancilla (flag) qubit prepared in |+⟩ and two extra CNOT gates signals when a weight two data error is caused by a single fault. Subsequent error correction may identify which bad error occurred. Schematic block diagram 204 (FIG. 2(c)) shows an alternative flag circuit with a different set of bad errors and lower depth than FIG. 2(b). All bad locations are illustrated in blue and demarcated as such.

It is well known that with only a single measurement ancilla, a single fault in a blue CNOT of the stabilizer measurement circuit shown in FIG. 2 can result in a multi-weight error on the data block. This could cause a distance-3 code to fail, or more generally could cause a distance-d code to fail due to fewer than (d−1)/2 total faults. It can therefore be said that the blue CNOTs are bad according to the following definition:

Definition 3. Bad Locations

A circuit location in which a single fault can result in a Pauli error E on the data block with wt(E)≥2 will be referred to as a bad location.

As shown in FIG. 2(b), the circuit can be modified by including an additional ancilla (flag) qubit, and two extra CNOT gates. This modification leaves the bad locations and the fault-free action of the circuit unchanged. However, any single fault leading to an error E with wt(E)≥2 will also cause the measurement outcome of the flag qubit to flip. See D. P. DiVincenzo and P. Aliferis, "Effective fault-tolerant quantum computation with slow measurements," Phys. Rev. Lett., vol. 98, p. 020501 (2007). The following definitions will be useful:

Definition 4. Flags and Measurements

Consider a circuit for measuring a stabilizer generator that includes at least one flag ancilla. The ancilla used to infer the stabilizer outcome is referred to as the measurement qubit. One can say the circuit has flagged if the eigenvalue of a flag qubit is measured as −1. If the eigenvalue of a measurement qubit is measured as −1, one can say that the measurement qubit flipped.

Definition 5. t-Flag Circuit

A circuit C(P) for measuring a weight-w Pauli P is a t-flag circuit if the following is satisfied: For any set of υ faults at t or fewer locations in C(P) resulting in an error E with min(wt(E), wt(EP))>υ, the circuit C(P) flags.

Note that any faults occurring in a circuit measuring a stabilizer g of weight-4 will result in an error E with min(wt(E), wt(Eg))≤2. Hence the circuits shown in FIGS. 2(b) and 2(c) measuring a stabilizer $Z^{\otimes 4}$ are in fact examples of t-flag circuits for any t. In Section IV B, a general construction for t-flag circuits which requires only one flag qubit is given.

It is also useful to define υ-bad errors.

Definition 6. υ-Bad Errors

For a given t-flag measurement circuit, one can say all data errors resulting from up to υ≤t faults that lead to a flag are that circuit's υ-bad errors.

Note that the set of υ-bad errors from a circuit can include the identity, and weight one errors. When clear by the context, a bad error will be written in place of υ-bad error.

Suppose a 1-flag circuit's 1-bad errors all have distinct syndromes. Any fault leading to an error of weight greater than one will lead to a flag. Moreover, when a flag has occurred due to at most one fault, a complete set of fault-free stabilizer measurements will infer the bad error. In fact, one would only require distinct syndromes for bad errors that are logically inequivalent, as defined below.

Definition 7. Stabilizer Error Correction

Given a stabilizer group $S=\langle g_1, \ldots, g_m \rangle$, one can define the syndrome s(E) to be a bit string, with i'th bit equal to zero (one) if $g_i$ and E commute (anti-commute). Let min wt(s) be a minimal weight correction E where s(E)=s. One can say operators E and E' are logically equivalent, written as $\mathcal{L}(E) = \mathcal{L}(E')$, iff E'∝gE for g∈S.

Let $E(g_i)$ be the set of all 1-bad errors resulting from a flag in $C(g_i)$. One can define the correction set $$\tilde{E}(g_i, s) = \begin{cases} E & \text{if } s(E) = s \text{ for all } E \in \varepsilon(g_i), \\ \min \text{wt}(s) & \text{otherwise.} \end{cases} \tag{4}$$

With the above definitions, one can construct a fault-tolerant flag error correction protocol for d=3 stabilizer codes satisfying a certain condition.

Flag 1-FTEC Condition:

Consider a stabilizer code $S=\langle g_1, g_2, \ldots, g_r \rangle$ and 1-flag circuits $\{C(g_1), C(g_2), \ldots, C(g_r)\}$. All elements in the set $\tilde{E}(g_i, s)$ are logically equivalent.

In other words, this condition requires that any two errors that arise when a circuit $C(g_i)$ flags must be distinguishable or be logically equivalent. For the following protocol to satisfy Definition 2, one can assume there is at most 1 fault. If the Flag 1-FTEC condition is satisfied, the protocol is implemented as follows:

Flag 1-FTEC Protocol:

Repeat the syndrome measurement using flag circuits until one of the following is satisfied:
1. If the syndrome s is repeated twice in a row and there were no flags, apply the correction min wt(s).
2. If there were no flags and the syndromes $s_1$ and $s_2$ from two consecutive rounds differ, repeat the syndrome measurement using non-flag circuits yielding syndrome s. Apply the correction min wt(s).
3. If a circuit $C(g_i)$ flags, stop and repeat the syndrome measurement using non-flag circuits yielding syndrome s. Apply a correction from $\tilde{E}(g_i,s)$.

Figure 3:
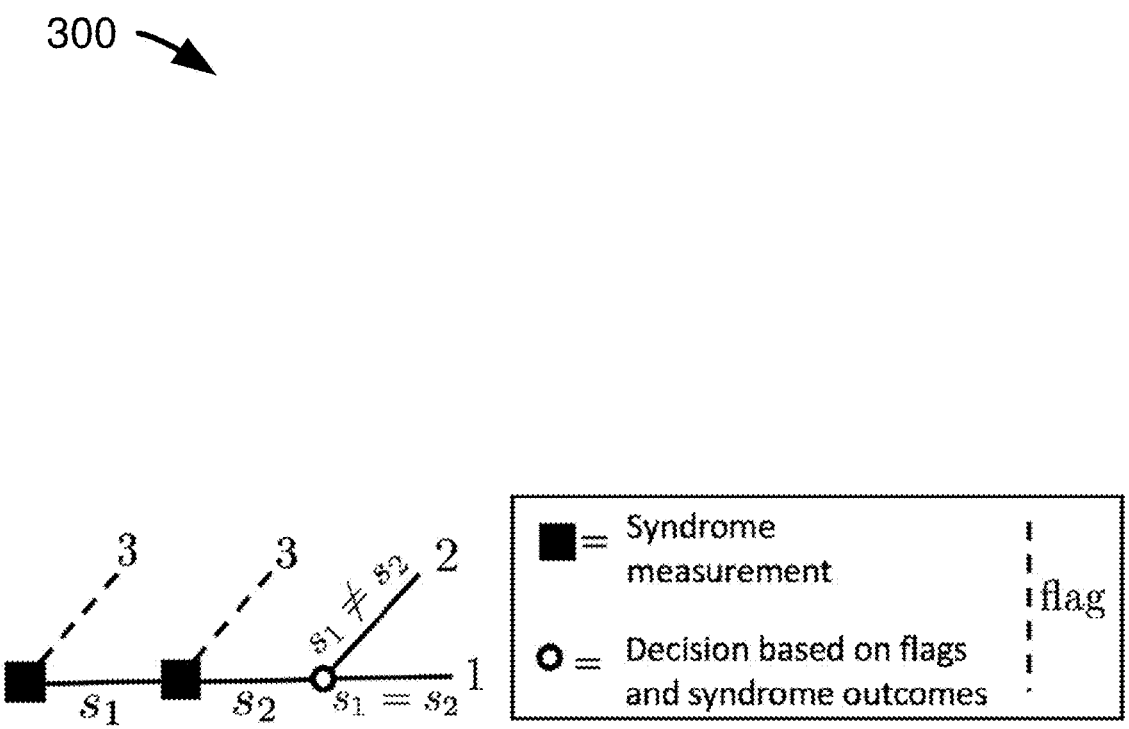
FIG. 3 is a schematic block diagram showing a tree diagram illustrating the possible paths of the Flag 1-FTEC Protocol.

A tree diagram for the flag 1-FTEC Protocol is illustrated in FIG. 3. In particular, FIG. 3 is a schematic block diagram 300 showing a tree diagram illustrating the possible paths of the Flag 1-FTEC Protocol. Numbers at the end of the edges indicate which step to implement in the Flag 1-FTEC Protocol. A dashed line is followed when any of the 1-flag circuits $C(g_i)$ flags. Solid squares indicate a syndrome measurement using 1-flag circuits whereas rings indicate a decision based on syndrome outcomes. Note that, in this embodiment, the syndrome measurement is repeated at most three times.

Here, the proof is outlined (for a proof of the general case, see Section VII). To show that Flag 1-FTEC Protocol satisfies the criteria of Definition 2, one can assume there is at most one fault during the protocol. If a single fault occurs in either the first or second round leading to a flag, repeating the syndrome measurement will correctly diagnose the bad error. If there are no flags and a fault occurs which causes the syndromes in the first two rounds to change, then the syndrome during the third round will correctly diagnose the error. There could also be a fault during either the first or second round that goes undetected. But since there were no flags it cannot spread to an error of weight-2. In this case, applying a minimum weight correction based on the measured syndrome of the second round will guarantee that the output codeword differs from a valid codeword by an error of weight at most one. Note that the above argument applies irrespective of any errors on the input state, hence the second criteria of Definition 2 is satisfied. It is worth pointing out that up to three repetitions are used in order to guarantee that the second criteria of Definition 2 is satisfied (unless the code has the property that all states are at most a weight-one error away from a valid codeword, as in R. Chao and B. W. Reichardt, "Quantum error correction with only two extra qubits," arXiv:quant-ph/1705.02329 (2017)).

Figure 4A:
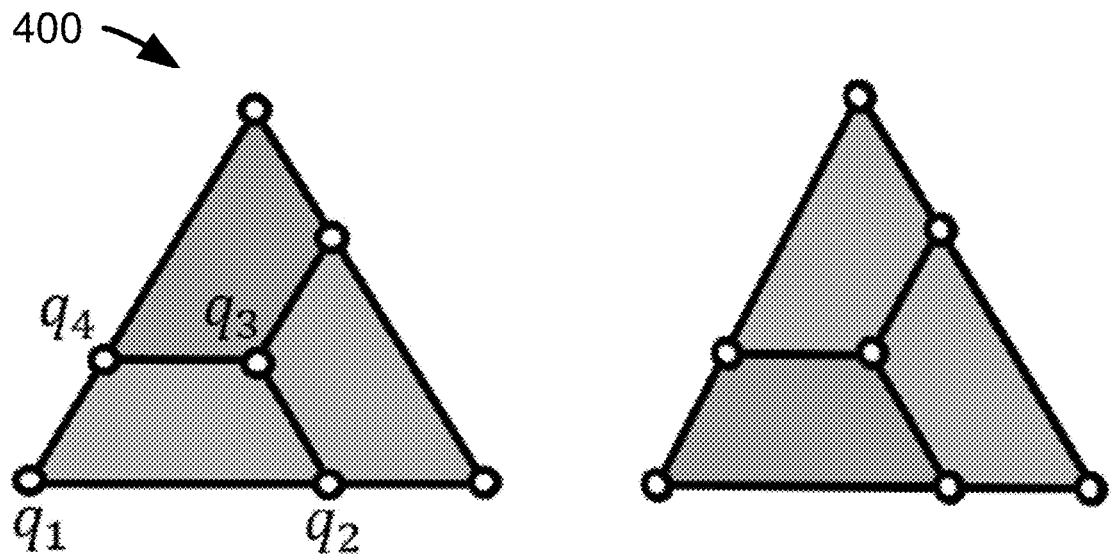
FIG. 4(a) is a schematic block diagram showing a representation of the Steane code where each circle is a qubit, and there is an X- and a Z-type stabilizer generator for each face.
Figure 4B:
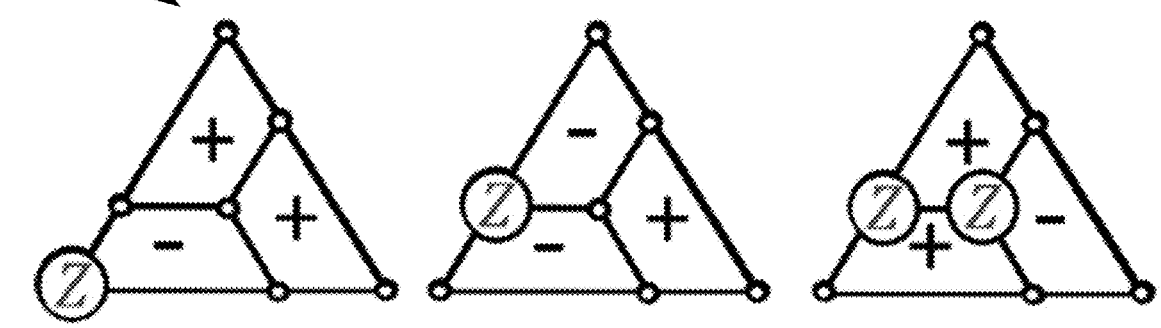
FIG. 4(b) is a schematic block diagram where only Z error contributions are shown.

FIG. 4(a) is a schematic block diagram 400 showing a representation of the Steane code where each circle is a qubit, and there is an X- and a Z-type stabilizer generator for each face. Stabilizer circuits are specified from that in FIG. 2(a) after rotating the lattice such that the relevant face is on the bottom left. For a given circuit, each of the four bad errors has a different syndrome (with satisfied stabilizers represented by a plus). Note that for $g=Z_{q1}Z_{q2}Z_{q3}Z_{q4}$, $E(g)=\{I, Z_{q3}Z_{q4}, X_{q2}Z_{q3}Z_{q4}, Z_{q1}X_{q2}, Z_{q4}, Z_{q3}Z_{q4}, X_{q3}Z_{q3}Z_{q4}\}$. Since the Steane code is a CSS code, the X component of a possible bad error will be corrected independently. Thus, in schematic block diagram 402 of FIG. 4(b), only Z error contributions are shown.

The Steane code is an example which satisfies the Flag 1-FTEC condition with a simple choice of circuits. To verify this, the representation of the Steane code given in FIG. 4(a) is useful. There is an X- and a Z-type stabilizer generator supported on the four qubits of each of the three faces. First let us specify all six stabilizer measurement circuits. The circuit that measures $Z_{q1}Z_{q2}Z_{q3}Z_{q4}$ is specified by taking qubits $q_1$, $q_2$, $q_3$, and $q_4$ to be the four data qubits in descending order in the 1-flag circuit in FIG. 2(a). The other two Z-stabilizer measurement circuits are obtained by first rotating FIG. 4(a) by 120° and 240° and then using FIG. 2(a). The X-stabilizer circuit for each face is the same as the Z-stabilizer circuit for that face, replacing CNOT gates acting on data qubits by XNOT gates. The set of all bad errors of the circuit in FIG. 2(a), e.g., the data errors which result from a single fault leading to a flag, are $\{I, Z_{q1}, Z_{q4}, Z_{q3}Z_{q4}\}$. As can be seen from FIG. 4(b), each of these has a distinct syndrome, thus the measurement circuit for $Z_{q1}Z_{q2}Z_{q3}Z_{q4}$ satisfies the flag 1-FTEC condition, as do the remaining five measurement circuits by symmetry.

B. Flag 2-FTEC with Distance-5 Codes

Before explicitly describing the conditions and protocol, some of the complications that arise for codes with d>3 are discussed.

Figure 5:
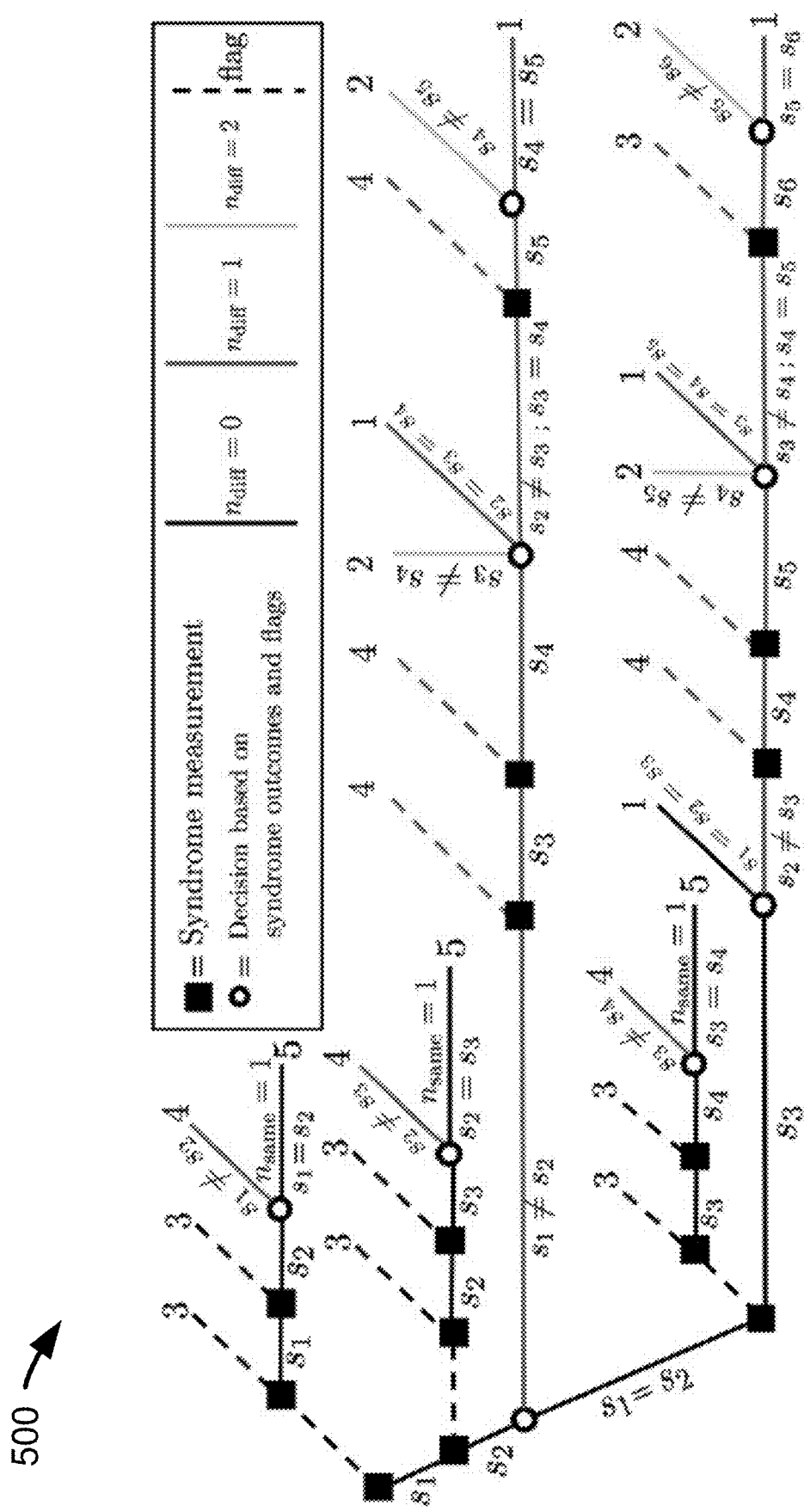
FIG. 5 is a schematic block diagram showing a tree diagram for the Flag 2-FTEC protocol.

FIG. 5 is a schematic block diagram 500 showing a tree diagram for the Flag 2-FTEC protocol. Numbers at the end of the edges indicate which step to implement in the Flag 2-FTEC Protocol. A dashed line is followed when any of the 2-flag circuits $C(g_i)$ flags. Solid squares indicate a syndrome measurement using 2-flag circuits whereas rings indicate a decision based on syndrome outcomes. Edges with different colors indicate the current value of $n_{diff}$ in the protocol. Note that, in this embodiment, the protocol is repeated at most 7 times.

For distance-5 codes, it is desirable to ensure that if two faults occur during the error correction protocol, the output state will differ from a codeword by an error of at most weight-two. For instance, if two faults occur in a circuit for measuring a stabilizer of weight greater than four, the resulting error E on the data should satisfy wt(E)≤2 unless there is a flag. In other words, all stabilizer generators should be measured using 2-flag circuits.

In another case, two faults could occur during the measurement of different stabilizer generators $g_i$ and $g_j$. If two bad locations fail and are both flagged, and assuming there are no more faults, the measured syndrome will correspond to the product of the two bad errors. Consequently, one should store a table containing products of bad errors for each pair of stabilizers $g_i$ and $g_j$. One then decodes based on the pair of bad errors that resulted in the measured syndrome, provided logically inequivalent errors have distinct syndromes.

Before stating the protocol, some definitions from Section III A can be extended.

Consider a stabilizer code $S=\langle g_1,g_2, \ldots ,g_r\rangle$ and t-flag circuits $C(g_i)$ for measuring the generator $g_i$. Before proceeding, one can define a general t-fault correction set in Eq. (5).

Definition 8. Flag Error Set

Let $E(g_{i_1}, \ldots ,g_{i_k},m)$ be the set of all errors caused by precisely m faults spread amongst the circuits $C(g_{i_1})$, $C(g_{i_2}), \ldots ,C(g_{i_k})$ which all flagged.

Note that there could be more than one fault in a single circuit $C(g_{i_k})$. The correction set is then defined as $$\tilde{E}_t^m(g_{i_1}, \ldots , g_{i_k}, s) = \begin{cases} E \mid s(E) = s \text{ for all elements} \\ E \in \varepsilon(g_{i_1}, \ldots , g_{i_k}, m) \times \varepsilon_{t-m}, \\ \min \text{wt}(s) \text{ otherwise.} \end{cases} \quad (5)$$

Flag 2-FTEC Condition:

Consider a stabilizer code $S=\langle g_1,g_2, \ldots ,g_r\rangle$ and 2-flag circuits $\{C(g_1),C(g_2), \ldots ,C(g_r)\}$. All elements within each set $\tilde{E}^2_2(g_i,g_j,s)$ and $\tilde{E}^1_2(g_i,s)\cup\tilde{E}^2_2(g_i,s)$ and $\tilde{E}^1_2(g_i,s)$ are logically equivalent (but may not be logically equivalent between sets).

In order to state the protocol, one can define an update rule given a sequence of syndrome measurements using t-flag circuits for the counters $n_{diff}$ and $n_{same}$ as follows:

Flag 2-FTEC Protocol—Update Rules:

Given a sequence of consecutive syndrome measurement outcomes $s_k$ and $s_{k+1}$:

1. If $n_{diff}=0$ and $s_k \neq s_{k+1}$, increase $n_{diff}$ by one.
2. If $n_{diff}$ didn't increase in the previous round, and $s_k \neq s_{k+1}$, increase $n_{diff}$ by one. ($n_{diff}$ tracks the minimum number of faults that could have caused the observed syndrome outcomes. For example, if the sequence $s_1$, $s_2$, $s_1$ was measured, $n_{diff}$ would increase by one since a single measurement fault could give rise to the given sequence. However for the sequence $s_1$, $s_2$, $s_1$, $s_2$, $n_{diff}$ would increase by two.)
3. If a flag occurred two rounds ago and $s_k=s_{k+1}$, increase $n_{same}$ by one.

For the following protocol to satisfy Definition 2, one can assume there are at most 2 faults. If the Flag 2-FTEC condition is satisfied, the protocol is implemented as follows:

Flag 2-FTEC Protocol—Corrections:

Set $n_{diff}=0$ and $n_{same}=0$.

Repeat the syndrome measurement using flag circuits until one of the following is satisfied:

1. If at any time a syndrome s is repeated 3 times in a row and there were no flags, apply the correction min wt(s).
2. If $n_{diff}=2$ and there were no flags, repeat the syndrome using non-flag circuits yielding syndrome s. Apply the correction min wt(s).
3. If any two circuits $C(g_i)$ and $C(g_j)$ have flagged. Repeat the syndrome measurement using non-flag circuits yielding syndrome s. Apply a correction from the set $\tilde{E}^2_2(g_i,g_j,s)$.
4. If any circuit $C(g_i)$ has flagged and $n_{diff}=1$. Repeat the syndrome using non-flag circuits yielding syndrome s. Apply a correction from the set $\tilde{E}^1_2(g_i,s)$.

TABLE I

Z part of the flag error set of Definition 8 for flag circuits used to measure the stabilizers $g_1 = Z_1Z_2Z_3Z_4$ and $g_3 = Z_1Z_2Z_3Z_4Z_5Z_6$ (here, errors equivalent up to the stabilizer being measured are removed).

| Weight-4 measurement | | Weight-6 measurement | |
|---|---|---|---|
| Single-fault | Two-faults | Single-fault | Two-faults |
| I, $Z_1$, $Z_4$ | I, $Z_1$, $Z_2$, $Z_3$ | I, $Z_1$, $Z_6$ | I, $Z_1$, $Z_2$, $Z_3$, $Z_4$ |
| $Z_3Z_4$ | $Z_4$, $Z_1Z_2$ | $Z_1Z_2$, $Z_5Z_6$ | $Z_5$, $Z_6$, $Z_1Z_2$, $Z_1Z_3$ |
| | $Z_1Z_4$, $Z_2Z_4$ | $Z_4Z_5Z_6$ | $Z_1Z_4$, $Z_1Z_5$, $Z_1Z_6$ |
| | | | $Z_2Z_3$, $Z_2Z_6$, $Z_3Z_4$ |
| | | | $Z_3Z_6$, $Z_4Z_5$, $Z_4Z_6$ |
| | | | $Z_5Z_6$, $Z_1Z_2Z_3$ |
| | | | $Z_1Z_5Z_6$, $Z_2Z_5Z_6$ |
| | | | $Z_3Z_4Z_5$, $Z_3Z_4Z_6$ |
| | | | $Z_3Z_5Z_6$, $Z_4Z_5Z_6$ |

5. If any circuit $C(g_i)$ has flagged, $n_{diff}=0$ and $n_{same}=1$. Use the measured syndrome s from the last round. Apply a correction from the set $\tilde{E}^1_2(g_i,s)\cup\tilde{E}^2_2(g_i,s)$.

The general protocol for codes of arbitrary distance is given in Section IV.

C. Examples of Flag 2-FTEC Applied to d=5 Codes

Figure 6A:
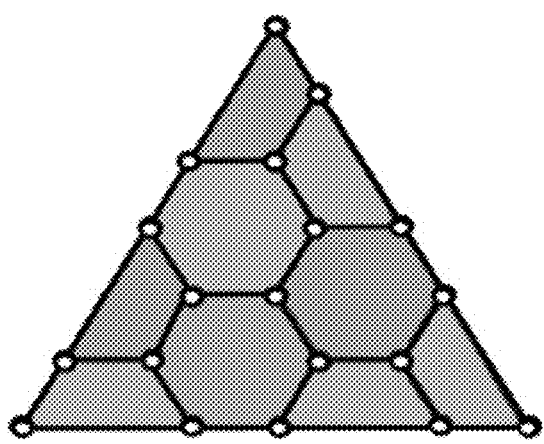
FIG. 6(a) shows a schematic block diagram of a 19-qubit 2D color code.
Figure 6B:
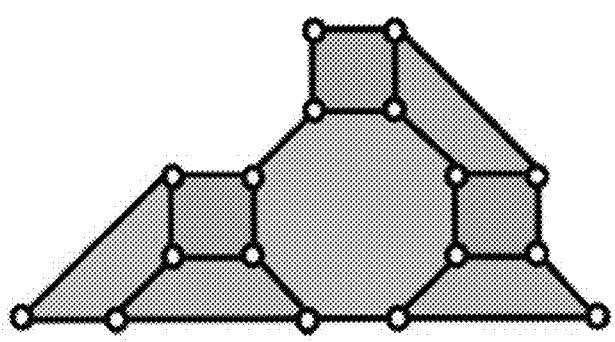
FIG. 6(b) shows a schematic block diagram of a 17-qubit 2D color code.

FIG. 6 shows a schematic block diagram 600 of a 19-qubit 2D color code in FIG. 6(a) and schematic block diagram 602 of a 17-qubit 2D color code in FIG. 6(b). The X and Z stabilizers of the code are symmetric, given by the vertices of each plaquette. Both codes have distance-5.

FIG. 7 illustrates 2-flag circuits with minimal number of flag qubits and CNOT's. All circuits have the minimum number of CNOT gates and none are 3-flag circuits. FIG. 7(a) is a schematic block diagram 700 showing a circuit for measuring the Pauli $Z^{\otimes 6}$ using 2 flag qubits. FIG. 7(b) is a schematic block diagram 702 of a circuit for measuring the Pauli $Z^{237\ 8}$.

In this section, examples are given of the flag 2-FTEC protocol applied to the 2-dimensional [19, 1, 5] and [17, 1, 5] color codes, (see FIG. 6(a) and FIG. 6(b)). One can first find 2-flag circuits for all generators (weight-4 and -6 for the 19-qubit code and weight-4 and -8 for the 17-qubit code). It will also be shown that the flag 2-FTEC condition is satisfied for both codes.

For a 2-flag circuit, two faults leading to an error of weight-3 (up to multiplication by the stabilizer) must always result in a flag. As shown in Section IV B, a single flag qubit is required to obtain a 2-flag circuit. However, using two flag qubits and performing an exhaustive search, one finds that only three CNOT gates for a weight-6 stabilizer and four CNOT gates for a weight-8 stabilizer with the $|+\rangle$ state as control and $|0\rangle$ state as target are required (see FIG. 7). Furthermore, these circuits require fewer time steps.

In Section IV C, it will be shown that the family color codes with a hexagonal lattice satisfy a sufficient condition which guarantees that the flag 2-FTEC condition is satisfied. However, there are codes that do not satisfy the sufficient condition but which nonetheless satisfy the 2-Flag FTEC condition. For the 19-qubit and 17-qubit color codes, it was verified numerically that the flag 2-FTEC condition was satisfied. In particular, in the case where the 2-flag circuits $C(g_i)$ and $C(g_j)$ flag, the resulting errors belonging to the set $\tilde{E}^2_2(g_i,g_j,s)$ must be logically equivalent (which was verified to be true). If a single circuit $C(g_i)$ flags, there could either have been two faults in the circuit or a single fault along with another error that did not cause a flag. If the same syndrome is measured twice in a row after a flag, then errors in the set $\tilde{E}^1_2(g_i,s)\cup\tilde{E}^2_2(g_i,s)$ must be logically equivalent (which has been verified). If there is a flag but two different syndromes are measured in a row, errors belonging to the set $\tilde{E}^1_2(g_i,s)$ must be logically equivalent (as was already checked). The sets $\tilde{E}^m_2$ for the 19-qubit code can be obtained using the Pauli's shown in Table I.

Given that the flag 2-FTEC condition is satisfied, the flag 2-FTEC protocol can be implemented following the steps of Section III B and the tree diagram illustrated in FIG. 5.

IV. Flag Error Correction Protocol for Arbitrary Distance Codes

In this section, the general flag t-FTEC protocol in Section IV A is first provided. In Section IV B, circuit constructions are given which satisfy the requirements of Definition 5. Lastly, in Section IV C, a sufficient condition for stabilizer codes is given that allows one to prove flag FTEC can be applied to a number of infinite code families.

For convenience, some helpful definitions are provided below.

Definition 5. t-Flag Circuit

A circuit C(P) for measuring a weight-w Pauli P is a t-flag circuit if the following is satisfied: For any set of υ faults at t or fewer locations in C(P) resulting in an error E with min(wt(E), wt(EP))>υ, the circuit C(P) flags.

Definition 6. υ-Bad Errors

For a given t-flag measurement circuit, one can say all data errors resulting from up to υ≤t faults that lead to a flag are that circuit's υ-bad errors.

Definition 8. Flag Error Set

Let $E(g_{i_1}, \ldots, g_{i_k}, m)$ be the set of all errors caused by precisely m faults spread amongst the circuits $C(g_{i_1})$, $C(g_{i_2}), \ldots, C(g_{i_k})$ which all flagged.

The following correction set is also provided as a reminder:

$$\tilde{E}_t^m(g_{i_1}, \ldots, g_{i_k}, s) = \begin{cases} E \mid s(E) = s \text{ for all elements} \\ E \in \varepsilon(g_{i_1}, \ldots, g_{i_k}, m) \times \varepsilon_{t-m}, \\ \min wt(s) \text{ otherwise.} \end{cases} \quad (6)$$

A. Conditions and Protocol

In what follows, a generalization of the fault-tolerant error correction protocol presented in Section III B to stabilizer codes of arbitrary distance is provided.

Flag t-FTEC Condition:

Consider a stabilizer code $S = \langle g_1, g_2, \ldots, g_r \rangle$ and t-flag circuits $\{C(g_1), C(g_2), \ldots, C(g_r)\}$. For all positive integers m and k such that 1≤m<t and m+k<t, all elements within each set $\tilde{E}_t^t(g_{i_1}, \ldots, g_{i_r}, s)$ and $\cup_{j=0}^{t-m} \tilde{E}_t^{t-j}(g_{i_1}, \ldots, g_{i_m}, s)$ and $\cup_{j=0}^{t-m-k} \tilde{E}_t^{t-j-k}(g_{i_1}, \ldots, g_{i_m}, s)$ are logically equivalent (but may not be equivalent between sets). (Note that the set $\cup_{j=0}^{t-m-k} \tilde{E}_t^{t-j-k}(g_{i_1}, \ldots, g_{i_m}, s) \subset \cup_{j=0}^{t-m} \tilde{E}_t^{t-j}(g_{i_1}, \ldots, g_{i_m}, s)$ as such, the logical equivalence of elements in the latter implies the logical equivalence of elements in the former. However, this redundancy is included in the flag t-FTEC condition since these two cases are distinguished due to how they are treated in the flag t-FTEC protocol.)

The above conditions help ensure that if there are at most t=⌊(d−1)/2⌋ faults, the protocol described below will satisfy the fault-tolerant conditions of Definition 2.

In order to state the protocol, one can define an update rule given a sequence of syndrome measurements using t-flag circuits for the counters $n_{diff}$ and $n_{same}$ as follows:

Flag t-FTEC Protocol—Update Rules:

Given a sequence of consecutive syndrome measurement outcomes $s_k$ and $s_{k+1}$:

1. If $n_{diff}=0$ and $s_k \neq s_{k+1}$, increase $n_{diff}$ by one.
2. If $n_{diff}$ didn't increase in the previous round, and $s_k \neq s_{k+1}$, increase $n_{diff}$ by one. ($n_{diff}$ tracks the minimum number of faults that could have caused the observed syndrome outcomes. For example, if the sequence $s_1$, $s_2$, $s_1$ was measured, $n_{diff}$ would increase by one since a single measurement fault could give rise to the given sequence. However for the sequence $s_1$, $s_2$, $s_1$, $s_2$, $n_{diff}$ would increase by two.)
3. If a flag occurred two rounds ago and $s_k = s_{k+1}$, increase $n_{same}$ by one.

Flag t-FTEC Protocol—Corrections:

Set $n_{diff}=0$ and $n_{same}=0$.

Repeat the syndrome measurement using flag circuits until one of the following is satisfied:

1. The same syndrome s is repeated t+1 times in a row and there are no flags, apply the correction min wt(s).

2. There were no flags and $n_{diff}=t$. Repeat the syndrome measurement using non-flag circuits yielding the syndrome s. Apply the correction min wt(s).
3. Some set of t circuits $\{C(g_{i_1}), \ldots, C(g_{i_t})\}$ have flagged. Repeat the syndrome measurement using non-flag circuits yielding syndrome s. Apply a correction from the set $\tilde{E}_t^t(g_{i_1}, \ldots, g_{i_t}, s)$.
4. Some set of m circuits $\{C(g_{i_1}), \ldots, C(g_{i_m})\}$ have flagged with 1≤m<t and $n_{same}=t-m+1$. Use the last measured syndrome s and apply a correction from the set $\cup_{j=0}^{t-m} \tilde{E}_t^{t-j}(g_{i_1}, \ldots, g_{i_m}, s)$.
5. Some set of m circuits $\{C(g_{i_1}), \ldots, C(g_{i_m})\}$ have flagged with 1≤m<t and $n_{diff}=t-m$. Repeat the syndrome measurement using non-flag circuits yielding syndrome s. Apply a correction from the set $\tilde{E}_t^m(g_{i_1}, \ldots, g_{i_m}, s)$.
6. Some set of in circuits $\{C(g_{i_1}), \ldots, C(g_{i_m})\}$ have flagged with 1≤m<t, $n_{diff}=k$; m+k<t and $n_{same}=t-m-k+1$. Use the syndrome s obtained during the last round and apply a correction from the set $\cup_{j=0}^{t-m-k} \tilde{E}_t^{t-j-k}(g_{i_1}, \ldots, g_{i_m}, s)$.

From condition 1, the syndrome measurement is desirably repeated a minimum of t+1 times. In the worst case, t identical syndromes are obtained before a fault causes the t+1'th syndrome to change. This can occur at most t times (with $n_{diff}=t$) in which case one repeats the syndrome measurement using non-flag circuits. Thus the maximum number of syndrome measurement repetitions is $t^2+t+1$ where the first $t^2+t$ repetitions are done using flag circuits and the last round is done using non-flag circuits.

For codes that satisfy the flag t-FTEC condition, it is shown in Section VIII how to fault-tolerantly prepare and measure logical states using the flag t-FTEC protocol.

B. Circuits

In Section IV C it is shown that the family of surface codes, color codes with a hexagonal lattice and quantum Reed-Muller codes satisfied a sufficient condition allowing them to be used in the flag t-FTEC protocol. The general 1-flag circuit construction of FIGS. 8(a)-8(c) and the general 3-flag circuit construction of FIGS. 9(a)-9(b), can be used as t-flag circuits for all of the codes in Section IV C (note that the circuit in FIG. 2(b) is a 4-flag circuit which is used for measuring $Z^{\otimes 4}$).

1- and 2-Flag Circuits for Weight w Stabilizer Measurement:

1- and 2-flag circuit constructions are provided for measuring a weight-w stabilizer. The 1-flag circuit requires one flag qubit, and the 2-flag circuit requires at most four flag qubits.

Figure 8A:
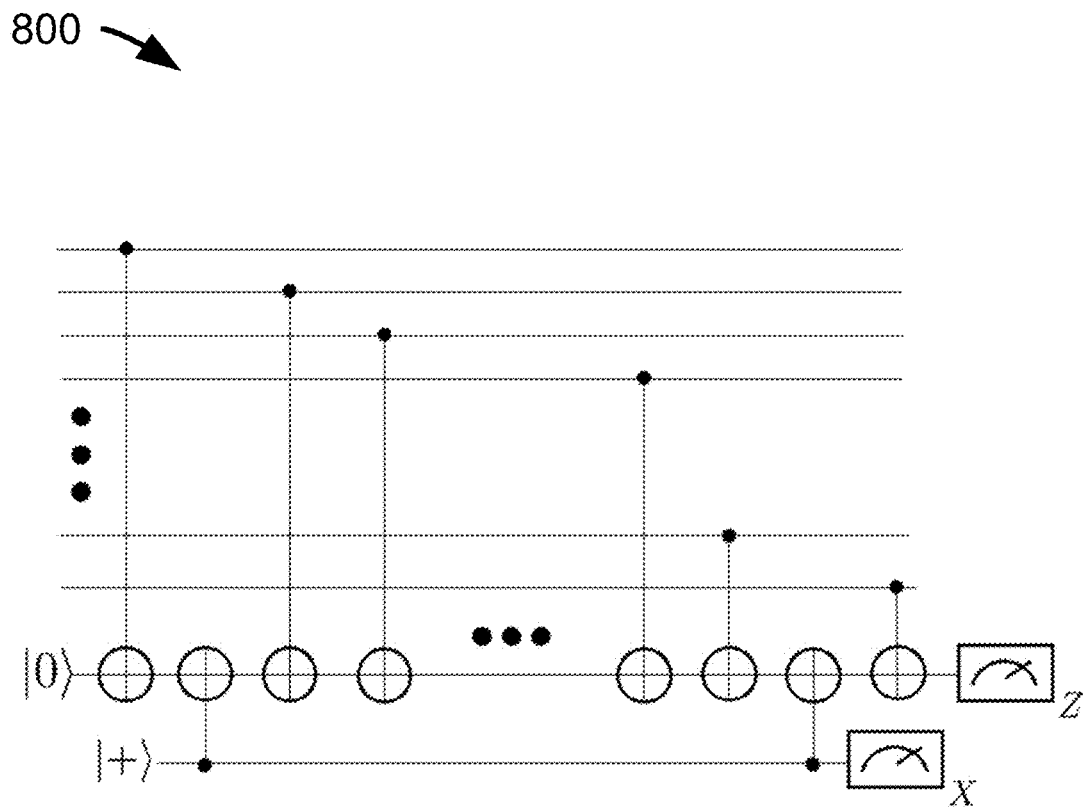
FIG. 8(a) is a schematic block diagram illustrating a general 1-flag circuit construction for measuring the stabilizer $Z^{\otimes w}$ which requires only two $CNOT_{fm}$ gates.
Figure 9A:
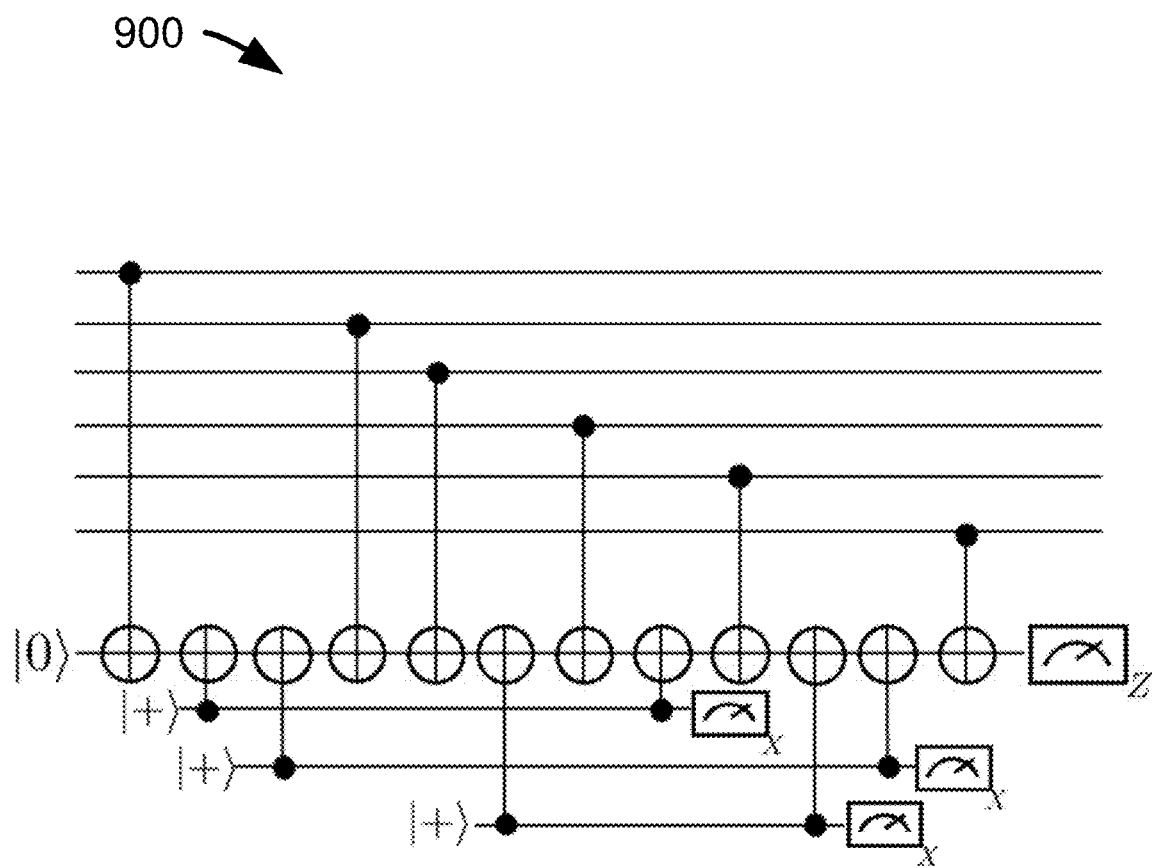
FIGS. 9(a) and 9(b) are schematic block diagrams showing that flag circuits can use more than one flag qubit.
Figure 9B:
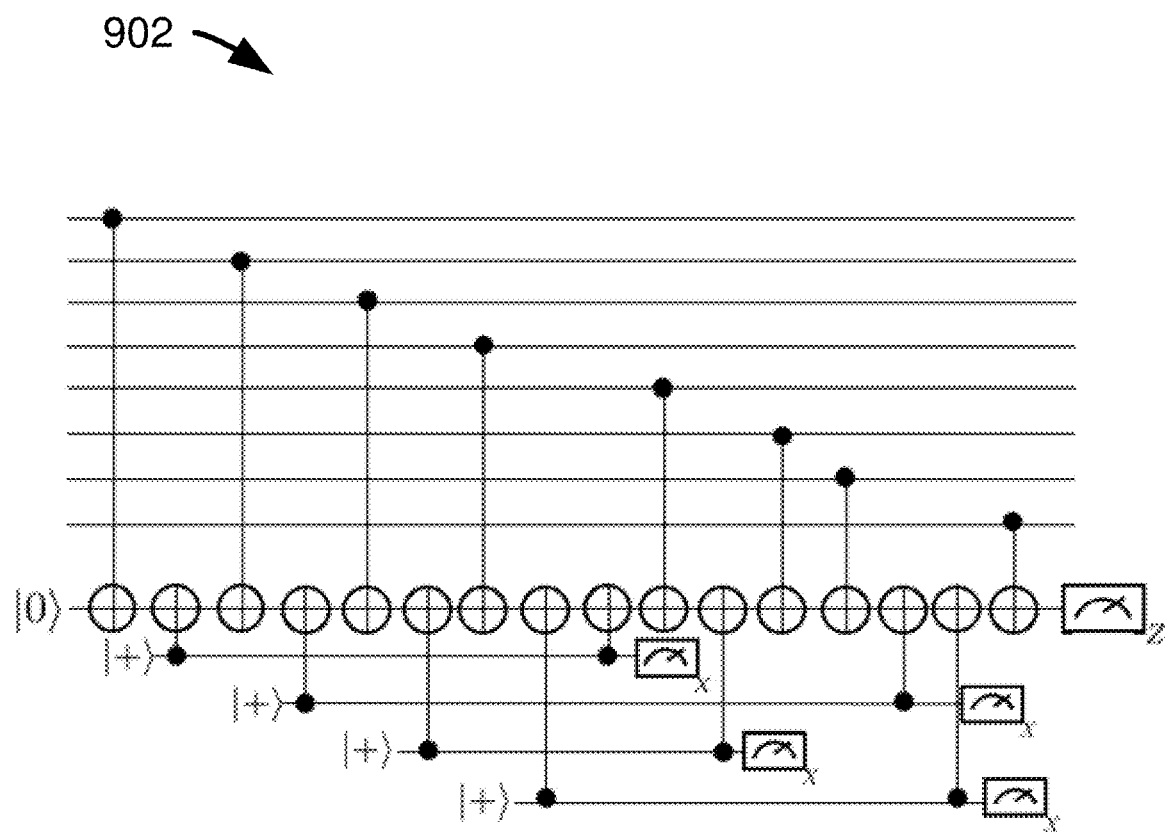

As was shown in R. Chao and B. W. Reichardt, "Quantum error correction with only two extra qubits," arXiv:quant-ph/1705.02329 (2017), schematic block diagram 800 of FIG. 8(a) illustrates a general 1-flag circuit construction for measuring the stabilizer $Z^{\otimes w}$ which requires only two $CNOT_{fm}$ gates. Without loss of generality in proving that these are 1- and 2-flag circuits, one can assume that all faults occurred on CNOT gates. This is because any set of υ faults (including those at idle, preparation or measurement locations) will have the same output Pauli operator and flag measurement results as some set of at most υ faults on CNOT gates (since every qubit is involved in at least one CNOT).

To see that the first construction is a 1-flag circuit, note a IZ error occurring on any CNOT will give rise to a flag unless it occurs on the first or last $CNOT_{dm}$ gates or the last $CNOT_{fm}$ gate. However, such a fault on any of these three gates can give rise to an error of weight at most one (after multiplying by the stabilizer $Z^{\otimes w}$). One can also verify that if there are no faults, the circuit in FIG. 8(a) implements a projective measurement of $Z^{\otimes w}$ without flagging. One can check that the circuit preserves the stabilizer group generated by $Z^{\otimes w}$ and X on each ancilla prepared in the $|+\rangle$ state and Z on each ancilla prepared in the $|0\rangle$ state. By using pairs of $CNOT_{fm}$ gates, this construction satisfies the requirement.

Figure 8B:
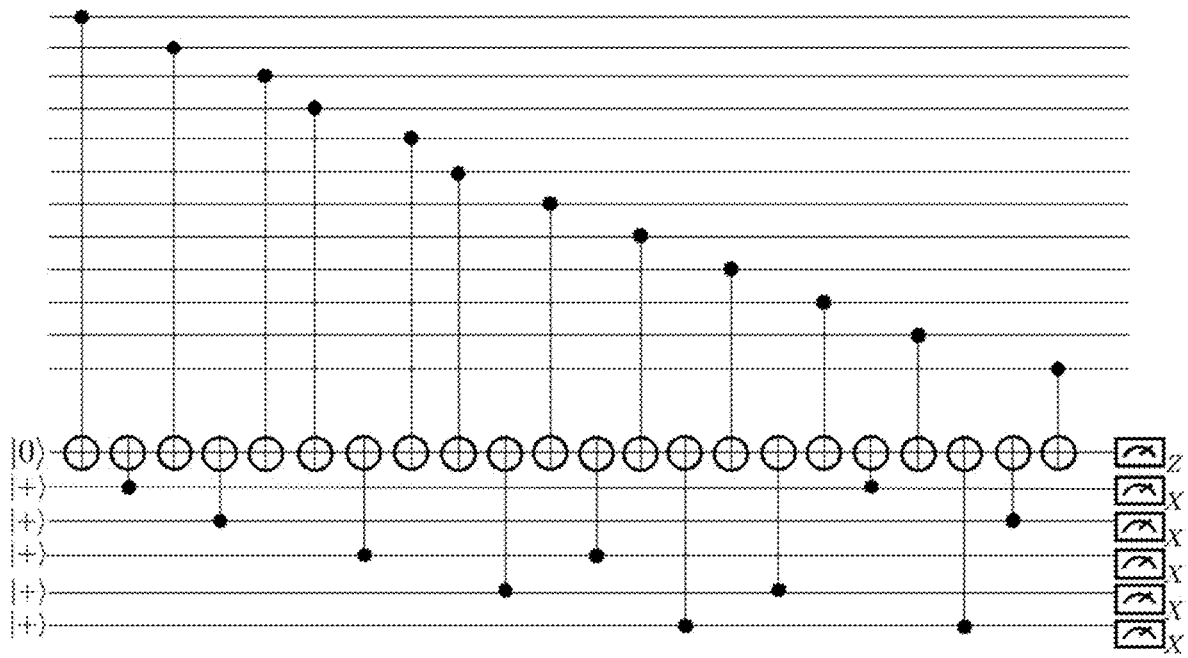
FIG. 8(b) is a schematic block diagram illustrating a general 2-flag circuit construction of the circuit of FIG. 8(a).

In this section, a general 2-flag circuit construction is given (see schematic block diagram 802 of FIG. 8(b) for an example). The circuit consists of pairs of $CNOT_{fm}$ gates each connected to a different flag qubit prepared in the $|+\rangle$ state and measured in the X basis. The general 2-flag circuit construction involves the following placement of $w/2-1$ pairs of $CNOT_{fm}$ gates:

1. Place a $CNOT_{fm}$ pair between the first and second last $CNOT_{dm}$ gates.
2. Place a $CNOT_{fm}$ pair between the second and last $CNOT_{dm}$ gates.
3. After the second $CNOT_{fm}$ gate, place the first $CNOT_{fm}$ gate of the remaining pairs after every two $CNOT_{dm}$ gates. The second $CNOT_{fm}$ gate of a pair is placed after every three $CNOT_{dm}$ gates.

Figure 8C:
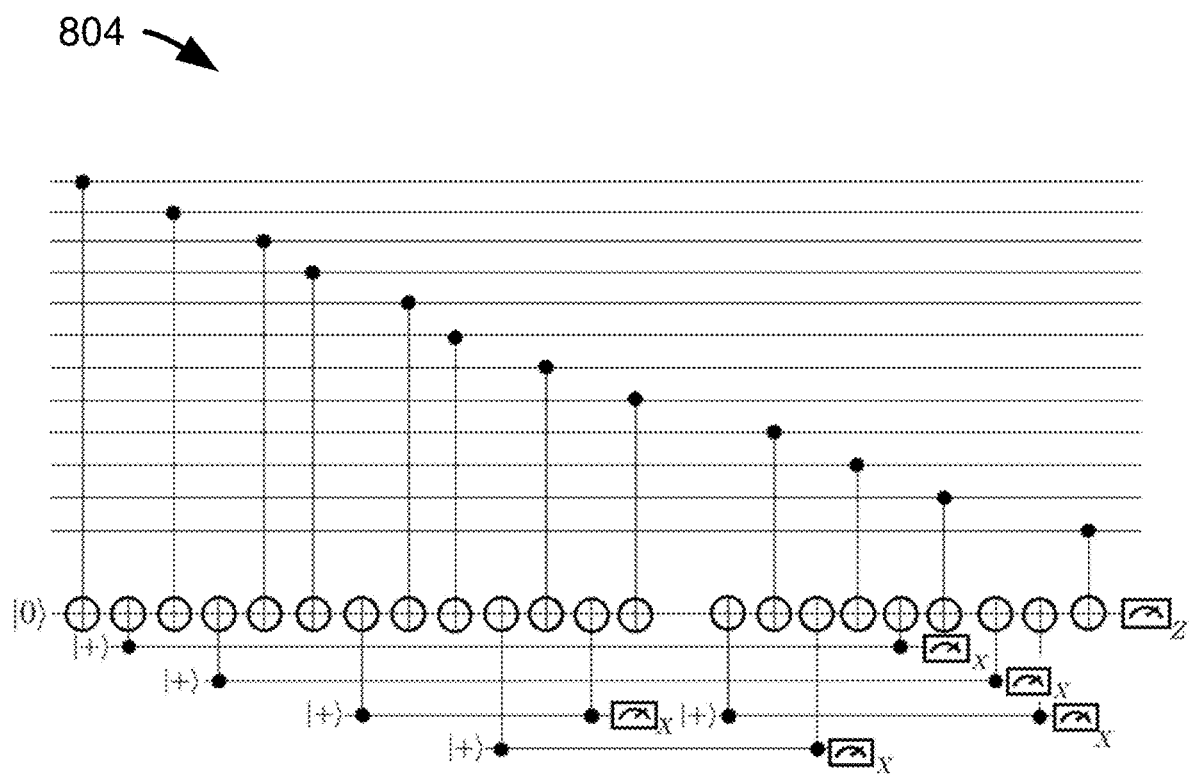
FIG. 8(c) is a schematic block diagram illustrating that it is possible to reuse some flag qubits to measure multiple pairs of $CNOT_{fm}$ gates at the cost of introducing extra time steps into the circuit.

As shown in schematic block diagram 804 in FIG. 8(c), it is possible to reuse some flag qubits to measure multiple pairs of $CNOT_{fm}$ gates at the cost of introducing extra time steps into the circuit. For this reason, at most four flag qubits will be needed, however, if $w \leq 8$, then $w/2-1$ flag qubits are sufficient.

It can now be shown that the above construction satisfies the requirements of a 2-flag circuit. If one CNOT gate fails, by an argument analogous to that used for the 1-flag circuit, there will be a flag or an error of at most weight-one on the data. If the first pair of $CNOT_{fm}$ gates fail causing no flag qubits to flag, after multiplying the data qubits by $Z^{\otimes w}$ the resulting error $E_r$ will have $wt(E_r) \leq 2$. For any other pair of $CNOT_{fm}$ gates that fail causing an error of weight greater than two on the data, by construction there will always be another $CNOT_{fm}$ gate between the two that fail which will propagate a Z error to a flag qubit causing it to flag. Similarly, if pairs of $CNOT_{dm}$ gates fail resulting in the error $E_r$ will have $wt(E_r) \leq 2$ on the data, by construction there will always be an odd number of Z errors propagating to a flag qubit due to the $CNOT_{fm}$ gates in between the $CNOT_{dm}$ gates that failed causing a flag qubit to flag. The same argument applies if a failure occurs between a $CNOT_{dm}$ and $CNOT_{fm}$ gate.

Use of Flag Information:

As seen in FIGS. 8(a), 8(c), 9(a) and 9(b), flag circuits can use more than one flag qubit. The extra flag qubits could be used to reduce the size of the correction sets (define in Eq. (5)) when verifying the Flag t-FTEC condition of see Section IV. To do so, one can first define f, where f is a bit string of length u where u is the number of flag qubits with $f_i=1$ if the i'th flag qubit flagged and 0 otherwise. In this case the correction set is defined as $$\tilde{E}_t^m(g_{i_1}, \ldots, g_{i_m}, s, f_{i_1}, \ldots, f_{i_m}) = \qquad (7)$$

$$\begin{cases} \{E \in \varepsilon(g_{i_1}, \ldots, g_{i_k}, m, f_{i_1}, \ldots, f_{i_m}) \times \varepsilon_{t-m} \\ \quad \text{such that } s(E) = s \} \\ \{E_{min}(s)\} \text{ otherwise,} \end{cases}$$

where $E(g_{i_1}, \ldots, g_{i_k}, m, f_{i_1}, \ldots, f_{i_m})$ is the set of all errors caused by precisely m faults spread amongst the circuits $C(g_{i_1}), C(g_{i_2}), \ldots, C(g_{i_k})$ which each had the flag outcome $f_{i_1}, \ldots, f_{i_m}$.

Hence only errors which result from the measured flag outcome would be stored in the correction set. This could potentially broaden the family of codes which satisfy the Flag t-FTEC condition.

C. Sufficient Condition and Satisfying Code Families

The general flag t-FTEC condition can be difficult to verify for a given code since it depends on precisely which t-flag circuits are used. A sufficient (but not necessary) condition that implies the flag t-FTEC condition is as follows:

Sufficient Flag t-FTEC Condition:

Given a stabilizer code with with distance d>1, and S= $\langle g_1, g_2, \ldots, g_r \rangle$, one requires that for all $\upsilon=0,1, \ldots t$, all choices $Q_{t-\upsilon}$ of $2(t-\upsilon)$ qubits, and all subsets of $\upsilon$ stabilizer generators $\{g_{i_1}, \ldots, g_{i_v}\} \cup \{g_1, \ldots, g_r\}$, there is no logical operator $l \in N(S) \setminus S$ such that $$\text{supp}(l) \subset \text{supp}(g_{i_1}) \cup \ldots \cup \text{supp}(g_{i_v}) \cup Q_{t-\upsilon}, \qquad (8)$$

where $N(S)$ is the normalizer of the stabilizer group.

If this condition holds, then the t-FTEC condition is implied for any choice of t-flag circuits $\{C(g_1), C(g_2), \ldots, C(g_r)\}$. To prove this, one must show that particular sets do not contain elements that differ by a logical operator. First consider $\tilde{E}_t^t(g_{i_1}, \ldots, g_{i_t}, s)$, which has all elements supported within $\text{supp}(g_{i_1}) \cup \ldots \cup \text{supp}(g_{i_t})$. The sufficient condition implies this region cannot contain a logical operator, and therefore the product of two Paulis supported in this region cannot be a logical operator. Now consider the set $\cup_{j=0}^{t-m} \tilde{E}_t^{t-j}(g_{i_1}, \ldots, g_{i_m}, s)$ for a particular $1 \leq m < t$. An error E from this set will have support in the union of the support of the m stabilizer generators $\{g_{i_1}, \ldots, g_{i_m}\}$, along with up to t-m other single qubits. Another error E' from this set will have support in the union of support of the same m stabilizer generators $\{g_{i_1}, \ldots, g_{i_m}\}$, along with up to t-m other potentially different single qubits. If the sufficient condition holds, then supp(EE') cannot contain a logical operator. The other cases follow similarly.

The sufficient flag t-FTEC condition is straightforward to verify for a number of code families with a lot of structure in their stabilizer generators and logical operators. Here, several representative examples are provided.

Surface Codes t-Flag FTEC:

The rotated surface code family $[d^2-1, 1, d]$ for all odd $d=2t+1$ (see FIG. 10) satisfies the flag t-FTEC condition using any 1-flag circuits. See S. Bravyi and A. Kitaev, "Quantum codes on a lattice with boundary," arXiv:quant-ph/9811052 (1998); E. Dennis et al., "Topological quantum memory," Journal of Mathematical Physics, vol. 43, pp. 4452-4505 (2002).

Firstly, since the generators are all weight-4, any 1-flag circuit is a t-flag circuit.

As a CSS code, one can restrict attention to purely X-type and Z-type logical operators. An X type logical operator must have at least one qubit in each of the 2t+1 rows of the lattice shown. However, each stabilizer only contains qubits in two different rows. Therefore, with $\upsilon$ stabilizer generators, at most $2\upsilon$ of the rows could have support. With an additional $2(t-\upsilon)$ qubits, at most 2t rows can be covered, which is fewer than the number of rows, and therefore no logical X operator is supported on the union of the support of υ stabilizers and 2(t−υ) qubits. An analogous arguments holds for Z-type logical operators, therefore the sufficient t-FTEC condition is satisfied.

Figure 10:
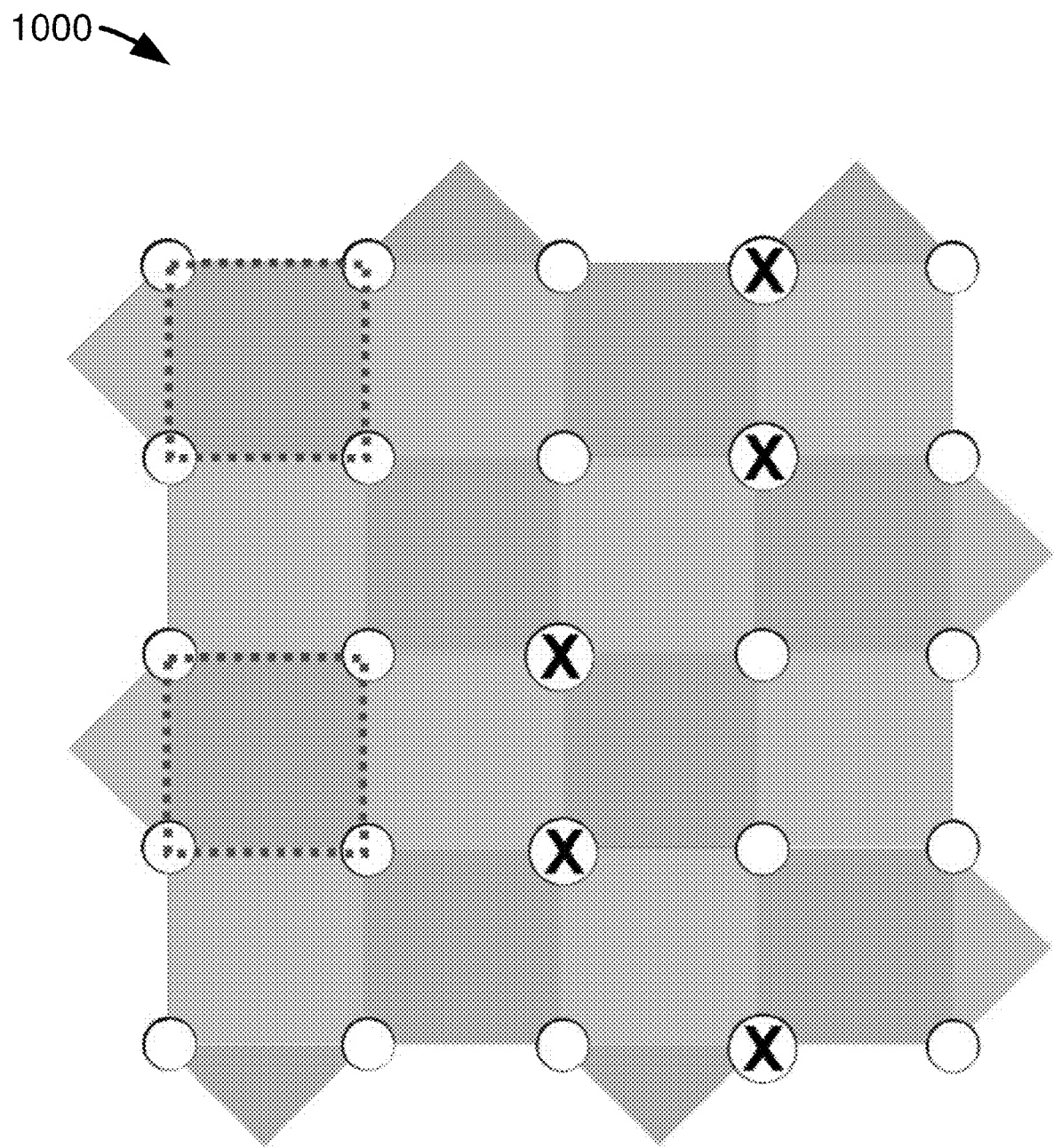
FIG. 10 is a schematic block diagram illustrating an example d=5 rotated surface code.

FIG. 10 is a schematic block diagram 1000 illustrating an example d=5 rotated surface code. Qubits are represented by white circles, and X and Z stabilizer generators are represented by red and green faces. As in the example, any logical X operator has X operators acting on at least five qubits, with at least one in each row of the lattice, involving an even number in any green face. In this case, no two stabilizer generators can have qubits in five rows, and therefore cannot contain an X type logical operator. The argument is analogous for logical Z operators.

Color Codes t-flag FTEC:

Here, it is shown that any distance d=(2t+1) self-dual CSS code with at most weight-6 stabilizer generators satisfies the flag t-FTEC condition using any 2-flag circuits. Examples include the hexagonal color code family 〚$(3d^2+1)/4$, 1, d〛 (see FIG. 6(a)). See H. Bombin et al., "Topological quantum distillation," Phys. Rev. Lett., vol. 97, p. 180501 (October 2006).

Firstly, since the generators are at most weight-6, any 2-flag circuit is a t-flag circuit.

As a self-dual CSS code, X and Z type stabilizer generators are identically supported and one can consider a pure X-type logical operator without loss of generality.

Consider an X type logical operator l such that $$\mathrm{supp}(l) \subset \mathrm{supp}(g_{i_1}) \cup \ldots \cup \mathrm{supp}(g_{i_\upsilon}) \cup Q_{t-\upsilon}, \quad (9)$$

for some set of υ stabilizer generators $\{g_{i_1}, \ldots, g_{i_\upsilon}\} \subset \{g_1, \ldots, g_r\}$ along with 2(t−υ) other qubits $Q_{t-\upsilon}$. Restricted to the support of any of the υ stabilizers $g_i$, $l|_{g_i}$ must have weight 0, 2, 4, or 6 (otherwise it would anti-commute with the corresponding Z type stabilizer). If the restricted weight is 4 or 6, one can produce an equivalent lower weight logical operator $l'=g_i l$, which still satisfies Eq. (9). Repeating this procedure until the weight of the logical operator can no longer be reduced yields a logical operator $l_{min}$ which has weight either 0 or 2 when restricted to the support of any of the υ stabilizer generators. The total weight of $l_{min}$ is then at most 2υ+2(t−υ)=2t, which is less than the distance of the code, giving a contradiction which therefore implies that l could not have been a logical operator. An analogous arguments holds for Z-type logical operators, therefore the sufficient t-FTEC condition is satisfied.

This proof can be easily extended to show that any distance d=(2t+1) self-dual CSS code with at most weight-2υ stabilizer generators for some integer υ satisfies the flag t'-FTEC condition using any (υ−1)-flag circuits, where t'=t/⌊υ/2⌋.

Quantum Reed-Muller Codes 1-flag FTEC:

The 〚$n=2^m-1$, k=1, d=3〛 quantum Reed-Muller code family for every integer m≥3 satisfies the flag 1-FTEC condition using any 1-flag circuits for the standard choice of generators.

One can use the following facts about the Quantum Reed-Muller code family (see Section IX and J. T. Anderson et al., "Fault-tolerant conversion between the steane and reed-muller quantum codes," Phys. Rev. Lett., vol. 113, p. 080501 (2014). for proofs of these facts): (1) The code is CSS, allowing us to restrict to pure X type and pure Z type logical operators, (2) all pure X or Z type logical operators have odd support, (3) every X-type stabilizer generator has the same support as some Z-type stabilizer generator, and (4) every Z-type stabilizer generator is contained within the support of an X type generator.

One only needs to prove the sufficient condition for υ=0, 1 in this case. For υ=0, no two qubits can support a logical operator, as any logical operator has weight at least three. For υ=1, assume the support of an X-type stabilizer generator contains a logical operator l. That logical operator l cannot be Z type or it would anti-commute with the X-stabilizer due to its odd support. However, by fact (3), there is a Z type stabilizer with the same support as the X type stabilizer, therefore implying l cannot be X type either. Therefore, by contradiction one can conclude that no logical operator can be contained in the support of an X stabilizer generator. Since every other stabilizer generator is contained within the support of an X-type stabilizer generators, a logical operator cannot be contained in the support of any stabilizer generator.

Note that the Hamming code family has a stabilizer group which is a proper subgroup of that of the quantum Reed-Muller codes described here. The X-type generators of each Hamming code are the same as for a quantum Reed-Muller code, and the Hamming codes are self-dual CSS codes. It is clear that the sufficient condition cannot be applied to the Hamming code since it has even-weight Z-type logical operators (which are stabilizers for the quantum Reed-Muller code) supported within the support of some stabilizer generators.

Codes which Satisfy Flag t-FTEC Condition but not Sufficient Conditions:

Note that there are codes which satisfy the general flag t-FTEC condition but not the sufficient condition presented in this section. An example of such a code is the 〚5, 1, 3〛 code (see Table VII for the codes stabilizer generators and logical operators). Another example includes the Hamming codes as was explained in the discussion on quantum Reed-Muller codes.

V. Circuit Level Noise Analysis

The purpose of this section is to demonstrate explicitly the flag 2-FTEC protocol, and to identify parameter regimes in which flag FTEC presented both here and in other works offers advantages over other existing FTEC schemes. In

TABLE II

Table containing pseudo-threshold values for the example error correction protocol applied to the 〚19, 1, 5〛 color code for p = p, p = p/10 and p = p/100.

| three-qubit, flag EC | pseudo-threshold |
| --- | --- |
| 〚19, 1, 5〛 with $\tilde{p} = p$ | $p_{pseudo} = (1.14 \pm 0.02) \times 10^{-5}$ |
| 〚19, 1, 5〛 with $\tilde{p} = p/10$ | $p_{pseudo} = (6.70 \pm 0.07) \times 10^{-5}$ |
| 〚19, 1, 5〛 with $\tilde{p} = p/100$ | $p_{pseudo} = (7.74 \pm 0.16) \times 10^{-5}$ |

Section V A the logical failure rates of the 〚19, 1, 5〛 color code was analyzed and its pseudo-threshold for the three choices of $\tilde{p}$ computed. In Section V B, logical failure rates of several fault-tolerant error correction schemes applied to distance-three and distance-five stabilizer codes were compared. The stabilizers for all of the studied codes are given in Table VII. Logical failure rates are computed using the full circuit level noise model and simulation methods described in Section II B.

A. Numerical Analysis of the 〚19, 1, 5〛 Color Code

The full circuit-level noise analysis of the disclosed fault-tolerant protocol applied to the 〚19, 1, 5〛 color code was performed using the stabilizer measurement circuits of FIG. 2(b) and FIG. 7(a).

In the weight-six stabilizer measurement circuit of FIG. 7(a), there are 9 CNOT gates, two measurement and state-preparation locations, and 218 resting qubit locations. When measuring all stabilizer generators using non-flag circuits, there are 42 CNOT and 42 XNOT gates, 18 measurement and state-preparation locations, and 2196 resting qubit locations. Consequently, one expects the error suppression capabilities of the flag EC scheme to depend strongly on the number of idle qubit locations.

Figure 11:
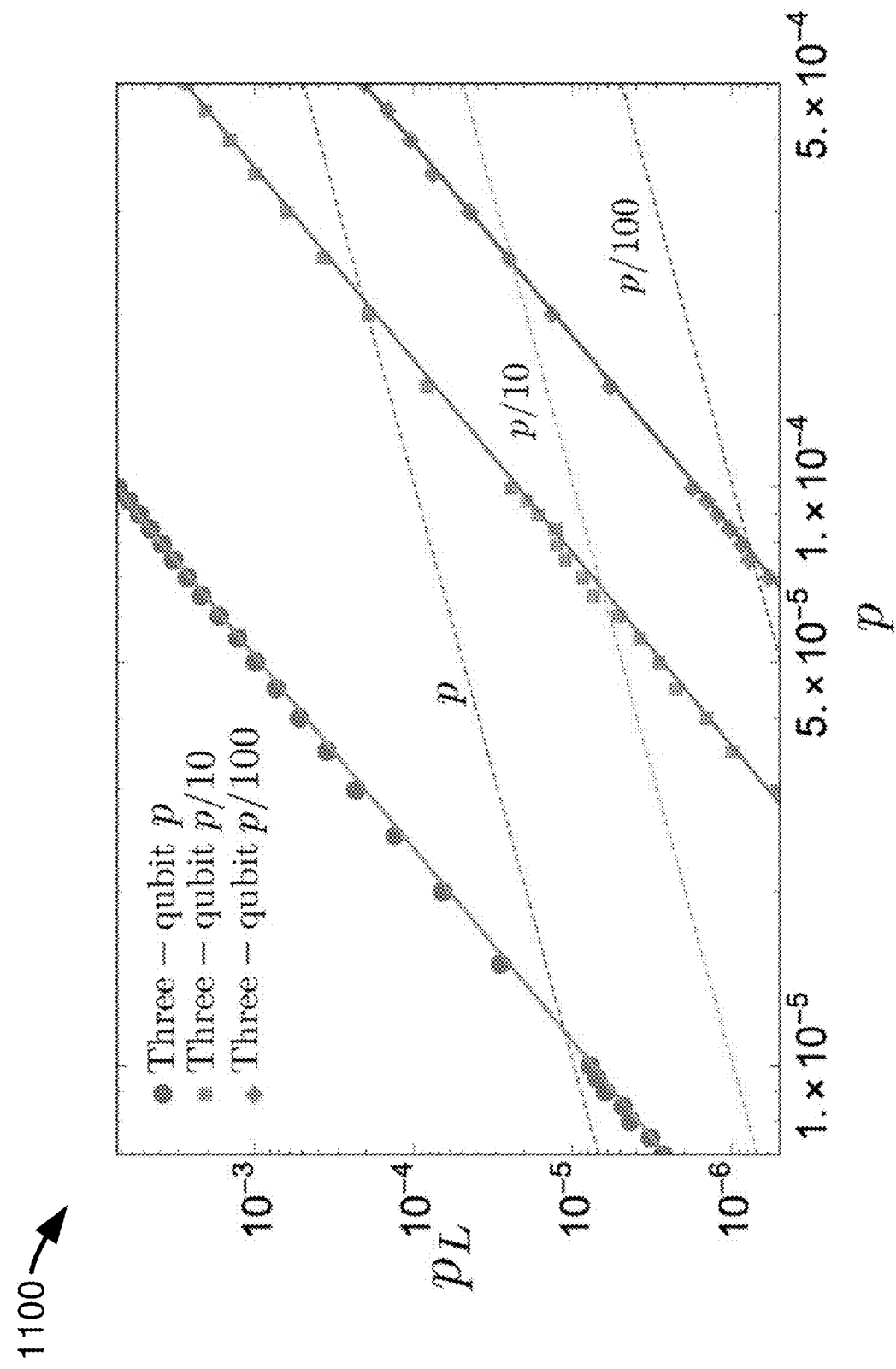
FIG. 11 is a graph showing the logical failure rates of the [19, 1, 5] color code after performing a round of flag EC presented in Section III B for the three noise models described in Section II B.

FIG. 11 is a graph 1100 showing the logical failure rates of the 〚19, 1, 5〛 color code after performing a round of flag EC presented in Section III B for the three noise models described in Section II B. The dashed curves represent the lines $\tilde{p}=p$, $\tilde{p}=p/10$ and $\tilde{p}=p/100$. The crossing point between $\tilde{p}$ and the curve corresponding to $p_L^{([19,1,5])}(\tilde{p})$ in Eq. (3) gives the pseudo-threshold.

Pseudo-thresholds of the 〚19, 1, 5〛 code were obtained using the methods of Section II B. Recall that for extending the lifetime of a qubit, which when idle fails with probability $\tilde{p}$, the probability of failure after implementing a FTEC protocol should be smaller than $\tilde{p}$. The pseudo-threshold using Eq. (3) for the three cases where idle qubits failed with probability $\tilde{p}=p$, $\tilde{p}=p/10$ and $\tilde{p}=p/100$ were calculated. The results are shown in Table II.

The logical failure rates for the three noise models are shown in FIG. 11. It can be seen that when the probability of error on a resting qubit decreases from p to p/10, the pseudo-threshold improves by nearly a factor of six showing the strong dependence of the scheme on the probability of failure of idle qubits.

B. Comparison of Flag Fault-Tolerant Error Correction Schemes

FIG. 12 is a diagram 1200 showing graphs 12(a)-(f) for the logical failure rates for various error correction methods, including various fault-tolerant error correction methods applied to the 〚5, 1, 3〛 code, 〚7, 1, 3〛 Steane code and the 〚19, 1, 5〛 color code. The dashed curves correspond to the lines $\tilde{p}=p$, $\tilde{p}=p/10$ and $\tilde{p}=p/100$. In FIGS. 12(a), (c) and (e), the flag error correction methods are applied to the 〚5, 1, 3〛 and Steane code and the results are compared with the d=3 surface code and Steane error correction applied to the Steane code. In FIGS. 12(b), (d) and (f), the example flag error correction methods are applied to the 〚19, 1, 5〛 color code, and the results are compared with the d=5 surface code and Steane error correction applied to the 〚19, 1, 5〛 color code.

These numerical results suggest the following fault-tolerant experiments of the schemes considered herein for extending the fidelity of a qubit. (1) If $7 \leq n \leq 16$, only the 5 and 7 qubit codes with flag 1-FTEC are accessible. However, performance is much worse than higher qubit alternatives unless $\tilde{p}/p$ is small. (2) For $17 \leq n \leq 34$, the d=3 surface code seems the most promising, unless $\tilde{p}/p$ is very small, in which case flag 2-FTEC with the 19-qubit code could be better. (3) For $35 \leq n \leq 48$, Steane EC with d=3 code is better than all other approaches studied, except for very low p where flag 2-FTEC should be better due to ability to correct two rather than just one fault. (4) For $n \geq 49$, the d=5 surface code is expected to perform better than the other alternatives below pseudo-threshold.

The most promising schemes for testing fault-tolerance in near term quantum devices are those which achieve high pseudo-thresholds while maintaining a low qubit overhead. The flag-FTEC protocol presented in this disclosure uses fewer qubits compared to other well known fault-tolerance schemes but typically has increased circuit depth. In this section, the flag-FTEC protocol of Sections III A and III B is applied to the 〚5, 1, 3〛, 〚7, 1, 3〛 and 〚19, 1, 5〛 codes. Here, logical failure rates for three values of $\tilde{p}$ are compared with Steane error correction applied to the 〚7, 1, 3〛 and 〚19, 1, 5〛 codes and d=3 and d=5 surface codes. More details on surface codes and Steane error correction are provided in Sections X and XI.

Results of the logical failure rates for $\tilde{p}=p$, $\tilde{p}=p/10$ and $\tilde{p}=p/100$ are shown in FIG. 12. Various pseudo-thresholds and required time-steps for the considered fault-tolerant error correction methods are given in Tables III and IV.

The circuits for measuring the stabilizers of the 5-qubit code were similar to the ones used in FIG. 2(b) (for an X Pauli replace the CNOT by an XNOT). For flag-FTEC methods, it can be seen that the 〚5, 1, 3〛 code always achieves lower logical failure rates compared to the 〚7, 1, 3〛 code. However, when $\tilde{p}=p$, both the d=3 surface code as well as Steane-EC achieves lower logical failure rates (with Steane-EC achieving the best performance). For $\tilde{p}=p/10$, flag-EC applied to the 〚5, 1, 3〛 code achieves nearly identical logical failure rates compared to the d=3 surface code. For $\tilde{p}=p/100$, flag-EC applied to the 〚5, 1, 3〛 code achieves lower logical failure rates than the d=3 surface code but still has higher logical failure rates compared to Steane-EC.

One can also note that the pseudo-threshold increases when $\tilde{p}$ goes from p to p/10 for both the 〚5, 1, 3〛 and 〚7, 1, 3〛 codes under flag-EC. This is primarily due to the large circuit depth in flag-EC protocols since idle qubits locations

TABLE III

Distance-three pseudo-threshold results for various fault-tolerant error correction protocols and noise models applied to the 〚5, 1, 3〛, 〚7, 1, 3〛 and d = 3 surface code. Also included are the number of time steps required to implement the protocols.

| Fault-tolerant error correction scheme | Noise model | Number of qubits | Time steps ($T_{time}$) | Pseudo-threshold |
|---|---|---|---|---|
| Flag-EC〚5, 1, 3〛 | $\tilde{p} = p$ | 7 | $64 \leq T_{time} \leq 88$ | $p_{pseudo} = (7.09 \pm 0.03) \times 10^{-5}$ |
| Flag-EC〚7, 1, 3〛 | | 9 | $72 \leq T_{time} \leq 108$ | $p_{pseudo} = (3.39 \pm 0.10) \times 10^{-5}$ |
| d = 3 Surface code | | 17 | $\geq 18$ | $p_{pseudo} = (3.29 \pm 0.16) \times 10^{-4}$ |
| Steane-EC〚7, 1, 3〛 | | $\geq 35$ | 15 | $p_{pseudo} = (6.29 \pm 0.13) \times 10^{-4}$ |
| Flag-EC〚5, 1, 3〛 | $\tilde{p} = p/10$ | 7 | $64 \leq T_{time} \leq 88$ | $p_{pseudo} = (1.11 \pm 0.02) \times 10^{-4}$ |
| Flag-EC〚7, 1, 3〛 | | 9 | $72 \leq T_{time} \leq 108$ | $p_{pseudo} = (8.68 \pm 0.15) \times 10^{-5}$ |
| d = 3 Surface code | | 17 | $\geq 18$ | $p_{pseudo} = (1.04 \pm 0.02) \times 10^{-4}$ |
| Steane-EC〚7, 1, 3〛 | | $\geq 35$ | 15 | $p_{pseudo} = (3.08 \pm 0.01) \times 10^{-4}$ |
| Flag-EC〚5, 1, 3〛 | $\tilde{p} = p/100$ | 7 | $64 \leq T_{time} \leq 88$ | $p_{pseudo} = (2.32 \pm 0.03) \times 10^{-5}$ |
| Flag-EC〚7, 1, 3〛 | | 9 | $72 \leq T_{time} \leq 108$ | $p_{pseudo} = (1.41 \pm 0.05) \times 10^{-5}$ |

TABLE III-continued

Distance-three pseudo-threshold results for various fault-tolerant error correction protocols and noise models applied to the ⟦5, 1, 3⟧, ⟦7, 1, 3⟧ and d = 3 surface code. Also included are the number of time steps required to implement the protocols.

| Fault-tolerant error correction scheme | Noise model | Number of qubits | Time steps ($T_{time}$) | Pseudo-threshold |
|---|---|---|---|---|
| d = 3 Surface code | | 17 | ≥18 | $p_{pseudo} = (1.37 \pm 0.03) \times 10^{-5}$ |
| Steane-EC⟦7, 1, 3⟧ | | ≥35 | 15 | $p_{pseudo} = (3.84 \pm 0.01) \times 10^{-5}$ | significantly outnumber other gate locations. For the surface code, the opposite behaviour is observed. As was shown in A. G. Fowler et al., "Surface codes: Towards practical large-scale quantum computation," Phys. Rev. A, vol. 86, p. 032324 (2012), CNOT gate failures have the largest impact on the pseudo-threshold of the surface code. Thus, when idle qubits have lower failure probability, lower physical error rates will be required in order to achieve better logical failure rates. For instance, if idle qubits never failed, then performing error correction would be guaranteed to increase the probability of failure due to the non-zero failure probability of other types of locations (CNOT, measurements and state-preparation). Lastly, the pseudo-threshold for Steane-EC also decreases with lower idle qubit failure rates, but the change in pseudo-threshold is not as large as the surface code. This is primarily due to the fact that all CNOT gates are applied transversally in Steane-EC, so that the pseudo-threshold is not as sensitive to CNOT errors compared to the surface code. Furthermore, most high-weight errors arising during the state-preparation of the logical ancilla's will be detected (see Section X). Hence, idle qubit errors play a larger role than in the surface code, but Steane-EC has fewer idle qubit locations compared to flag-EC (see Table III for the circuit depths of all schemes).

Although Steane-EC achieves the lowest logical failure rates compared to the other fault-tolerant error correction schemes, it requires a minimum of 35 qubits (more details are provided in Section X). In contrast, the d=3 surface code requires 17 qubits, and flag-FTEC applied to the ⟦5, 1, 3⟧ code requires only 7 qubits. Therefore, if the probability of idle qubit errors is much lower than gate, state preparation and measurement errors, flag-FTEC methods could be good candidates for early fault-tolerant experiments.

It is important to keep in mind that for flag EC methods of distance-three codes considered in this section, the same ancilla qubits are used to measure all stabilizers. A more parallelized version of flag-FTEC applied to the ⟦7, 1, 3⟧ code using four ancilla qubits instead of two is considered in Section XII.

In computing the number of time steps for t-flag fault-tolerant error correction protocols, a lower bound is given in the case where there are no flags and the same syndrome is repeated t+1 times. In Section IV it is shown that the full syndrome measurement for flag-FTEC is repeated at most $t^2+t+1$ times where $t=\lfloor(d-1)/2\rfloor$. An upper bound is thus obtained from a worst case scenario where syndrome measurements are repeated $t^2+t+1$ times.

For distance-five codes, the first thing to notice from FIG. 12 is that the slopes of the logical failure rate curves of flag-EC applied to the ⟦19, 1, 5⟧ code and d=5 surface code are different from the slopes of Steane-EC applied to the ⟦19, 1, 5⟧ code. In particular, $p_L = cp^3 + \mathcal{O}(p^4)$ for flag-EC and the surface code whereas $p_L = c_1 p^2 + c_2 p^3 + \mathcal{O}(p^4)$ for Steane-EC ($c$, $c_1$ and $c_2$ are constants that depend on the code and FTEC method). The reason that Steane-EC has non-zero $\mathcal{O}(p^2)$ contributions to the logical failure rates is that there are instances where errors occurring at two different locations can lead to a logical fault. Consequently, the Steane-EC method that was used is not strictly fault-tolerant according to Definition 2. In Section X, more details on the fault tolerant properties of Steane-EC are provided.

For d=5, the surface code achieves significantly lower logical failure rates compared to all other distance 5 schemes but uses 49 qubits instead of 22 for the ⟦19, 1, 5⟧ code. Furthermore, notice the differences in the slopes of flag-2 FTEC with Steane-EC applied to the ⟦19, 1, 5⟧ code which results in a regime where flag-2 FTEC achieves lower logical failure rates compared to Steane-EC. For $\tilde{p}=p/100$, it can be seen in FIG. 12 that this regime occurs when $p \lesssim 10^{-4}$. One can also note that the pseudo-threshold of flag-EC applied to the ⟦19, 1, 5⟧ color code increases for all noise models whereas the pseudo-threshold decreases for the other FTEC schemes. Again, this is due to the fact that flag-EC has a larger circuit depth compared to the other FTEC methods and is thus more sensitive to idle qubit errors.

Comparing the ⟦19, 1, 5⟧ color code to all the d=3 schemes, if $\tilde{p}=p/100$, the 19-qubit color code acheives lower

TABLE IV

Distance-five pseudo-threshold results for various fault-tolerant error correction protocols and noise models applied to the ⟦19, 1, 5⟧ color code and d = 5 surface code. Also included is the number of time steps required to implement the protocols.

| Fault-tolerant error correction scheme | Noise model | Number of qubits | Time steps ($T_{time}$) | Pseudo-threshold |
|---|---|---|---|---|
| Flag-EC⟦19, 1, 5⟧ | $\tilde{p} = p$ | 22 | $486 \leq T_{time} \leq 1092$ | $p_{pseudo} = (1.14 \pm 0.02) \times 10^{-5}$ |
| d = 5 Surface code | | 49 | ≥18 | $p_{pseudo} = (9.41 \pm 0.17) \times 10^{-4}$ |
| Steane-EC⟦19, 1, 5⟧ | | ≥95 | 15 | $p_{pseudo} = (1.18 \pm 0.02) \times 10^{-3}$ |
| Flag-EC⟦19, 1, 5⟧ | $\tilde{p} = p/10$ | 22 | $486 \leq T_{time} \leq 1092$ | $p_{pseudo} = (6.70 \pm 0.07) \times 10^{-5}$ |
| d = 5 Surface code | | 49 | ≥18 | $p_{pseudo} = (7.38 \pm 0.22) \times 10^{-4}$ |
| Steane-EC⟦19, 1, 5⟧ | | ≥95 | 15 | $p_{pseudo} = (4.42 \pm 0.27) \times 10^{-4}$ |
| Flag-EC⟦19, 1, 5⟧ | $\tilde{p} = p/100$ | 22 | $486 \leq T_{time} \leq 1092$ | $p_{pseudo} = (7.74 \pm 0.16) \times 10^{-5}$ |
| d = 5 Surface code | | 49 | ≥18 | $p_{pseudo} = (2.63 \pm 0.18) \times 10^{-4}$ |
| Steane-EC⟦19, 1, 5⟧ | | ≥95 | 15 | $p_{pseudo} = (5.60 \pm 0.43) \times 10^{-5}$ | logical failure rates than both the surface code and Steane-EC applied to the [7, 1, 3] code. Thus if idle qubit locations have low probability of failure, using flag error correction with only 22 qubits outperforms Steane error correction (which uses a minimum of 35) and the d=3 surface code which uses 17 qubits.

Note the considerable number of time steps involved in a round of flag error correction, particularly in the d=5 case in Table IV. For many applications, this is a major drawback, for example for quantum computation when the time of an error correction round dictates the time of a logical gate. However there are some cases in which having a larger number of time-steps in an EC round while holding the logical error rate fixed is advantageous as it corresponds to a longer physical lifetime of the encoded information. Such schemes could be useful for example in demonstrating that encoded logical quantum information can be stored for longer time scales in the lab using repeated rounds of fault-tolerant error correction.

VI. Review

Building on definitions and a new flag fault-tolerant error correction protocol applied to distance-three and -five codes presented in Section III, in Section IV A a general FTEC protocol was presented, which was called flag t-FTEC, and which is applicable to stabilizer codes of distance d=2t+1 that satisfy the flag t-FTEC condition. The protocol makes use of flag ancilla qubits which signal when υ faults lead to errors of weight greater than υ. In Sections III C and IV B explicit circuit constructions were given, including those needed for distance 3 and 5 codes measuring stabilizers of weight 4, 6 and 8. In Section IV C, a sufficient condition for codes to satisfy the requirements for flag t-FTEC was given. Quantum Reed-Muller codes, Surface codes and hexagonal lattice color codes were shown to be families of codes that satisfy the sufficient condition.

The flag t-FTEC protocol could be useful for fault-tolerant experiments performed in near term quantum devices since it tends to use fewer qubits than other FTEC schemes such as Steane, Knill and Shor EC. In Section V B, numerical evidence was given that with only 22 qubits, the flag 2-FTEC protocol applied to the [19, 1, 5] color code can achieve lower logical failure rates than other codes using similar numbers of qubits such as the rotated distance-3 surface code and Steane-EC applied to the Steane code.

VII. Proof that the Flag t-FTEC Protocol Satisfies the Fault-Tolerant Criteria of Definition (2)

Consider the flag t-FTEC protocol described in Section IV.
Claim 1. If the flag t-FTEC condition is satisfied, then both criteria of Definition 2 will be satisfied.
Proof. One can assume that there are at most t-faults during the flag t-FTEC protocol. Also, one can define a benign fault to be a fault that either leaves the syndrome measurement unchanged or that occurs at a time-step of a stabilizer measurement circuit such that it goes undetected.

By repeating the syndrome measurement using flag circuits, the following cases exhaust all possibilities for the occurrence of at most t faults.

Case 1: The same syndrome is measured t+1 times in a row and there are no flags.

Since there can be at most t-faults, at least one round (say r) had to have been fault-free. Thus the errors on the data block during round r were correctly diagnosed. Applying min wt(s) will remove those errors. Furthermore, since all syndrome measurements are identical and there are no flags, there can be at most t errors which are introduced on the data blocks from faults during syndrome measurement rounds (excluding round r). Since none of the errors change the syndrome, after applying the correction, the output state can differ from a codeword by an error of weight at most t. Thus both conditions of Definition 2 are satisfied.

Case 2: There are no flags and $n_{diff}$=t.

By definition, the only way that $n_{diff}$=t is if there were t-faults that changed the syndrome measurement outcome. Further since there were no flags, an error E afflicting the data qubits must satisfy wt(E)≤t. Thus repeating the syndrome measurement using non-flag circuits will correctly identify and remove the error.

Note that if there are no flags, the protocol terminates when either Case 1 or Case 2 is satisfied. As was shown in Section IV, the maximum number of syndrome measurement rounds until either case is satisfied is $t^2+t+1$.

Case 3: A set of t circuits $\{C(g_{i_1}), \ldots, C(g_{i_t})\}$ flagged.

Since t circuits $\{C(g_{i_1}), \ldots, C(g_{i_t})\}$ flagged and given that there can be at most t faults, then no other faults can occur during the protocol. Hence, when repeating the syndrome measurement using non-flag circuits, the measured syndrome will correspond to an error $E_r \in \tilde{E}^t_r(g_{i_1}, \ldots g_{i_t}, s)$. Since from the flag t-FTEC condition all elements of $\tilde{E}^t_r(g_{i_1}, \ldots g_{i_t}, s)$ are logically equivalent, the product of errors resulting from the flag circuits $\{C(g_{i_1}), \ldots, C(g_{i_t})\}$ will be corrected.

Note that for an input error $E_{in}$ of arbitrary weight and by definition of $\tilde{E}^t_r(g_{i_1}, \ldots g_{i_t}, s)$, the corrected state will always be a valid codeword. Thus both conditions of Definition 2 are satisfied.

Case 4: The m circuits $\{C(g_{i_1}), \ldots, C(g_{i_m})\}$ flagged with 1≤m<t and $n_{same}$=t−m+1

Suppose that at some point during the protocol there were m circuits $\{C(g_{i_1}), \ldots, C(g_{i_m})\}$ that flagged. There can thus be at most t−m faults that don't result in a flag. When repeating the syndrome measurement using flag circuits, if the same syndrome is measured t−m+1 times in a row, it is guaranteed that at least one of the syndrome measurement was fault-free and thus correctly identified the errors arising from the flags (along with errors E with wt(E)≤t−m). There are several possibilities for the distribution of the errors.

1. There were t−m benign faults that occurred during a syndrome measurement and each circuit in $\{C(g_{i_1}), \ldots, C(g_{i_m})\}$ had a fault at a bad location.
2. There were t faults distributed throughout the $\{C(g_{i_1}), \ldots, C(g_{i_m})\}$ flag circuits.
3. There were $j_1$<t−m in faults that did not lead to a flag and $j_2$≥m (with $j_1+j_2$≤t) faults which caused the circuits $\{C(g_{i_1}), \ldots, C(g_{i_m})\}$ to flag.

All possible error outcomes are included in the set $\cup^{t-m}_{j=0} \tilde{E}^{t-j}_r(C(g_{i_1}), \ldots, C(g_{i_m}), s)$. Since from the flag t-FTEC condition these can be identified and corrected, the output state can differ from a valid codeword by an error of at most weight t−m.

Case 5: The m circuits $\{C(g_{i_1}), \ldots, C(g_{i_m})\}$ flagged with 1≤m<t and $n_{diff}$=t−m If m circuits $\{C(g_{i_1}), \ldots, C(g_{i_m})\}$ flagged, there can be at most t−m faults that do not lead to a flag. If $n_{diff}$=t−m, then there must have been exactly t−m faults that did not lead to a flag. Repeating the syndrome measurement using non-flag circuits and from the flag t-FTEC condition, the syndrome will correspond to an error in the set $\tilde{E}^m_r(g_{i_1}, \ldots g_{i_m}, s)$ thus removing the errors. If the input state differs from a valid codeword by an error of arbitrary weight, by definition of $\tilde{E}^m_r(g_{i_1}, \ldots g_{i_m}, s)$ the output state will be a valid codeword.

Case 6: The m circuits $\{C(g_{i_1}), \ldots, C(g_{i_m})\}$ flagged with $1 \le m < t$, $n_{\mathit{diff}} = k$; $m+k < t$ and $n_{\mathit{same}} = t-m-k+1$ In this case there are m flags, k faults which caused the syndromes to change and t−m−k+1 identical syndromes after all the m flags occurred. Since there can only be t−m−k errors which don't change the syndrome, at least one syndrome measurement (say during round r with syndrome s) will be error free correctly identifying the errors afflicting the data during round r. It is straightforward to verify that the possible errors corresponding to the measured syndrome s belong to the set $\cup_{j=0}^{t-m-k} \tilde{E}_t^{t-j-k}(g_{i_1}, \ldots, g_{i_m}, s)$.

After applying a correction, there can be an error of weight at most t−m−k on the data.

VIII. Fault-Tolerant State Preparation and Measurement using Flag t-FTEC

In this section, it is shown how to fault-tolerantly prepare a logical $|\bar{0}\rangle$ state and how to perform fault-tolerant measurements for codes that satisfy the flag t-FTEC condition of Section IV. Note that there are several methods that can be used for doing so. Here, a procedure is followed similar to that shown in D. Gottesman, "An introduction to quantum error correction and fault-tolerant quantum computation," Proceedings of Symposia in Applied Mathematics, vol. 68, pp. 13-58 (2010) when performing Shor EC. However, as was already shown, the disclosed example protocol requires fewer syndrome measurement repetitions than Shor EC.

Consider an n-qubit stabilizer code C with stabilizer group $S = \langle g_1, \ldots, g_{n-k}\rangle$ that can correct up to t errors. Notice that the encoded $|\bar{0}\rangle$ state is a +1 eigenstate of the logical $\bar{Z}$ operator and all of the codes stabilizer generators. For k encoded qubits, $|\bar{0}\rangle$ would be +1 eigenstate of $\{\bar{Z}_1, \ldots \bar{Z}_k\}$ and all of the codes stabilizers. For notational simplicity in what follows, it is assumed that k=1.

The state $|\bar{0}\rangle$ is a stabilizer state completely specified by the full stabilizer generators of S and $\bar{Z}$. One can think of $S' = \langle g_1, \ldots g_{n-1}, \bar{Z}\rangle$ as a stabilizer code with zero encoded qubits and a $2^0 = 1$ dimensional Hilbert space. Thus any state which is a +1 eigenstate of all operators in S' will correspond to the encoded $|\bar{0}\rangle$ state.

Now, suppose one prepares $|\bar{0}\rangle_{in}$ using a non-fault-tolerant encoding and perform flag t-FTEC using the extended stabilizers $\langle g_1, \ldots g_{n-1}, \bar{Z}\rangle$. Then by the second criteria of Definition 2, the output state $|\bar{0}\rangle_{out}$ is guaranteed to be a valid codeword with at most t single-qubit errors. But for the extended stabilizers $\langle g_1, \ldots g_{n-1}, \bar{Z}\rangle$ there is only one valid codeword which corresponds to the encoded $|\bar{0}\rangle$ state. In fact, by the second criteria of Definition 2, any n-qubit input state prepared using non-fault-tolerant circuits is guaranteed to be an encoded $|\bar{0}\rangle$ state if there are no more than t faults in the EC round.

Here, it is pointed out that the flag t-FTEC condition of Section IV A is trivially satisfied for S' since the codes logical operators are now stabilizers. In other words, if two errors belong to the set $\tilde{E}^m(g_{i_1}, \ldots, g_{i_k}, s)$, then their product will always be a stabilizer. Therefore, flag t-FTEC protocol can always be applied for the code S'.

To summarize, the encoded $|\bar{0}\rangle$ state can be prepared by first preparing any n-qubit state using non-fault-tolerant circuits followed by applying flag t-FTEC using the extended stabilizers $\langle g_1, \ldots g_{n-1}, \bar{Z}\rangle$. This guarantees that the output state will be the encoded $|\bar{0}\rangle$ state with at most t single-qubit errors.

Now, suppose one wants to measure the eigenvalue of a logical operator $\bar{P}$ where P is a Pauli. If C is a CSS code, one could measure the eigenvalue by performing the measurement transversally. So suppose C is not a CSS code. From D. Gottesman, "An introduction to quantum error correction and fault-tolerant quantum computation," Proceedings of Symposia in Applied Mathematics, vol. 68, pp. 13-58 (2010), it is understood that performing a measurement with s faults on an input state with r errors (r+s≤t) is equivalent to correcting the r errors and performing the measurement perfectly. The protocol for fault-tolerantly measuring the eigenvalue of $\bar{P}$ is described as follows:

1. Perform flag t-FTEC.
2. Use a circuit in FIG. 8 once to measure the eigenvalue of $\bar{P}$.
3. Repeat steps 1 and 2 2t+1 times and take the majority of the eigenvalue of $\bar{P}$.

Step 1 is used to remove input errors to the measurement procedure. However during error correction, a fault can occur which could cause a new error on the data. Thus by repeating the measurement without performing error correction, the wrong state would be measured each time if there were no more faults. But repeating the syndrome 2t+1 times, it is guaranteed that at least t+1 of the syndrome measurements had no faults and that the correct eigenvalue of $\bar{P}$ was measured. Thus taking the majority of the measured eigenvalues will give the correct answer.

Note that during the fault-tolerant measurement procedure, if there is a flag either during the error correction round or during the measurement of $\bar{P}$, when error correction is performed one corrects based on the possible set of errors resulting from the flag.

IX. Quantum Reed-Muller Codes

In this section, it is first described how to construct the family of quantum Reed-Muller codes QRM(m) with code parameters $[\![2^m-1, k=1, d=3]\!]$ following J. T. Anderson et al., "Fault-tolerant conversion between the steane and reed-muller quantum codes," Phys. Rev. Lett., vol. 113, p. 080501 (2014). It is then shown that the family of QRM(m) codes satisfy the sufficient flag 1-FTEC condition of Section IV C.

Reed-Muller codes of order m (RM(1, m)) are defined recursively from the following generator matrices: First, RM(1, 1) has generator matrix $$G_1 = \begin{pmatrix} 1 & 1 \\ 0 & 1 \end{pmatrix}, \tag{10}$$

and RM(1, m+1) has generator matrix $$G_{m+1} = \begin{pmatrix} G_m & G_m \\ 0 & 1 \end{pmatrix}, \tag{11}$$

where 0 and 1 are vectors of zeros and ones in Eq. (11). The dual of RM(1, m+1) is given by the higher order Reed-Muller code RM(m−2, m). In general, the generator matrices for higher-order Reed-Muller codes RM(r, m) are given by $$H_{r,m+1} = \begin{pmatrix} H_{r,m} & H_{r,m} \\ 0 & H_{r-1,m} \end{pmatrix}. \tag{12}$$

with

-continued $$H_{2,1} = H_{1,1} = \begin{pmatrix} 1 & 1 \\ 0 & 1 \end{pmatrix}, \quad (13)$$

The X stabilizer generators of QRM(m) are derived from shortened Reed-Muller codes where the first row and column of $G_m$ are deleted. The resulting generator matrix is defined as $\overline{G}_m$. The Z stabilizer generators are obtained by deleting the first row and column of $H_{m-2,m}$. Similarly, the resulting generator matrix is defined as $\overline{H}_{m-2,m}$.

As was shown in J. T. Anderson et al., "Fault-tolerant conversion between the steane and reed-muller quantum codes," Phys. Rev. Lett., vol. 113, p. 080501 (2014), rows($\overline{G}_m$) ⊂ rows($\overline{H}_{m-2,m}$) and each row has weight $2^{m-1}$. Therefore, all the X-type stabilizer generators of QRM(m) have corresponding Z-type stabilizers. By construction, the remaining rows of $\overline{H}_{m-2,m}$ will have weight $2^{m-2}$.

By construction, every weight $2^{m-2}$ row has support contained within some weight $2^{m-1}$ row of the generator matrix $\overline{H}_{m-2,m}$. Therefore, every Z-type stabilizer generator has support within the support of an X generator.

X. Implementation of Steane Error Correction

Figures 13A, 13B:
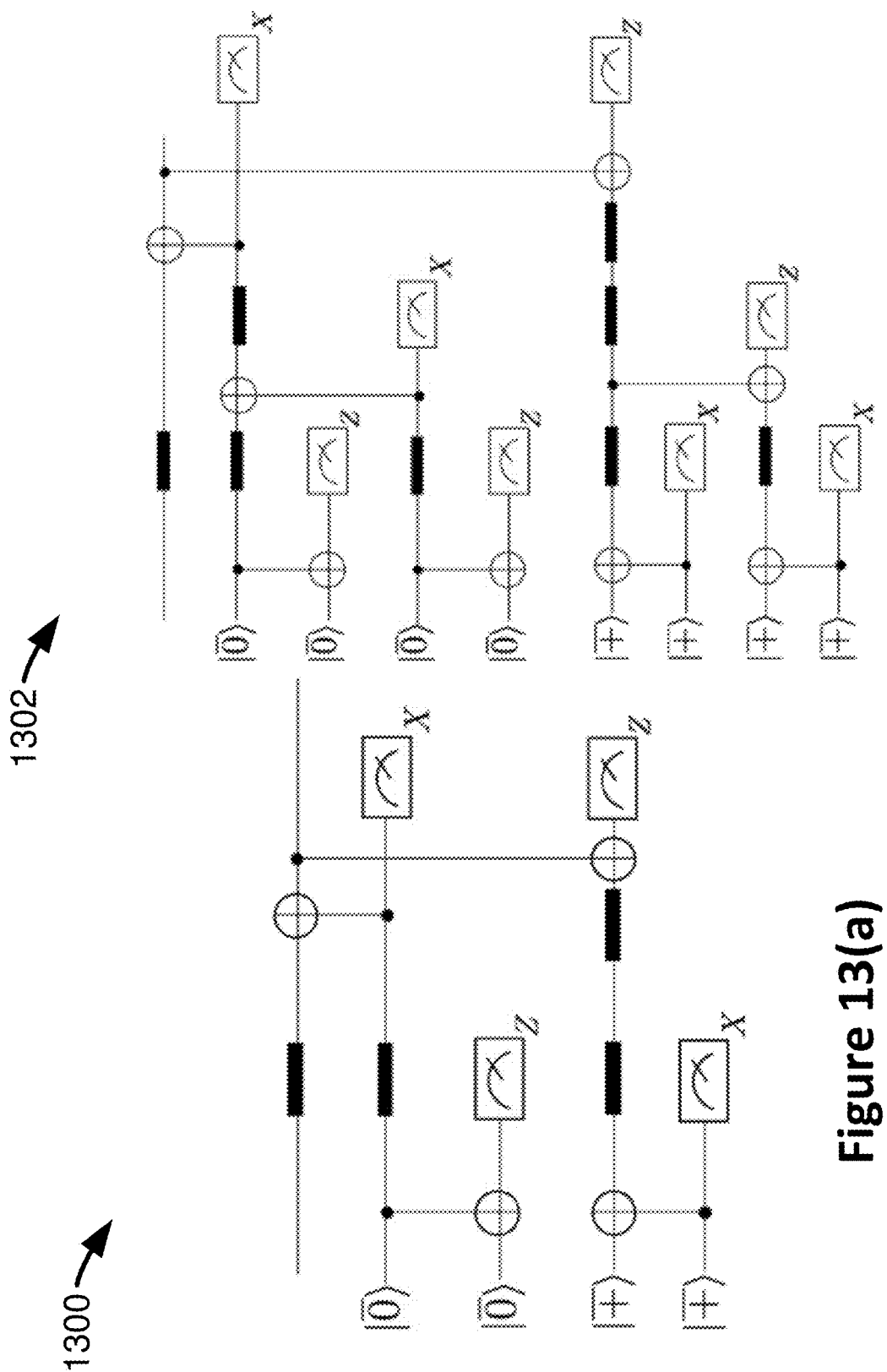
FIG. 13(a) is a schematic block diagram showing a fault-tolerant Steane error correction circuit which can be applied to CSS codes.
FIG. 13(b) is a schematic block diagram showing a fault-tolerant Steane error correction circuit which can be used for any CSS stabilizer code encoding the data.

FIG. 13(a) is a schematic block diagram 1300 showing a fault-tolerant Steane error correction circuit which can be applied to CSS codes. Each line represents an encoded qubit. The circuit uses only two encoded $|\overline{0}\rangle$ and $|\overline{+}\rangle$ ancilla states (encoded in the same error correcting code which protects the data) to ensure that faults in the preparation circuits of the ancilla's don't spread to the data block. FIG. 13(b) is a schematic block diagram 1302 showing a fault-tolerant Steane error correction circuit which can be used for any CSS stabilizer code encoding the data. There are a total of eight encoded ancilla qubits instead of four. The dark bold lines represent resting qubits.

generators are measured by preparing the encoded $|\overline{0}\rangle$ state and performing transversal CNOT gates between the ancilla and the data, with the ancilla acting as the control qubits and the data acting as the target qubits. After applying the transversal CNOT gates, the syndrome is obtained by measuring $|\overline{0}\rangle$ transversally in the X-basis. The code construction for CSS codes is what guarantees that the correct syndrome is obtained after applying a transversal measurement (see D. Gottesman, "An introduction to quantum error correction and fault-tolerant quantum computation," Proceedings of Symposia in Applied Mathematics, vol. 68, pp. 13-58 (2010) for more details).

Similarly, the Z-stabilizer generators are measured by preparing the encoded $|\overline{+}\rangle$, applying CNOT gates transversally between the ancilla and the data with the data acting as the control qubits and the ancilla's acting as the target qubits. The syndrome is then obtained by measuring $|\overline{+}\rangle$ transversally in the Z-basis.

The above protocol as stated is not sufficient in order to be fault-tolerant. The reason is that in general the circuits for preparing the encoded $|\overline{0}\rangle$ and $|\overline{+}\rangle$ are not fault-tolerant in the sense that a single error can spread to a multi-weight error which could then spread to the code-block when applying the transversal CNOT gates. To make the protocol fault-tolerant, extra $|\overline{0}\rangle$ and $|\overline{+}\rangle$ ancilla states (which is sometimes referred to as a "verifier qubits") are needed to check for multi-weight errors at the output of the ancilla states.

Figures 14A, 14B:
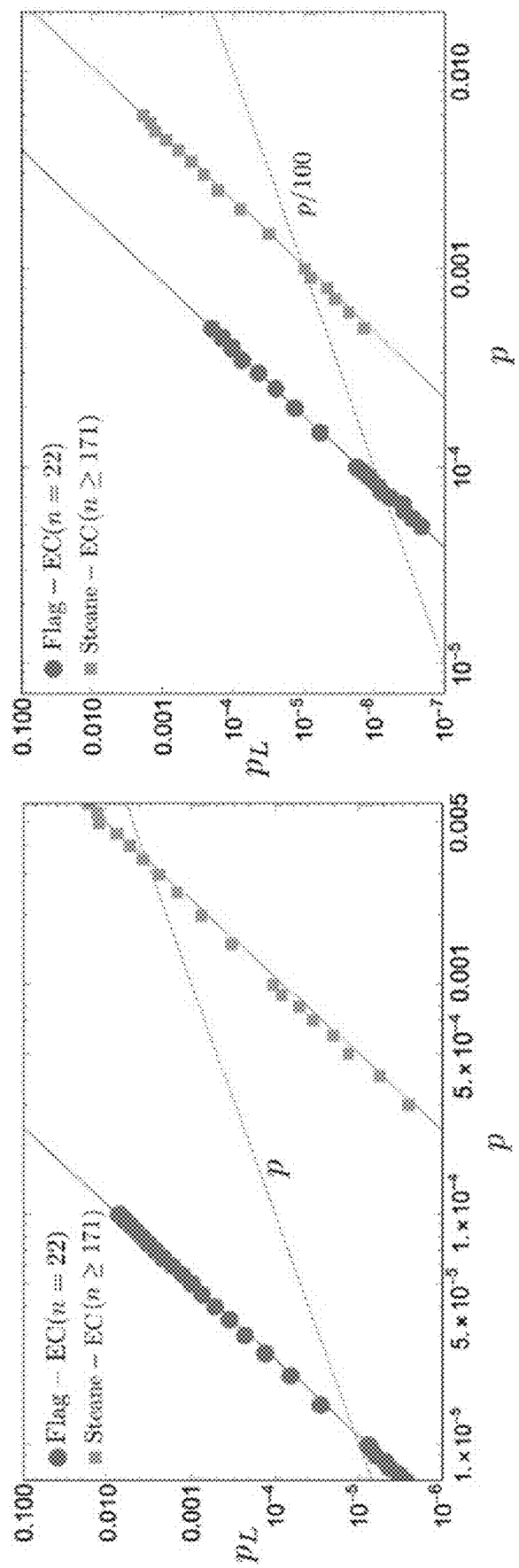
FIG. 14(a) is a schematic block diagram illustrating a situation where resting qubits are chosen to fail with a total probability $\tilde{p}=p$.
FIG. 14(b) is a schematic block diagram illustrating a situation where resting qubits fail with probability $\tilde{p}=p/100$. The intersection between the dashed curve and solid lines represent the pseudo-threshold of both error correction schemes.

Logical failure rate of the full fault-tolerant Steane error correction approach of FIG. 13(b) and the example flag FTEC protocol of Section III B applied to the ⟦19, 1, 5⟧ code. In schematic block diagram 1400 of FIG. 14(a), resting qubits are chosen to fail with a total probability $\tilde{p}=p$ while in schematic block diagram 1402 of FIG. 14(b), resting qubits fail with probability $\tilde{p}=p/100$. The

TABLE V

Pseudo-threshold results for the Full Steane and flag three-qubit error correction schemes applied to the ⟦19, 1, 5⟧ code. Since the Steane error correction protocol is non-deterministic, the number of qubits will depend on how many times the encoded states are rejected. For low error rates, the states are accepted with high probability so that the average number of qubits is ≈171. The example three quint flag error correction protocol requires at most four rounds of syndrome measurements, with each round requiring 162 time steps. However, for low noise rates, the average number of time steps will be close to 162.

| FTEC scheme | Noise model | Number of qubits | Time steps ($T_{time}$) | Pseudo-threshold |
| --- | --- | --- | --- | --- |
| Full Steane-EC | $\tilde{p} = p$ | ≥171 | 15 | $p_{pseudo} = (3.50 \pm 0.14) \times 10^{-3}$ |
| Full Steane-EC | $\tilde{p} = p/100$ | ≥171 | 15 | $p_{pseudo} = (1.05 \pm 0.04) \times 10^{-3}$ |
| Flag-EC⟦19, 1, 5⟧ | $\tilde{p} = p$ | 22 | $162 \le T_{time} \le 648$ | $p_{pseudo} = (1.14 \pm 0.02) \times 10^{-5}$ |
| Flag-EC⟦19, 1, 5⟧ | $\tilde{p} = p/100$ | 22 | $162 \le T_{time} \le 648$ | $p_{pseudo} = (7.74 \pm 0.16) \times 10^{-5}$ |

In this section, a description is provided as to how to implement Steane error correction and discuss its fault-tolerant properties. Also provided is a comparison of a version of Steane error correction with the fault-tolerant scheme described in Section III B applied to the ⟦19, 1, 5⟧ code.

Steane error correction is a fault-tolerant scheme that applies to the Calderbank-Shor-Steane (CSS) family of stabilizer codes. See A. W. Steane, "Active stabilization, quantum computation, and quantum state synthesis," Phys. Rev. Lett., vol. 78, no. 11, p. 2252 (1997). In Steane error correction, the idea is to use encoded $|\overline{0}\rangle$ and $|\overline{+}\rangle$ = ($|\overline{0}\rangle + |\overline{1}\rangle$)/$\sqrt{2}$ ancilla states to perform the syndrome extraction. The ancilla's are encoded in the same error correcting code that is used to protect the data. The X stabilizer intersection between the dashed curve and solid lines represent the pseudo-threshold of both error correction schemes.

For the $|\overline{0}\rangle$ ancilla, multiple X errors can spread to the data if left unchecked. Therefore, another encoded $|\overline{0}\rangle$ ancilla is prepared and a transversal CNOT gate is applied between the two states with the ancilla acting as the control and the verifier state acting as target. Anytime X errors are detected the state is rejected and the error correction protocol start over. Further, if the verifier qubit measures a −1 eigenvalue of the logical Z operator, the ancilla qubit is also rejected. A similar technique is used for verifying the $|\overline{+}\rangle$ state (see FIG. 13(a)).

For the ⟦7, 1, 3⟧ Steane code, an error E=$Z_i Z_j$ can always be written as E=$\overline{Z} Z_k$ where $\overline{Z}$ is the logical Z operator (this is not true for general CSS codes). But $|\bar{0}\rangle$ is a +1 eigenstate of $\bar{Z}$. Therefore, one doesn't need to worry about Z errors of weight greater than one occurring during the preparation of the $|\bar{0}\rangle$ state.

In P. Aliferis, D. Gottesman, and J. Preskill, "Quantum accuracy threshold for concatenated distance-3 codes," Quant Inf. Comput., vol. 6, pp. 97-165 (2006), it was shown that unlike for the ⟦7, 1, 3⟧ code, for general CSS codes the encoded ancilla states need to be verified for both X and Z errors in order for Steane error correction to satisfy the fault-tolerant properties of Definition 2. An example general fault-tolerant scheme is shown in FIG. 13(b). In general, FIG. 13(a) will only satisfy the fault-tolerant criteria of Definition 2 for perfect CSS codes (see P. Aliferis et al., "Quantum accuracy threshold for concatenated distance-3 codes," Quant. Inf. Comput., vol. 6, pp. 97-165 (2006) for more details).

In Section V B logical failure rates were computed for Steane error correction applied to the ⟦19, 1, 5⟧ code using the circuit of FIG. 13(a) in order to minimize the number of physical qubits. However, since the ⟦19, 1, 5⟧ code is not a perfect CSS code, only the circuit in FIG. 13(b) satisfies all the criteria of Definition 2. This explains why the leading order contributions to the logical failure was of the form $p_L = c_1 p^2 + c_2 p^3 + \mathcal{O}(p^4)$ instead of $p_L = cp^3 + \mathcal{O}(p^4)$ (which would be the case for a distance-5 code).

In FIG. 14, Steane error correction was applied using the circuit of FIG. 13(b) to achieve the full error correcting capabilities of the ⟦19, 1, 5⟧ code. Methods presented in A. Paetznick and B. W. Reichardt, "Fault-tolerant ancilla preparation and noise threshold lower bounds for the 23-qubit golay code," Quant. Inf. Compt., vol. 12, pp. 1034-1080 (2011); C. Chamberland et al., "Overhead analysis of universal concatenated quantum codes," Phys. Rev. A, vol. 95, p. 022313 (2017), were used in order to obtain the encoded $|\bar{0}\rangle$ state (since the ⟦19, 1, 5⟧ code is self-dual, the $|\bar{+}\rangle$ state is obtain by interchanging all physical $|0\rangle$ and $|+\rangle$ states are reversing the direction of the cnot gates). The results are compared with our flag FTEC scheme of Section III B for the noise models where resting qubits fail with probability $\tilde{p}=p$ and $\tilde{p}=p/100$. In both cases the logical failure rates have a leading order $p^3$ contribution (which is determined from finding the best fit curve to the data). The pseudo-threshold results are given in Table VI.

As can be seen, the full Steane error correction protocol of FIG. 13(b) achieves significantly lower logical failure rates compared to using the circuit in FIG. 13(a) at the cost of using a minimum of 171 qubits compared to 95. In contrast, the FTEC scheme of Section III B has a pseudo-threshold that is one to two orders of magnitude lower than than the full EC scheme but requires only 22 qubits.

XI. Implementation of Surface Code Error Correction

The rotated surface code is also considered in S. Bravyi and A. Kitaev, "Quantum codes on a lattice with boundary," arXiv:quant-ph/9811052 (1998); E. Dennis et al., "Topological quantum memory," Journal of Mathematical Physics, vol. 43, pp. 4452-4505 (2002); A. G. Fowler et al., "Surface codes: Towards practical large-scale quantum computation," Phys. Rev. A, vol. 86, p. 032324 (2012); Y. Tomita and K. M. Svore, "Low-distance surface codes under realistic quantum noise," Phys. Rev. A., vol. 90, p. 062320 (2014); X.-G. Wen, "Quantum orders in an exact soluble model," Phys. Rev. Lett., vol. 90, p. 016803 (January 2003). as shown in FIG. 15, which has $n=d^2$ data qubits for distance d. Although there is concern with error correction under the circuit level noise model described in Section II B, it is useful to build intuition by first considering the idealized noise model in which stabilizer measurements are perfect, and single qubit X errors occur with probability $2p/3$ (Z errors can be treated in the same way). An X type error E occurs with probability $\mathcal{O}(p^{wt(E)})$, and has syndrome s(E).

Figures 15A, 15B:
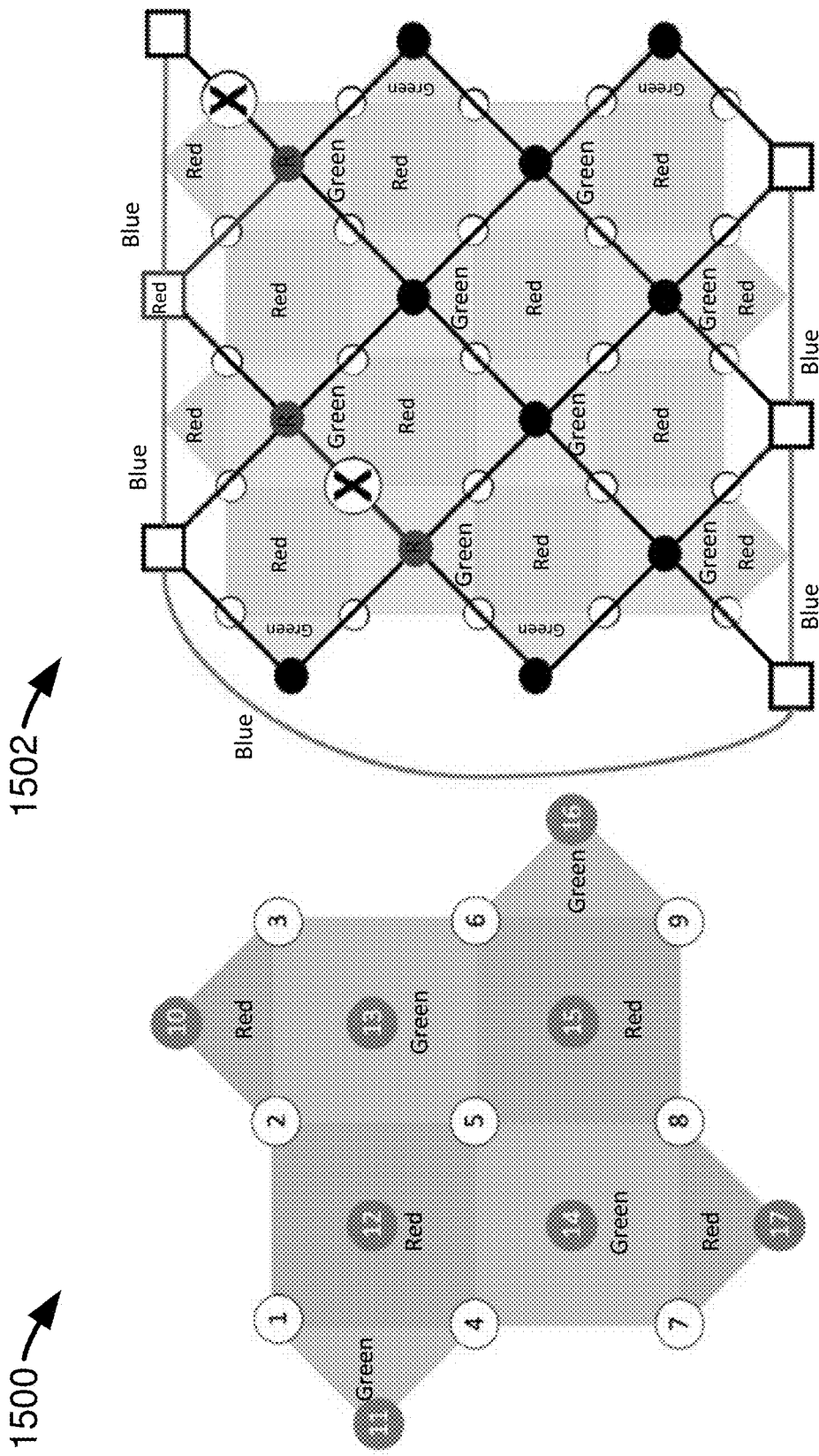
FIG. 15 is a schematic block diagram illustrating a situation where the rotated surface code has $n=d^2$ data qubits for distance d.

More specifically, FIG. 15(a) is a schematic block diagram 1500 showing the d=3 surface code, with data qubits represented by white circles. The X (Z) stabilizer generators are measured with measurement ancillas (gray) in red (green) faces (also denoted as "red" and "r" for red, or "green" for green). Block diagram 1502 is a diagram for perfecting measurements, the graph $G_{2D}$ used to correct X type errors (here for d=5) consists of a black node for each Z-stabilizer, and a black edge for each data qubit in the surface code. White boundary nodes and blue boundary edges are added. Black and blue edges are given weight one and zero respectively. In this example, a two qubit X error has occurred causing three stabilizers to be violated (red nodes). A boundary node is also highlighted and a minimum weight correction (red edges) which terminates on highlighted nodes is found. The algorithm succeeds as the error plus correction is a stabilizer.

The minimum weight X-type correction can be found efficiently for the surface code in terms of the graph $G_{2D}$ shown in FIG. 15(b). The graph $G_{2D}$ has a bulk node (black circle) for each Z stabilizer generator, and a bulk edge (black) for each data qubit. A bulk edge coming from a bulk node corresponds to the edge's data qubit being in the support of the node's stabilizer. The graph also contains boundary nodes (white boxes) and boundary edges (blue), which do not correspond to stabilizers or data qubits. Each bulk and boundary edge is assigned weight one and zero respectively. The minimum weight decoder is then implemented as follows. After the error E is applied, the nodes corresponding to unsatisfied stabilizers are highlighted. If an odd number of stabilizers was unsatisfied, one of the boundary nodes is also highlighted. Highlighted nodes are then efficiently paired together by the minimum weight connections in the graph, by Edmonds' algorithm (see, e.g., J. Edmonds, "Paths, trees, and flowers," Canadian Journal of mathematics, vol. 17, no. 3, pp. 449-467 (1965); V. Kolmogorov, "Blossom V: a new implementation of a minimum cost perfect matching algorithm," Mathematical Programming Computation, vol. 1, no. 1, pp. 43-67 (2009)). The correction C is applied to the edges in the connection. Note that any single $\mathcal{O}(p)$ fault in this noise model corresponds to a weight one edge on the graph.

Figures 16A, 16B:
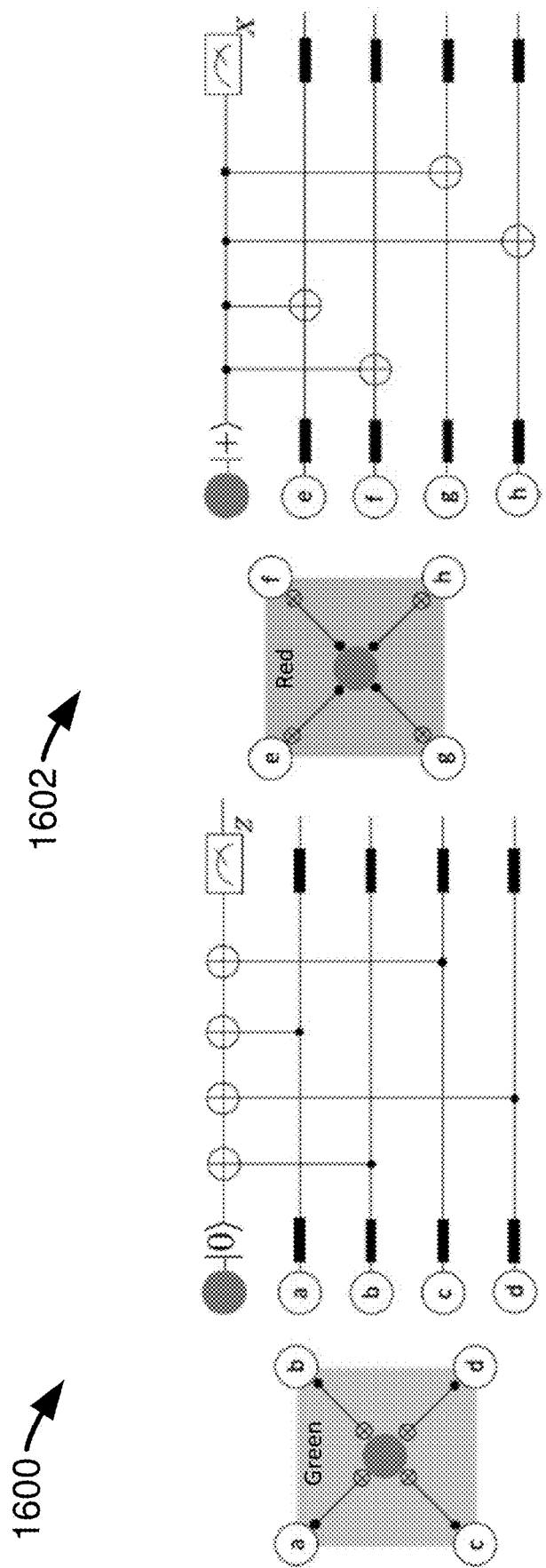
FIG. 16(a) is a schematic block diagram showing a Z-type generator.
FIG. 16(b) is a schematic block diagram showing an X-type generator.

For circuit noise, one can introduce a measurement qubit for each stabilizer generator, as represented by gray circles in FIG. 15, and circuits must be specified to implement the measurements, such as those in FIG. 16. More specifically, FIG. 16 shows circuits for measuring, in schematic block diagram 1600 and FIG. 16 (a), a Z-type generator, and in schematic block diagram 1602 and FIG. 16(b), an X-type generator. Identity gates (black rectangles) are inserted in the Z-type stabilizer measurement circuits to ensure that all measurements are synchronized. Note that unlike in A. G. Fowler et al., "Surface codes: Towards practical large-scale quantum computation," Phys. Rev. A, vol. 86, p. 032324 (2012), to be consistent with the other schemes in this disclosure, one can assume that one can prepare and measure in both the X and Z basis. The performance of the code is sensitive to the choice of circuit Y. Tomita and K. M. Svore, "Low-distance surface codes under realistic quantum noise," Phys. Rev. A., vol. 90, p. 062320, (2014), for example a poor choice could allow a single fault to cause a logical failure for d=3 for any choice of decoder.

To implement the decoder, first construct a new three dimensional graph $G_{3D}$ by stacking d copies of the planar graph $G_{2D}$ that was shown in FIG. 15(b), and adding new bulk (boundary) edges to connect bulk (boundary) nodes in neighboring layers. Also added are additional diagonal edges such that any single $\mathcal{O}(p)$ fault in the measurement circuits corresponds to a weight-one edge in $G_{3D}$ (see FIG. 17). For simplicity, further possible optimizations are not involved, such as setting edge weights based on precise probabilities and including X-Z correlations. FIG. 17 is a block diagram 1700 showing examples of a single fault leading to diagonal edges in $G_{3D}$. Dark arrows represent the CNOT sequence. More specifically, FIG. 17(a) illustrates an X error occurs during the third time step in the CNOT gate acting on the central data qubit. FIG. 17(b) illustrates that during the fifth time step of this round, the X error is detected by the Z type measurement qubit to the top right. FIG. 17(c) illustrates that the X error is not detected by the bottom left Z type stabilizer until the following round. FIG. 17(d) illustrates that an XX error occurs on the third CNOT of an X measurement circuit, which is detected by the Z measurement to the right. FIG. 17(e) illustrates that detection by the left Z stabilizer does not occur until the next round. FIG. 17(f) illustrates that the corresponding edges in $G_{3D}$, green for (a-c), and blue for (d-e). Here, it is shown that two rounds of the graph ignoring boundary edges.

All simulations of the surface code are performed using the circuit noise model in Section II B, with the graph $G_{3D}$ described above as follows (to correct X errors):

1. Data acquisition: Stabilizer outcomes are stored over d rounds of noisy error correction, followed by one round of perfect error correction. The net error E applied over all d rounds is recorded.
2. Highlight nodes: Nodes in the graph $G_{3D}$ are highlighted if the corresponding Z-type stabilizer outcome changes in two consecutive rounds. (For an odd number of highlighted vertices, highlight the boundary vertex.)
3. Minimum weight matching: Find a minimal edge set forming paths that terminate on highlighted nodes. Highlight the edge set.
4. Vertical collapse: The highlighted edges in $G_{3D}$ are mapped edges in the planar graph $G_{2D}$, and are then added modulo 2.
5. Correction: The X-type correction $C_x$ is applied to highlighted edges in $G_{2D}$.

The Z correction $C_z$ is found analogously. Finally, if the residual Pauli $R=EC_xC_z$ is a logical operator, one can say the protocol succeeded, otherwise it is considered to have failed.

XII. Compact Implementation of Flag Error Correction

Figure 18:
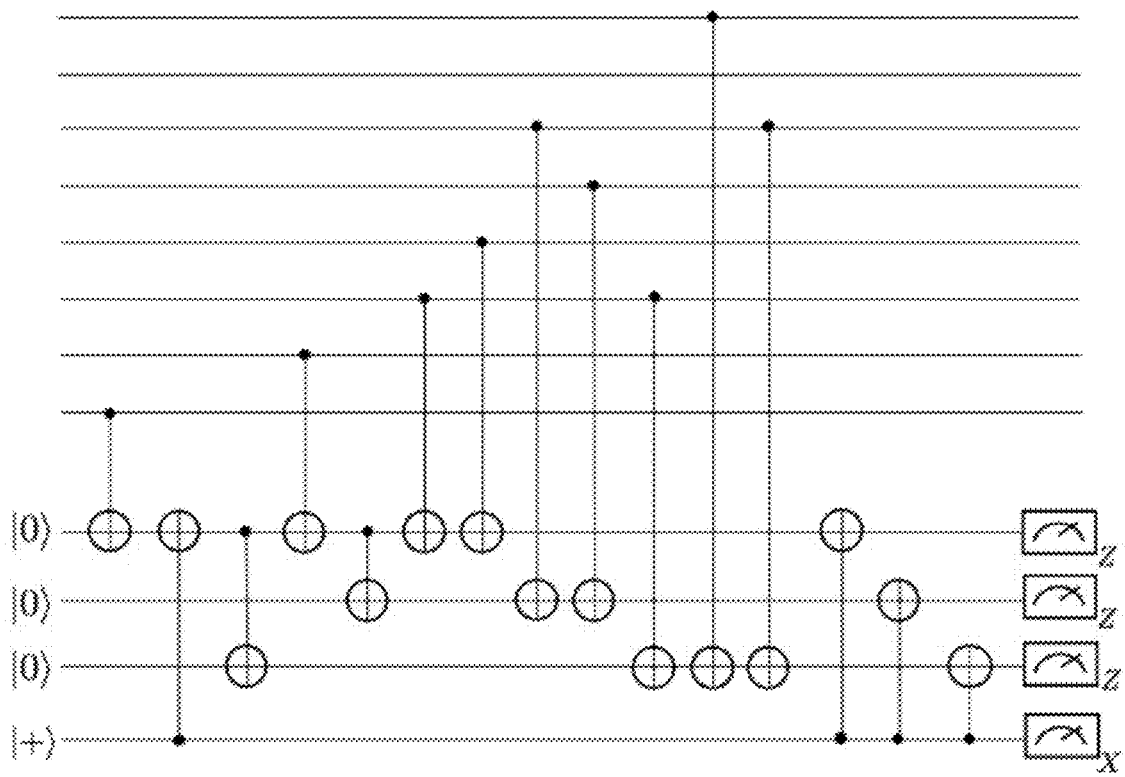
FIG. 18 is a schematic block diagram illustrating a circuit for measuring the Z stabilizer generators of the [7, 1, 3] code using one flag qubit and three measurement qubits.

FIG. 18 is a schematic block diagram 1800 illustrating a circuit for measuring the Z stabilizer generators of the [7, 1, 3] code using one flag qubit and three measurement qubits. The circuit is constructed such that any bad location leading to a bad error will result in a flag, and all bad errors have a unique syndrome.

In R. Chao and B. W. Reichardt, "Quantum error correction with only two extra qubits," arXiv:quant-ph/1705.02329 (2017), it was shown that by using extra ancilla qubits in the flag-EC protocol, it is possible to measure multiple stabilizer generators during one measurement cycle which could reduce the circuit depth. Note that for the Steane code, measuring the Z stabilizers using FIG. 2 requires only one extra time step. In this section, logical failure rates of the [7, 1, 3] code are compared using the flag-EC method of Section III A which requires only two ancilla qubits and a flag-EC method which uses four ancilla qubits but that can measure all Z stabilizer generators in one cycle (see FIG. 18). All X stabilizers are measured in a separate cycle. All simulations were performed using the noise model and methods of Section II B.

Figure 19:
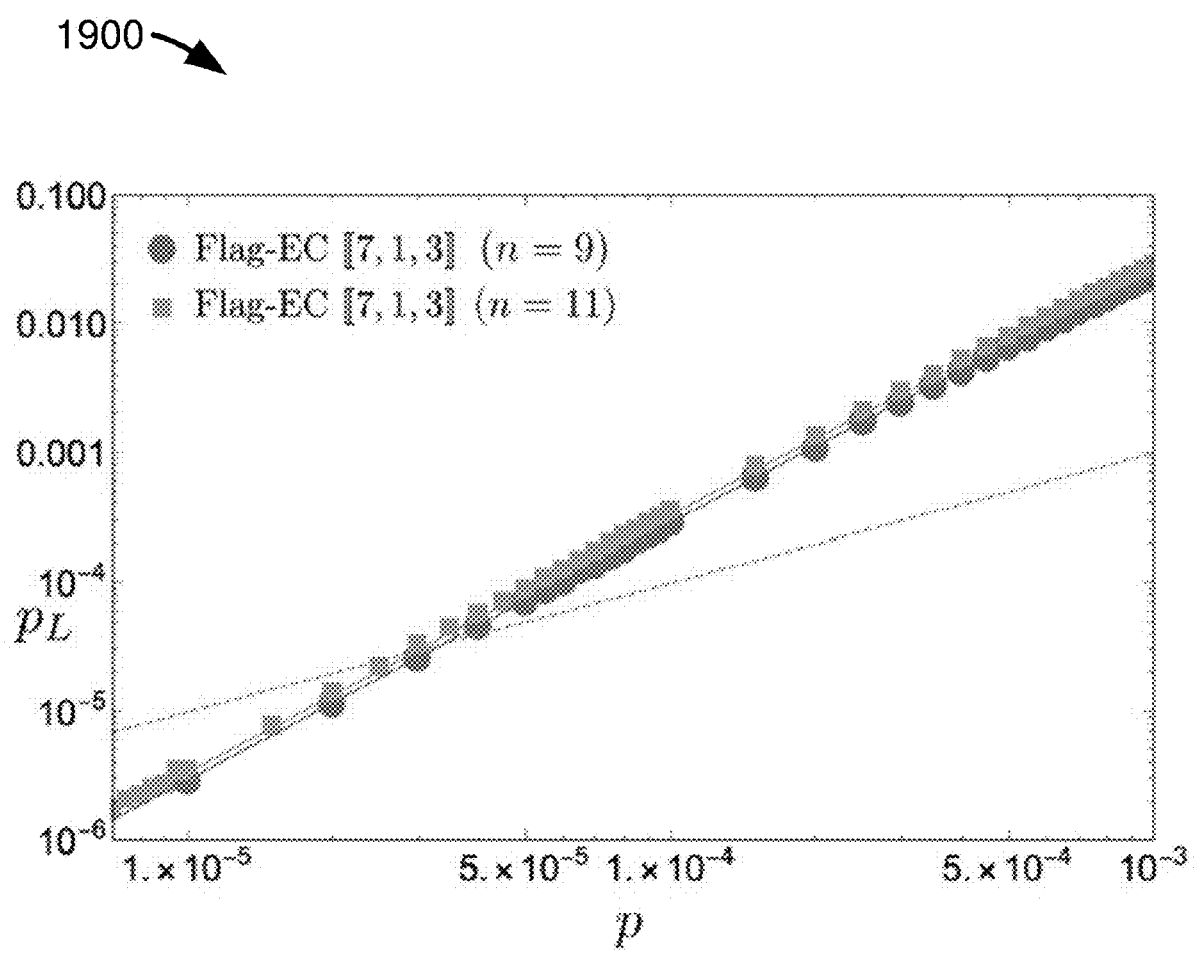
FIG. 19 is a graph showing logical failure rates of flag-EC protocols using two and four ancilla qubits applied to the [7, 1, 3] Steane code.

FIG. 19 is a graph 1900 showing logical failure rates of flag-EC protocols using two and four ancilla qubits applied to the [7, 1, 3] Steane code.

Logical failure rates for $\tilde{p}=p$ are shown in FIG. 19. Pseudo-thresholds and the number of time steps required to implement the protocols are given in Table VI. Note that measuring stabilizers using two ancilla's requires at most two extra time steps. Furthermore, the extra ancilla's for measuring multiple stabilizers result in more idle qubit locations compared to using only two ancilla qubits. With the added locations for errors to be introduced, the flag error correction protocol using only two ancilla's achieves a higher pseudo-threshold compared to the protocol using more ancilla's. Thus assuming that reinitializing qubits can be done without introducing many errors into the system, FTEC using fewer qubits could achieve lower logical failure rates compared to certain schemes using more qubits.

TABLE VI

Pseudo-thresholds and circuit depth for flag-EC protocols using two and four ancilla qubits applied to the [7, 1, 3] code. The results are presented for the noise models where p = p and p = p/100.

| FTEC scheme | Noise model | Number of qubits | Time steps ($T_{time}$) | Pseudo-threshold |
| --- | --- | --- | --- | --- |
| Flag-EC[7, 1, 3] | $\tilde{p} = p$ | 9 | $36 \leq T_{time} \leq 108$ | $p_{pseudo} = (3.39 \pm 0.10) \times 10^{-5}$ |
| Flag-EC[7, 1, 3] |  | 11 | $34 \leq T_{time} \leq 104$ | $p_{pseudo} = (2.97 \pm 0.01) \times 10^{-5}$ |

TABLE VII

Stabilizer generators for the 5-qubit code, including d = 3, d = 5 ([19, 1, 5] code) and d = 5 ([17, 1, 5] code) family of color codes. The last row illustrates representatives of the codes logical operators.

| [5, 1, 3] | Steane code | [19, 1, 5] code | [17, 1, 5] code |
| --- | --- | --- | --- |
| $X_1Z_2Z_3X_4$ | $Z_4Z_5Z_6Z_7$ | $Z_1Z_2Z_3Z_4$, $X_1X_2X_3X_4$ | $Z_1Z_2Z_3Z_4$, $X_1X_2X_3X_4$ |
| $X_2Z_3Z_4X_5$ | $Z_2Z_3Z_6Z_7$ | $Z_1Z_3Z_5Z_7$, $X_1X_3X_6X_7$ | $Z_1Z_3Z_5Z_6$, $X_1X_3X_5X_6$ |

TABLE VII-continued

Stabilizer generators for the 5-qubit code, including d = 3, d = 5 (⟦19, 1, 5⟧ code) and d = 5 (⟦17, 1, 5⟧ code) family of color codes. The last row illustrates representatives of the codes logical operators.

| ⟦5, 1, 3⟧ | Steane code | ⟦19, 1, 5⟧ code | ⟦17, 1, 5⟧ code |
|---|---|---|---|
| $X_1X_3Z_4Z_5$ | $Z_1Z_3Z_5Z_7$ | $Z_5Z_7Z_8Z_{11}Z_{12}Z_{13}$, $X_5X_7X_8X_{11}X_{12}X_{13}$ | $Z_5Z_6Z_9Z_{10}$, $X_5X_6Z_9Z_{10}$ |
| $Z_1X_2X_4Z_5$ | $X_4X_5X_6X_7$ | $Z_1Z_2Z_5Z_6Z_8Z_9$, $X_1X_2X_5X_6X_8X_9$ | $Z_7Z_8Z_{11}Z_{12}$, $X_7X_8X_{11}X_{12}$ |
| | $X_2X_3X_6X_7$ | $X_6Z_9Z_{16}Z_{19}$, $X_6X_9X_{16}X_{19}$ | $Z_9Z_{10}Z_{13}Z_{14}$, $X_9X_{10}X_{13}X_{14}$ |
| | $X_1X_3X_5X_7$ | $Z_{16}Z_{17}Z_{18}Z_{19}$, $X_{16}X_{17}X_{18}X_{19}$ | $Z_{11}Z_{12}Z_{15}Z_{16}$, $X_{11}X_{12}X_{15}X_{16}$ |
| | | $Z_8Z_9Z_{10}Z_{11}Z_{16}Z_{17}$, $X_8X_9X_{10}X_{11}X_{16}X_{17}$ | $Z_8Z_{12}Z_{16}Z_{17}$, $X_8X_{12}Z_{16}Z_{17}$ |
| | | $Z_{10}Z_{11}Z_{12}Z_{15}$, $X_{10}X_{11}X_{12}X_{15}$ | $Z_3Z_4Z_6Z_7Z_{10}Z_{11}Z_{14}Z_{15}$ |
| | | $Z_{12}Z_{13}Z_{14}Z_{15}$, $X_{12}X_{13}X_{14}X_{15}$ | $X_3X_4X_6X_7X_{10}X_{11}X_{14}X_{15}$ |
| $\bar{X} = X^{\otimes 5}, \bar{Z} = Z^{\otimes 5}$ | $\bar{X} = X^{\otimes 7}, \bar{Z} = Z^{\otimes 7}$ | $\bar{X} = X^{\otimes 19}, \bar{Z} = Z^{\otimes 19}$ | $\bar{X} = X^{\otimes 17}, \bar{Z} = Z^{\otimes 17}$ |

XIII. Stabilizer Generators of Various Codes

In Table VII, stabilizer generators are provided for the ⟦5, 1, 3⟧ code, ⟦7, 1, 3⟧ Steane code, ⟦19, 1, 5⟧ and ⟦17, 1, 5⟧ color codes.

XIV. Further Representative Embodiments

Among the embodiments disclosed herein are methods for performing flag fault-tolerant error correction with arbitrary distance codes. Further embodiments as disclosed herein include quantum circuits comprising any of the quantum devices for performing the flag fault-tolerant error correction techniques.

Figure 24:
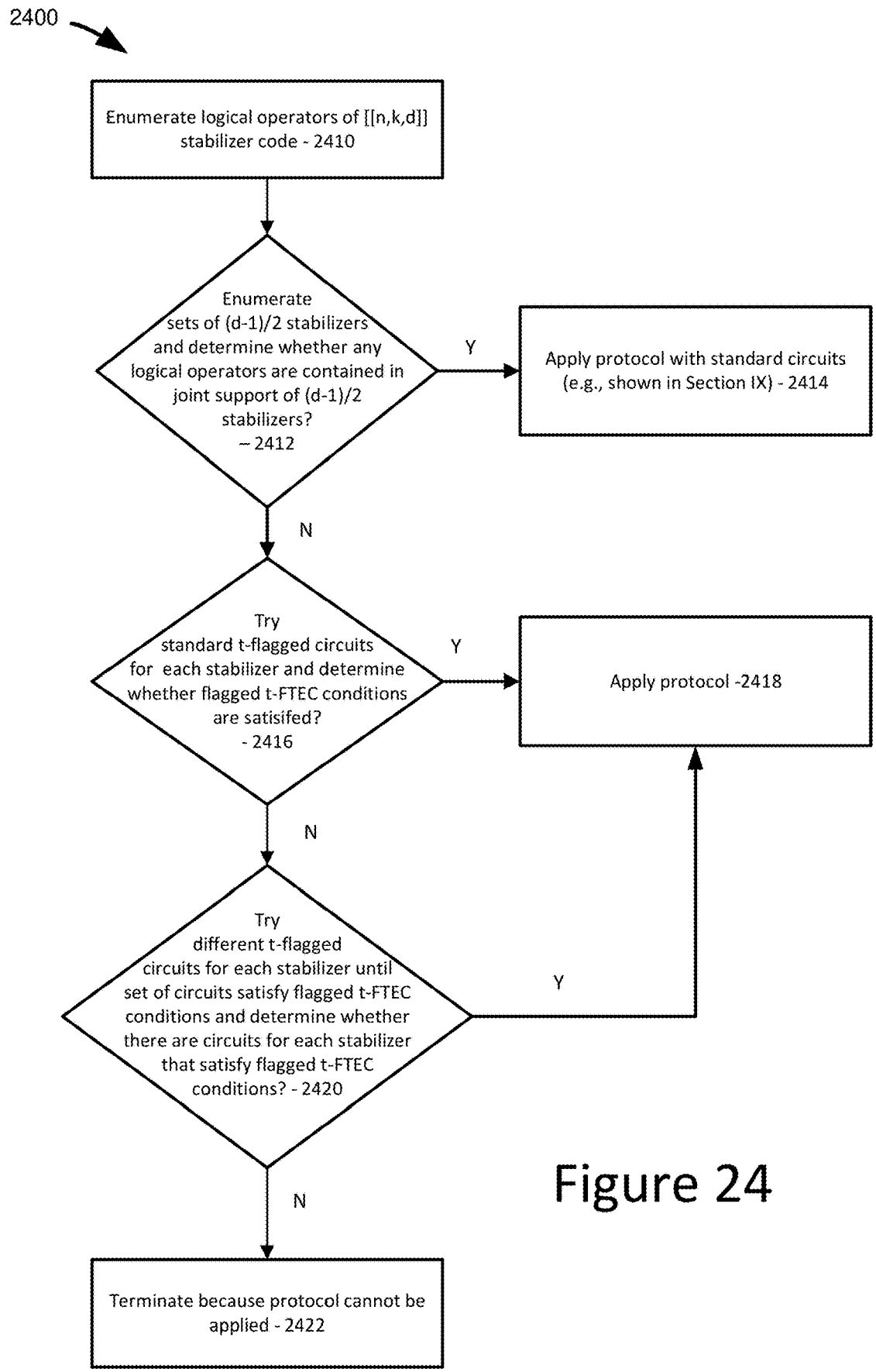
FIG. 24 is an example flow chart for applying aspects of the disclosed technology.

FIG. 24 is a flowchart 2400 illustrating a technique for operating a quantum system in accordance with embodiments of the disclosed technology. In particular, the illustrated flowchart 2400 illustrates a method to for implementing an error correction protocol in a quantum computing device in accordance with embodiments of the disclosed technology. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

At 2410, logical operators of a stabilizer code are enumerated (e.g., a [[n,k,d]] stabilizer code).

At 2412, sets of (d−1)/2 stabilizers are enumerated and a determination is made as whether any logical operators are contained in joint support of (d−1)/2 stabilizers. If so, then an error correction protocol is applied using standard circuits (e.g., as shown in Section III C); otherwise, the procedure continues at 2416.

At 2416, standard t-flagged circuits for each stabilizer are tried and a determination is made as to whether Flagged t-FTEC conditions are satisfied. If the conditions are satisfied, then an error correction protocol as disclosed herein is applied (e.g., as in Section IV) at 2418; otherwise, the procedure continues at 2420.

At 2420, different t-flagged circuits for each stabilizer are repeatedly tried (e.g., using n different circuit, where n is any integer value). For the different circuits, a determination is made as to whether there are circuits for each stabilizer that satisfy the flagged t-FTEC conditions. If the conditions are satisfied, then an error correction protocol as disclosed herein is applied (e.g., as in Section IV) at 2418; otherwise, the procedure terminates at 2422 because an error correction protocol could not be applied.

Figure 25:
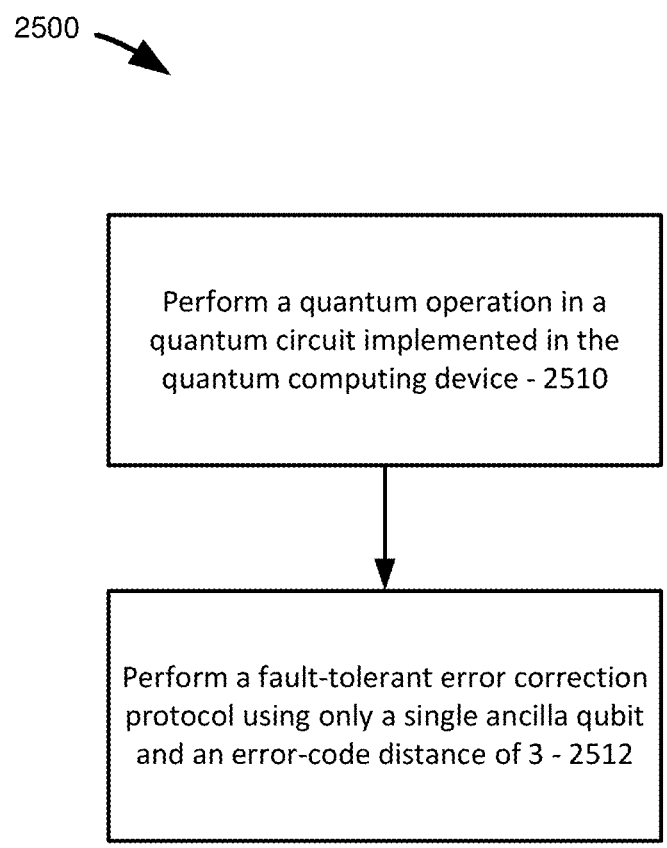
FIG. 25 is a flowchart illustrating a technique for implementing an error correction protocol in a quantum computing device in accordance with embodiments of the disclosed technology.

FIG. 25 is a flowchart 2500 illustrating a technique for implementing an error correction protocol in a quantum computing device in accordance with embodiments of the disclosed technology. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

At 2510, a quantum operation is performed in a quantum circuit implemented in the quantum computing device.

At 2512, a fault-tolerant error correction protocol is performed using only a single ancilla qubit and an error-code distance of 3.

In particular implementations, the fault-tolerant error correction protocol performs syndrome measurements at most three times. In some implementations, the performing the fault-tolerant error correction protocol comprises repeating an error syndrome measurement of the ancilla qubit until one of multiple criteria (e.g., 3 criteria) is satisfied. In particular implementations, the performing the fault-tolerant error correction protocol comprises repeating an error syndrome measurement of a flag circuit comprising the ancilla qubit until one of the following is satisfied: (a) if the syndrome s is repeated twice in a row and there were no flags, apply the correction min wt(s); (b) if there were no flags and the syndromes $s_1$ and $s_2$ from two consecutive rounds differ, repeat the syndrome measurement using non-flag circuits yielding syndrome s, apply the correction min wt(s); and/or (c) if a circuit $C(g_i)$ flags, stop and repeat the syndrome measurement using non-flag circuits yielding syndrome s, apply a correction from $\tilde{E}(g_i,s)$.

Figure 26:
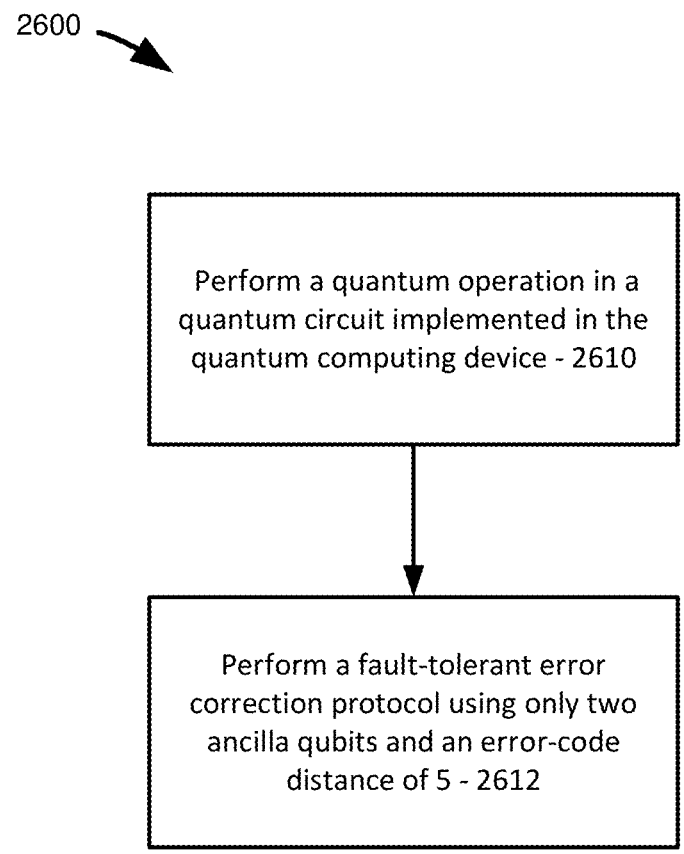
FIG. 26 is a flowchart illustrating another technique for implementing an error correction protocol in a quantum computing device in accordance with embodiments of the disclosed technology.

FIG. 26 is a flowchart 2600 illustrating a technique for implementing an error correction protocol in a quantum computing device in accordance with embodiments of the disclosed technology. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

At 2610, a quantum operation is performed in a quantum circuit implemented in the quantum computing device.

At 2612, a fault-tolerant error correction protocol is performed using only two ancilla qubits and an error-code distance of 5.

In particular implementations, the fault-tolerant error correction protocol performs syndrome measurements at most seven times. In certain implementations, the performing the fault-tolerant error correction protocol comprises repeating error syndrome measurements of the two ancilla qubits until one of multiple criteria (e.g., three) is satisfied.

In some implementations, the performing the fault-tolerant error correction protocol further comprises tracking a number of times consecutive measurements are different and a number of times consecutive measurements are equal. Further, in some instances, the number of times consecutive measurements are different is stored in a first counter $n_{diff}$, and wherein the number of times consecutive measurements are equal is stored in a second counter $n_{same}$. In one example, given a sequence of consecutive syndrome measurement outcomes $s_k$ and $s_{k+1}$, the first counter and the second counter are modified according to a set of rules comprising: (a) if $n_{diff}=0$ and $s_k \neq s_{k+1}$, increase $n_{diff}$ by one; (b) if $n_{diff}$ didn't increase in the previous round, and $s_k \neq s_{k+1}$, increase $n_{diff}$ by one; and/or (c) if a flag occurred two rounds ago and $s_k = s_{k+1}$, increase $n_{same}$ by one. In certain implementations, the performing the fault-tolerant error correction protocol comprises repeating syndrome measurements using flag circuits implemented by the two ancilla bits until one of the following is satisfied: (a) if at any time a syndrome s is repeated 3 times in a row and there were no flags, apply the correction min wt(s); (b) if $n_{diff}=2$ and there were no flags, repeat the syndrome using non-flag circuits yielding syndrome s, apply the correction min wt(s); (c) if any two circuits $C(g_i)$ and $C(g_j)$ have flagged, repeat the syndrome measurement using non-flag circuits yielding syndrome s, and apply a correction from the set $\tilde{E}^2{}_2(g_i, g_j, s)$; (d) if any circuit $C(g_i)$ has flagged and $n_{diff}=1$, repeat the syndrome using non-flag circuits yielding syndrome s, and apply a correction from the set $\tilde{E}^1{}_2(g_i, s)$; and/or (e) if any circuit $C(g_i)$ has flagged, $n_{diff}=0$ and $n_{same}=1$, use the measured syndrome s from the last round, and apply a correction from the set $\tilde{E}^1{}_2(g_i, s) \cup \tilde{E}^2{}_2(g_i, s)$.

Figure 27:
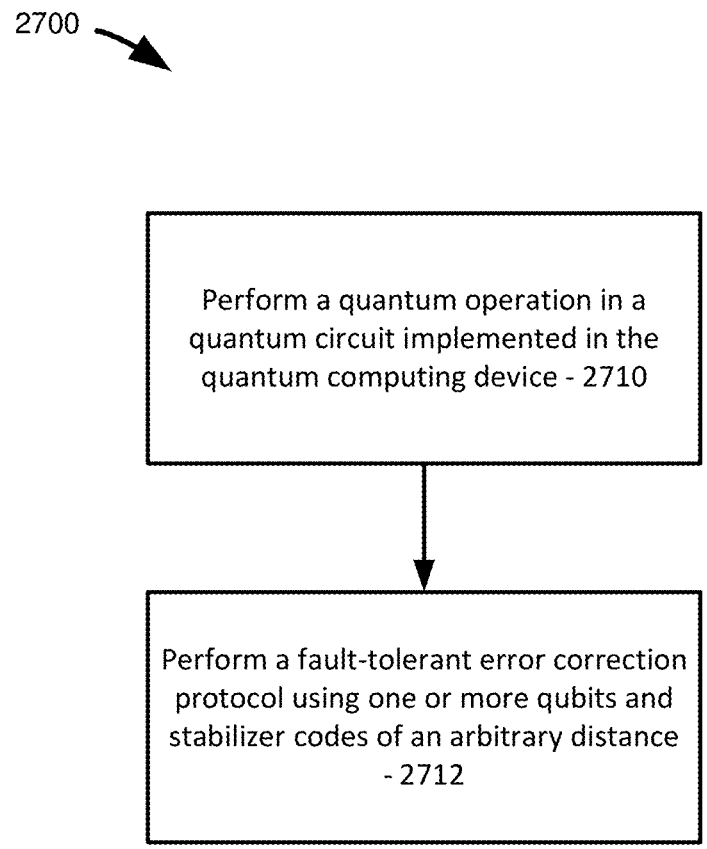
FIG. 27 is a flowchart illustrating a further technique for implementing an error correction protocol in a quantum computing device in accordance with embodiments of the disclosed technology.

FIG. 27 is a flowchart 2700 illustrating a technique for implementing an error correction protocol in a quantum computing device in accordance with embodiments of the disclosed technology. The illustrated embodiment should not be construed as limiting, as the disclosed method acts can, in some cases, be performed alone, in different orders, or at least partially simultaneously with one another. Further, any of the disclosed methods or method acts can be performed with any other methods or method acts disclosed herein.

At 2710, a quantum operation is performed in a quantum circuit implemented in the quantum computing device.

At 2712, a fault-tolerant error correction protocol is performed using one or more qubits and stabilizer codes of an arbitrary distance.

In some implementations, the performing the fault-tolerant error correction protocol further comprises tracking a number of times consecutive measurements of the one or more qubits are different and a number of times consecutive measurements of the one or more qubits are equal. For instance, in certain implementations, the number of times consecutive measurements are different is stored in a first counter $n_{diff}$, and wherein the number of times consecutive measurements are equal is stored in a second counter $n_{same}$. For example, given a sequence of consecutive syndrome measurement outcomes $s_k$ and $s_{k+1}$, the first counter and the second counter are modified according to a set of rules comprising: (a) if $n_{diff}=0$ and $s_k \neq s_{k+1}$, increase $n_{diff}$ by one; (b) if $n_{diff}$ didn't increase in the previous round, and $s_k \neq s_{k+1}$, increase $n_{diff}$ by one; and/or (c) if a flag occurred two rounds ago and $s_k \neq s_{k+1}$, increase $n_{same}$ by one. Further, in certain implementations, the performing the fault-tolerant error correction protocol comprises repeating syndrome measurements using flag circuits implemented by the one or more ancilla bits until one of the following is satisfied: (a) the same syndrome s is repeated t+1 times in a row and there are no flags, apply the correction min wt(s); (b) there were no flags and $n_{diff}=t$, repeat the syndrome measurement using non-flag circuits yielding the syndrome s, and apply the correction min wt(s); (c) some set of t circuits $\{C(g_{i_1}), \ldots, C(g_{i_t})\}$ have flagged, repeat the syndrome measurement using non-flag circuits yielding syndrome s, apply a correction from the set $\tilde{E}^t{}_t(g_{i_1}, \ldots g_{i_t}, s)$; (d) some set of m circuits $\{C(g_{i_1}), \ldots, C(g_{i_m})\}$ have flagged with $1 \leq m < t$ and $n_{same}=t-m+1$, use the last measured syndrome s and apply a correction from the set $\cup^{t-m}_{j=0} \tilde{E}^{t-j}{}_t(g_{i_1}, \ldots, g_{i_m}, s)$; (e) some set of m circuits $\{C(g_{i_1}), \ldots, C(g_{i_m})\}$ have flagged with $1 \leq m < t$ and $n_{diff}=t-m$, repeat the syndrome measurement using non-flag circuits yielding syndrome s, and apply a correction from the set $\tilde{E}^m{}_t(g_{i_1}, \ldots g_{i_m}, s)$; and/or (f) some set of m circuits $\{C(g_{i_1}), \ldots, C(g_{i_m})\}$ have flagged with $1 \leq m < t$, $n_{diff}=k$; $m+k<t$ and $n_{same}=t-m-k+1$, use the syndrome s obtained during the last round and apply a correction from the set $\cup^{t-m-k}_{j=0} \tilde{E}^{t-j-k}{}_t(g_{i_1}, \ldots, g_{i_m}, s)$.

XV. Example Computing Environments

Figure 20:
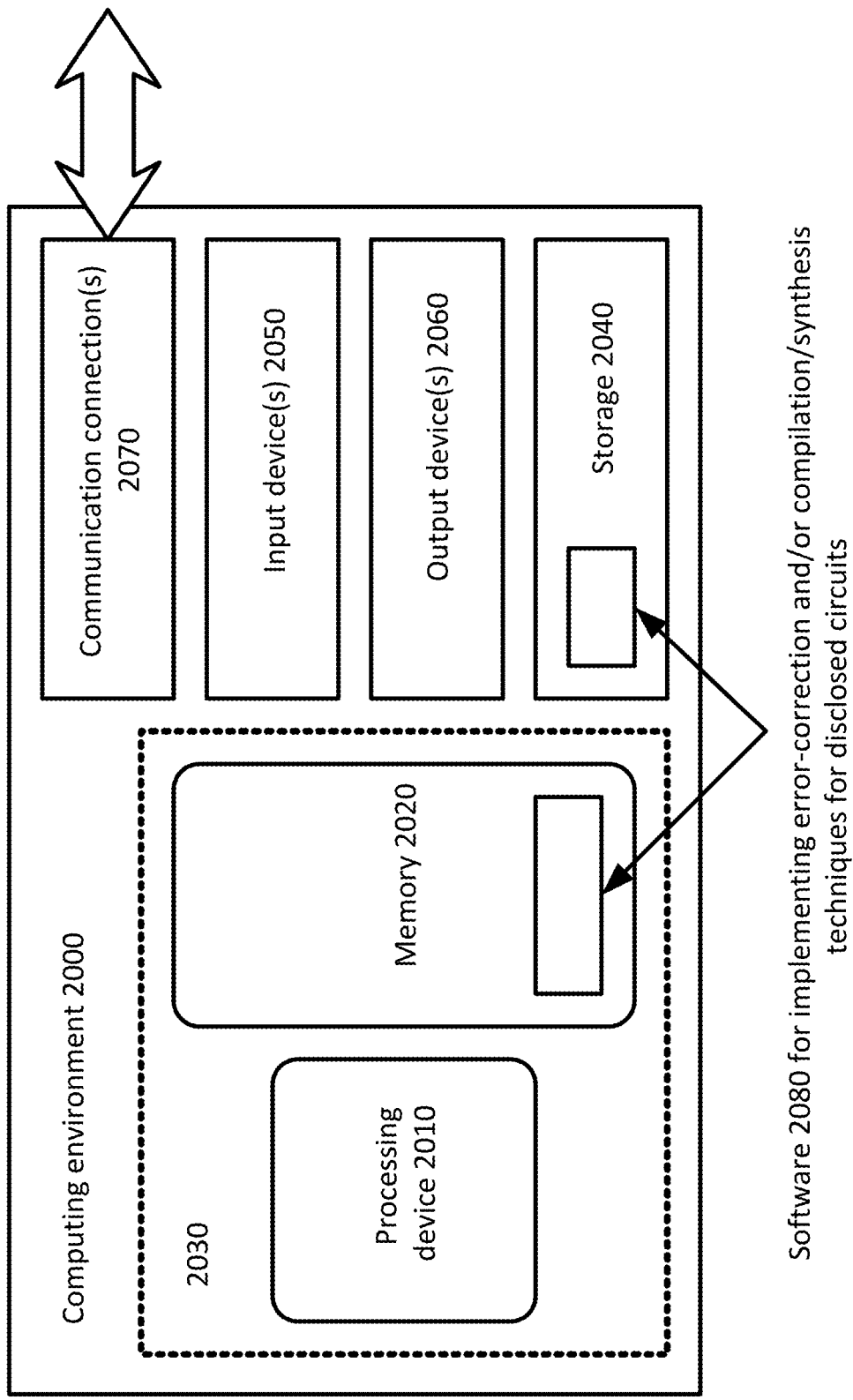
FIG. 20 illustrates a generalized example of a suitable computing environment in which several of the described embodiments can be implemented.

FIG. 20 illustrates a generalized example of a suitable computing environment 2000 in which several of the described embodiments can be implemented. The computing environment 2000 is not intended to suggest any limitation as to the scope of use or functionality of the disclosed technology, as the techniques and tools described herein can be implemented in diverse general-purpose or special-purpose environments that have computing hardware.

With reference to FIG. 20, the computing environment 2000 includes at least one processing device 2010 and memory 2020. In FIG. 20, this most basic configuration 2030 is included within a dashed line. The processing device 2010 (e.g., a CPU or microprocessor) executes computer-executable instructions. In a multi-processing system, multiple processing devices execute computer-executable instructions to increase processing power. The memory 2020 may be volatile memory (e.g., registers, cache, RAM, DRAM, SRAM), non-volatile memory (e.g., ROM, EEPROM, flash memory), or some combination of the two. The memory 2020 stores software 2080 implementing tools for synthesizing, generating, or compiling one or more of the circuits as described herein.

The computing environment can have additional features. For example, the computing environment 2000 includes storage 2040, one or more input devices 2050, one or more output devices 2060, and one or more communication connections 2070. An interconnection mechanism (not shown), such as a bus, controller, or network, interconnects the components of the computing environment 2000. Typically, operating system software (not shown) provides an operating environment for other software executing in the computing environment 2000, and coordinates activities of the components of the computing environment 2000.

The storage 2040 can be removable or non-removable, and includes one or more magnetic disks (e.g., hard drives), solid state drives (e.g., flash drives), magnetic tapes or cassettes, CD-ROMs, DVDs, or any other tangible non-volatile storage medium which can be used to store information and which can be accessed within the computing environment 2000. The storage 2040 can also store instructions for the software 2080 implementing, generating, or synthesizing any of the described techniques, systems, or reversible circuits.

The input device(s) 2050 can be a touch input device such as a keyboard, touchscreen, mouse, pen, trackball, a voice input device, a scanning device, or another device that provides input to the computing environment 2000. The output device(s) 2060 can be a display device (e.g., a computer monitor, laptop display, smartphone display, tablet display, netbook display, or touchscreen), printer, speaker, or another device that provides output from the computing environment 2000.

The communication connection(s) 2070 enable communication over a communication medium to another computing entity. The communication medium conveys information such as computer-executable instructions or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

As noted, the various methods, circuit designs, or compilation/synthesis techniques for generating the disclosed circuits can be described in the general context of computer-readable instructions stored on one or more computer-readable media. Computer-readable media are any available media (e.g., memory or storage device) that can be accessed within or by a computing environment. Computer-readable media include tangible computer-readable memory or storage devices, such as memory 2020 and/or storage 2040, and do not include propagating carrier waves or signals per se (tangible computer-readable memory or storage devices do not include propagating carrier waves or signals per se).

Various embodiments of the methods disclosed herein can also be described in the general context of computer-executable instructions (such as those included in program modules) being executed in a computing environment by a processor. Generally, program modules include routines, programs, libraries, objects, classes, components, data structures, and so on, that perform particular tasks or implement particular abstract data types. The functionality of the program modules may be combined or split between program modules as desired in various embodiments. Computer-executable instructions for program modules may be executed within a local or distributed computing environment.

Figure 21:
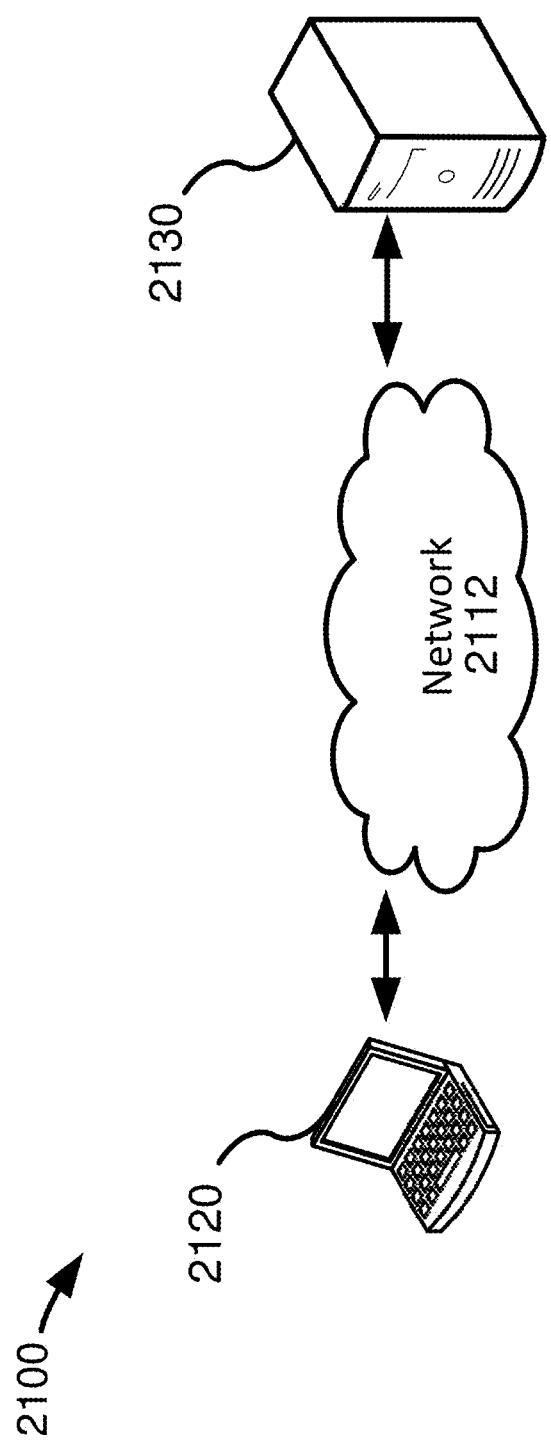
FIG. 21 is a schematic block diagram showing an example of a possible network topology (e.g., a client-server network) for implementing a system according to the disclosed technology.
Figure 22:
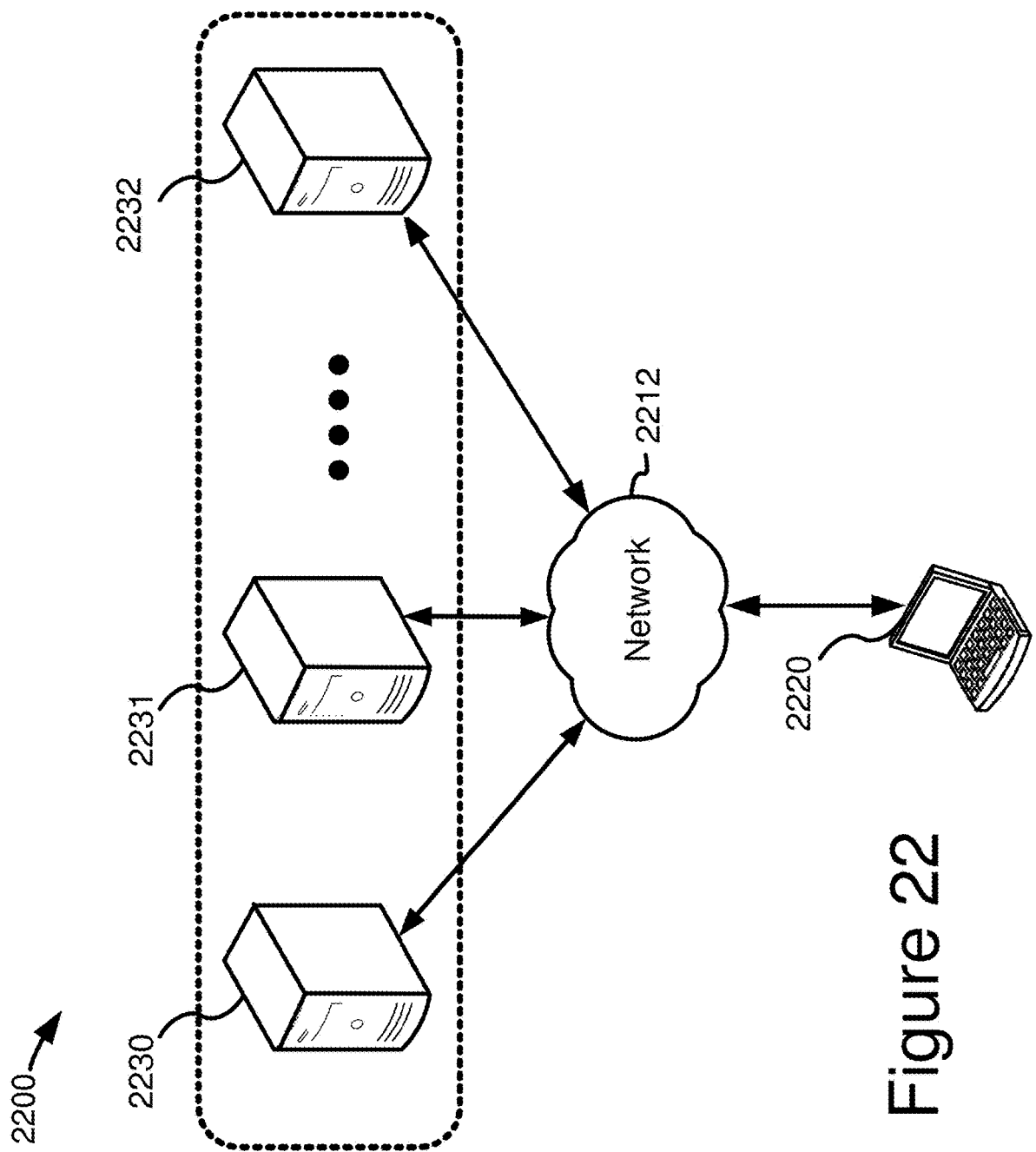
FIG. 22 is a schematic block diagram showing another example of a possible network topology for implementing a system according to the disclosed technology.

An example of a possible network topology 2100 (e.g., a client-server network) for implementing a system according to the disclosed technology is depicted in FIG. 21. Networked computing device 2120 can be, for example, a computer running a browser or other software connected to a network 2112. The computing device 2120 can have a computer architecture as shown in FIG. 20 and discussed above. The computing device 2120 is not limited to a traditional personal computer but can comprise other computing hardware configured to connect to and communicate with a network 2112 (e.g., smart phones, laptop computers, tablet computers, or other mobile computing devices, servers, network devices, dedicated devices, and the like). In the illustrated embodiment, the computing device 2120 is configured to communicate with a computing device 2130 (e.g., a remote server, such as a server in a cloud computing environment) via a network 2112. In the illustrated embodiment, the computing device 2120 is configured to transmit input data to the computing device 2130, and the computing device 2130 is configured to implement circuit generation or compilation/synthesis methods for generating any of the disclosed circuits and outputting results to the computing device 2120. Any of the data received from the computing device 2130 can be stored or displayed on the computing device 2120 (e.g., displayed as data on a graphical user interface or web page at the computing devices 2120). In the illustrated embodiment, the illustrated network 2112 can be implemented as a Local Area Network (LAN) using wired networking (e.g., the Ethernet IEEE standard 802.3 or other appropriate standard) or wireless networking (e.g. one of the IEEE standards 802.11a, 802.11b, 802.11g, or 802.11n or other appropriate standard). Alternatively, at least part of the network 2112 can be the Internet or a similar public network and operate using an appropriate protocol (e.g., the HTTP protocol).

Another example of a possible network topology 2200 (e.g., a distributed computing environment) for implementing a system according to the disclosed technology is depicted in FIG. 20. Networked computing device 2220 can be, for example, a computer running a browser or other software connected to a network 2212. The computing device 2220 can have a computer architecture as shown in FIG. 20 and discussed above. In the illustrated embodiment, the computing device 2220 is configured to communicate with multiple computing devices 2230, 2231, 2232 (e.g., remote servers or other distributed computing devices, such as one or more servers in a cloud computing environment) via the network 2212. In the illustrated embodiment, each of the computing devices 2230, 2231, 2232 in the computing environment 2200 is used to perform at least a portion of a circuit generation or synthesis/compilation process for generating any of the disclosed circuits. In other words, the computing devices 2230, 2231, 2232 form a distributed computing environment in which the generation/compilation/synthesis processes are shared across multiple computing devices. The computing device 2220 is configured to transmit input data to the computing devices 2230, 2231, 2232, which are configured to distributively implement such as process, including performance of any of the disclosed methods or creation of any of the disclosed circuits, and to provide results to the computing device 2220. Any of the data received from the computing devices 2230, 2231, 2232 can be stored or displayed on the computing device 2220 (e.g., displayed as data on a graphical user interface or web page at the computing devices 2220). The illustrated network 2212 can be any of the networks discussed above with respect to FIG. 21.

Figure 23:
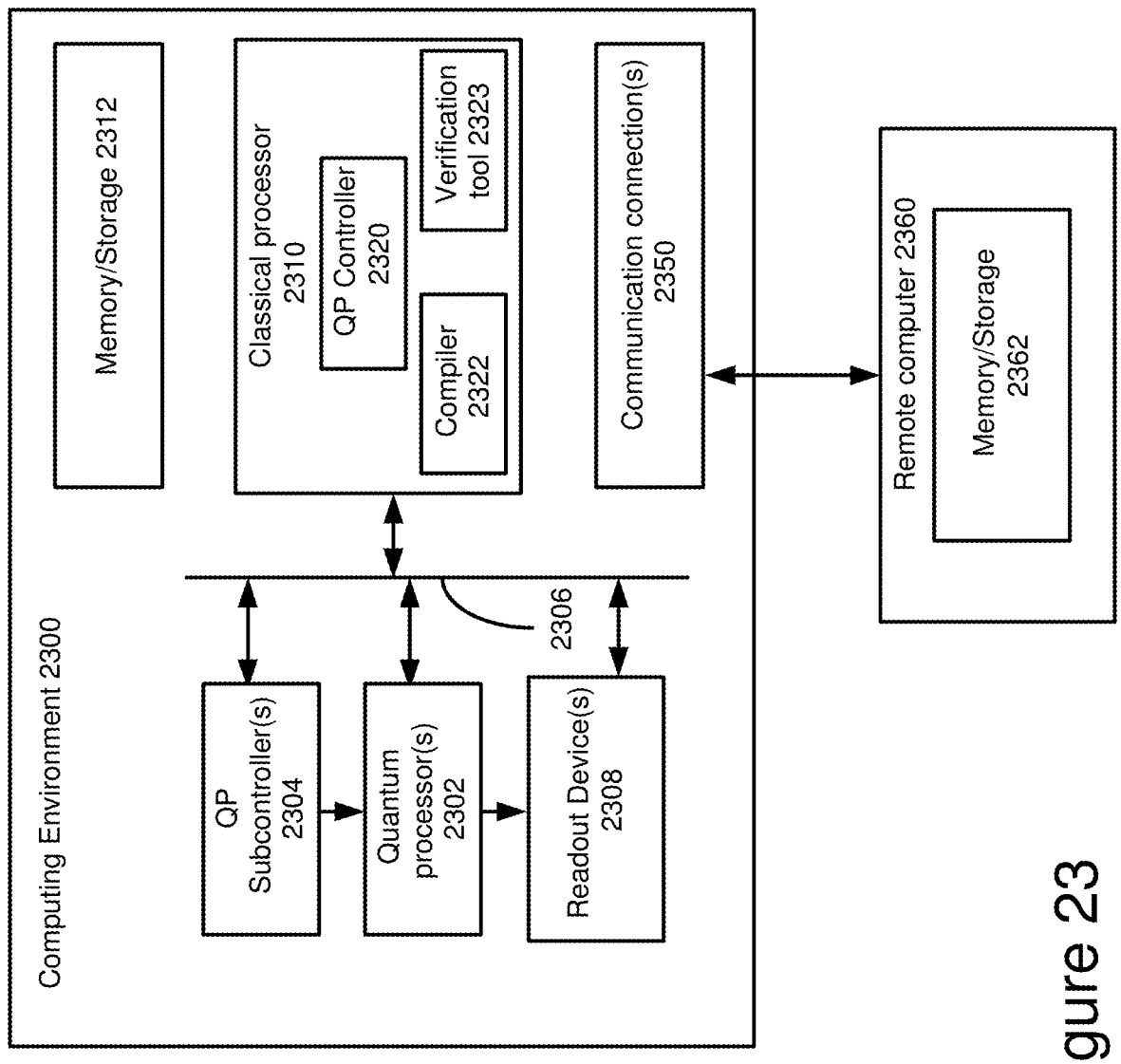
FIG. 23 is a schematic block diagram of an exemplary system for implementing the disclosed technology using a quantum computing device and a classical computer.

With reference to FIG. 23, an exemplary system for implementing the disclosed technology includes computing environment 2300. In computing environment 2300, a compiled quantum computer circuit description including any of the disclosed quantum circuits in accordance with any of the disclosed embodiments can be used to program (or configure) one or more quantum processing units such that the quantum processing unit(s) implement the circuit described by the quantum computer circuit description. The quantum computer circuit description can implement any of the disclosed circuits.

The environment 2300 includes one or more quantum processing units 2302 and one or more readout device(s) 2308. The quantum processing unit(s) execute quantum circuits that are precompiled and described by the quantum computer circuit description. The quantum processing unit(s) can be one or more of, but are not limited to: (a) a superconducting quantum computer; (b) an ion trap quantum computer; (c) a fault-tolerant architecture for quantum computing; and/or (d) a topological quantum architecture (e.g., a topological quantum computing device using Majorana zero modes). The precompiled quantum circuits, including any of the disclosed circuits, can be sent into (or otherwise applied to) the quantum processing unit(s) via control lines 2306 at the control of quantum processor controller 2320. The quantum processor controller (QP controller) 2320 can operate in conjunction with a classical processor 2310 (e.g., having an architecture as described above with respect to FIG. 20) to implement the desired quantum computing process and to implement any of the disclosed error-correction protocols as disclosed herein. In the illustrated example, the QP controller 2320 further implements the desired quantum computing process along with any of the disclosed error-correction protocols via one or more QP subcontrollers 2304 that are specially adapted to control a corresponding one of the quantum processor(s) 2302. For instance, in one example, the quantum controller 2320 facilitates implementation of the compiled quantum circuit by sending instructions to one or more memories (e.g., lower-temperature memories), which then pass the instructions to low-temperature control unit(s) (e.g., QP subcontroller(s) 2304) that transmit, for instance, pulse sequences representing the gates to the quantum processing unit(s) 2302 for implementation. In other examples, the QP controller(s) 2320 and QP subcontroller(s) 2304 operate to provide appropriate magnetic fields, encoded operations, or other such control signals to the quantum processor(s) to implement the operations of the compiled quantum computer circuit description. The quantum controller(s) can further interact with readout devices 2308 to help control and implement the desired quantum computing process (e.g., by reading or measuring out data results from the quantum processing units once available, etc.)

With reference to FIG. 23, compilation is the process of translating a high-level description of a quantum algorithm into a quantum computer circuit description comprising a sequence of quantum operations or gates, which can include the circuits as disclosed herein. The compilation can be performed by a compiler 2322 using a classical processor 2310 (e.g., as shown in FIG. 20) of the environment 2300 which loads the high-level description from memory or storage devices 2312 and stores the resulting quantum computer circuit description in the memory or storage devices 2312.

In other embodiments, compilation can be performed remotely by a remote computer 2300 (e.g., a computer having a computing environment as described above with respect to FIG. 20) which stores the resulting quantum computer circuit description in one or more memory or storage devices 2362 and transmits the quantum computer circuit description to the computing environment 2300 for implementation in the quantum processing unit(s) 2302. Still further, the remote computer 2300 can store the high-level description in the memory or storage devices 2362 and transmit the high-level description to the computing environment 2300 for compilation and use with the quantum processor(s). In any of these scenarios, results from the computation performed by the quantum processor(s) can be communicated to the remote computer after and/or during the computation process. Still further, the remote computer can communicate with the QP controller(s) 2320 such that the quantum computing process (including any compilation, verification, and QP control procedures) can be remotely controlled by the remote computer 2360. In general, the remote computer 2360 communicates with the QP controller(s) 2320, compiler/synthesizer 2322, and/or verification tool 2323 via communication connections 2350.

In particular embodiments, the environment 2300 can be a cloud computing environment, which provides the quantum processing resources of the environment 2300 to one or more remote computers (such as remote computer 2360) over a suitable network (which can include the internet).

XVI. Concluding Remarks

Having described and illustrated the principles of the disclosed technology with reference to the illustrated embodiments, it will be recognized that the illustrated embodiments can be modified in arrangement and detail without departing from such principles. For instance, elements of the illustrated embodiments shown in software may be implemented in hardware and vice-versa. Also, the technologies from any example can be combined with the technologies described in any one or more of the other examples. It will be appreciated that procedures and functions such as those described with reference to the illustrated examples can be implemented in a single hardware or software module, or separate modules can be provided. The particular arrangements above are provided for convenient illustration, and other arrangements can be used.

What is claimed is:

1. A method of implementing an error correction protocol in a quantum computing device, comprising: performing a quantum operation in a quantum circuit implemented in the quantum computing device; and performing a fault-tolerant error correction protocol using only a single ancilla qubit and an error-code distance of 3,
   wherein the performing the fault-tolerant error correction protocol comprises repeating an error syndrome measurement of a flag circuit comprising the ancilla qubit until one of the following is satisfied:
   (a) if the syndrome s is repeated twice in a row and there were no flags, apply the correction min wt(s); and/or
   (b) if there were no flags and syndromes $s_1$ and $s_2$ from two consecutive rounds differ, repeat an syndrome measurement using non-flag circuits yielding syndrome s, apply the correction min wt(s).

2. The method of claim 1, wherein the fault-tolerant error correction protocol performs syndrome measurements at most three times.

3. The method of claim 1, wherein the performing the fault-tolerant error correction protocol comprises repeating an error syndrome measurement of the ancilla qubit until one of multiple criteria is satisfied.

4. The method of claim 3, wherein the multiple criteria are three criteria.

5. A method of implementing an error correction protocol in a quantum computing device, comprising: performing a quantum operation in a quantum circuit implemented in the quantum computing device; and performing a fault-tolerant error correction protocol using only two ancilla qubits and an error-code distance of 5,
   wherein the performing the fault-tolerant error correction protocol further comprises tracking a number of times consecutive measurements are different and a number of times consecutive measurements are equal, and
   wherein the number of times consecutive measurements are different is stored in a first counter $n_{diff}$, and wherein the number of times consecutive measurements are equal is stored in a second counter $n_{same}$.

6. The method of claim 5, wherein, given a sequence of consecutive syndrome measurement outcomes $s_k$ and $s_{k+1}$, where k and k+1 are index values indicating the consecutive syndrome measurement outcomes, the first counter and the second counter are modified according to a set of rules comprising:

(a) if $n_{diff}=0$ and $s_k \neq s_{k+1}$ by one;
(b) if $n_{diff}$ didn't increase in the previous round, and $s_k \neq s_{k+1}$, increase $n_{diff}$ by one; and/or
(c) if a flag occurred two rounds ago and $s_k = s_{k+1}$, increase $n_{same}$ by one.

7. The method of claim 6, wherein the performing the fault-tolerant error correction protocol comprises repeating syndrome measurements using flag circuits implemented by the two ancilla bits until one of the following is satisfied:

(a) if at any time a syndrome s is repeated 3 times in a row and there were no flags, apply the correction min wt(s);
(b) if $n_{diff}=2$ and there were no flags, repeat a syndrome using non-flag circuits yielding syndrome s, apply the correction min wt(s);
(c) if any two circuits $C(g_i)$ and $C(g_j)$, where $g_i$ and $g_j$ are index values indicating the two circuits, have flagged, repeat the syndrome measurement using non-flag circuits yielding syndrome s, and apply a correction from the set $\tilde{E}_2^2(g_i, g_j, s)$;
(d) if any circuit $C(g_i)$ has flagged and $n_{diff}=1$, repeat a syndrome using non-flag circuits yielding syndrome s, and apply a correction from the set $\tilde{E}_2^1(g_i, s)$; and/or
(e) if any circuit $C(g_i)$ has flagged, $n_{diff}=0$ and $n_{same}=1$, use the measured syndrome s from the last round, and apply a correction from the set $\tilde{E}_2^1(g_i, s) \cup \tilde{E}_2^2(g_i, s)$.

8. A method of implementing an error correction protocol in a quantum computing device, comprising: performing a quantum operation in a quantum circuit implemented in the quantum computing device; and performing a fault-tolerant error correction protocol using one or more qubits and stabilizer codes of an arbitrary distance, wherein the performing the fault-tolerant error correction protocol further comprises tracking a number of times consecutive measurements of the one or more qubits are different and a number of times consecutive measurements of the one or more qubits are equal.

9. A method of implementing an error correction protocol in a quantum computing device, comprising: performing a quantum operation in a quantum circuit implemented in the quantum computing device; and performing a fault-tolerant error correction protocol using one or more qubits and stabilizer codes of an arbitrary distance, wherein the performing the fault-tolerant error correction protocol further comprises tracking a number of times consecutive measurements of the one or more qubits are different and a number of times consecutive measurements of the one or more qubits are equal, and wherein the number of times consecutive measurements are different is stored in a first counter $n_{diff}$, and wherein the number of times consecutive measurements are equal is stored in a second counter $n_{same}$.

10. The method of claim 9, wherein, given a sequence of consecutive syndrome measurement outcomes $s_k$ and $s_{k+1}$, where k and k+1 are index values indicating the consecutive syndrome measurement outcomes, the first counter and the second counter are modified according to a set of rules comprising:

(a) if $n_{diff}=0$ and $s_k \neq s_{k+1}$, increase $n_{diff}$ by one;
(b) if $n_{diff}$ didn't increase in the previous round, and $s_k \neq s_{k+1}$, increase $n_{diff}$ by one; and/or
(c) if a flag occurred two rounds ago and $s_k = s_{k+1}$, increase $n_{same}$ by one.

11. The method of claim 10, wherein the performing the fault-tolerant error correction protocol comprises repeating syndrome measurements using flag circuits implemented by the one or more ancilla bits until one of the following is satisfied:

(a) the same syndrome s is repeated t+1 times in a row and there are no flags, apply the correction min wt(s);
(b) there were no flags and $n_{diff}=t$, repeat the syndrome measurement using non-flag circuits yielding the syndrome s, and apply the correction min wt(s).

12. A quantum computing system configured to perform the error correction method of claim 9.

13. One or more computer-readable memory or storage devices storing computer-executable instructions which when executed by a classical computer cause the classical computer to configure a quantum computing system to perform the error correction method of claim 9.

14. A quantum computing system configured to perform the error correction method of claim 8.

15. One or more computer-readable memory or storage devices storing computer-executable instructions which when executed by a classical computer cause the classical computer to configure a quantum computing system to perform the error correction method of claim 8.

16. A quantum computing system configured to perform the error correction method of claim 1.

17. One or more computer-readable memory or storage devices storing computer-executable instructions which when executed by a classical computer cause the classical computer to configure a quantum computing system to perform the error correction method of claim 1.

* * * * *